United States Patent
Sugiyama et al.

(10) Patent No.: US 7,420,786 B2
(45) Date of Patent: Sep. 2, 2008

(54) ARRANGEMENT OF A MAGNETO-RESISTANCE EFFECT ELEMENT HAVING A SURFACE CONTACTING A SIDE FACE OF AN ELECTRODE AND MAGNETIC MEMORY USING THIS ARRANGEMENT

(75) Inventors: Hideyuki Sugiyama, Kanagawa-Ken (JP); Yoshiaki Saito, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 406 days.

(21) Appl. No.: 11/068,252

(22) Filed: Mar. 1, 2005

(65) Prior Publication Data
US 2005/0195532 A1    Sep. 8, 2005

(30) Foreign Application Priority Data
Mar. 3, 2004   (JP)   ............................. 2004-059408
Sep. 30, 2004  (JP)   ............................. 2004-286396
Oct. 22, 2004  (JP)   ............................. 2004-308532

(51) Int. Cl.
*G11B 5/33* (2006.01)
(52) U.S. Cl. .................. 360/322; 360/324.1; 360/324.2
(58) Field of Classification Search ................. 360/322, 360/324.1–324.2; 365/143, 158, 171, 173
See application file for complete search history.

(56) References Cited
U.S. PATENT DOCUMENTS

| | | | |
|---|---|---|---|
| 6,114,056 A | 9/2000 | Inomata et al. | |
| 6,256,223 B1 | 7/2001 | Sun | |
| 6,765,767 B2 * | 7/2004 | Trindade et al. | 360/319 |
| 6,879,475 B2 * | 4/2005 | Kishi et al. | 360/324.2 |
| 7,177,178 B2 * | 2/2007 | Daughton et al. | 365/158 |
| 2005/0024781 A1 * | 2/2005 | Yi et al. | 360/322 |
| 2005/0195532 A1 | 9/2005 | Sugiyama et al. | |

OTHER PUBLICATIONS

U.S. Appl. No. 11/228,326, filed Sep. 19, 2005, Inokuchi, et al.
U.S. Appl. No. 11/368,383, filed Mar. 7, 2006, Saito, et al.
U.S. Appl. No. 11/373,305, filed Mar. 13, 2006, Saito, et al.

* cited by examiner

*Primary Examiner*—A. J. Heinz
(74) *Attorney, Agent, or Firm*—Oblon, Spivak, McClelland, Maier & Neustadt, P.C.

(57) ABSTRACT

An area of an element can be made small and fluctuation in area can be reduced. A magneto-resistance effect element is provided with a first electrode with an end face; a magneto-resistance effect film which is formed such that a surface thereof comes in contact with the end face of the first electrode; and a second electrode which is formed on another surface of the magneto-resistance effect element opposed from the surface coming in contact with the surface of the first electrode. The magneto-resistance effect film includes a magnetization pinned layer whose magnetization direction is pinned, a magnetization free layer whose magnetization direction is changeable, and a first non-magnetic layer which is provided between the magnetization pinned layer and the magnetization free layer.

10 Claims, 58 Drawing Sheets

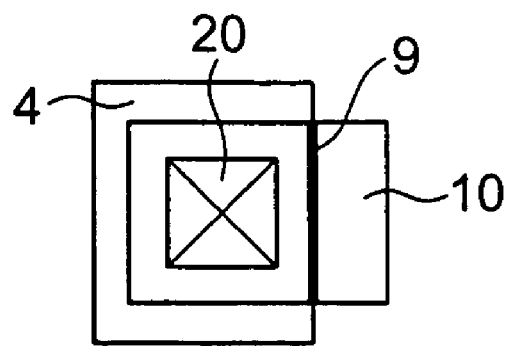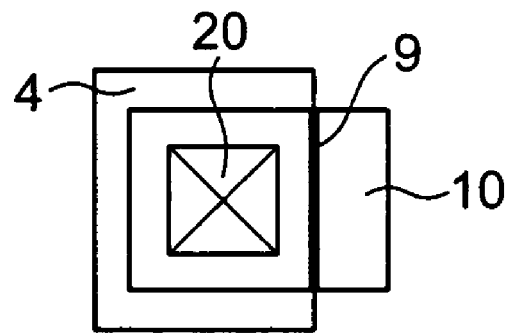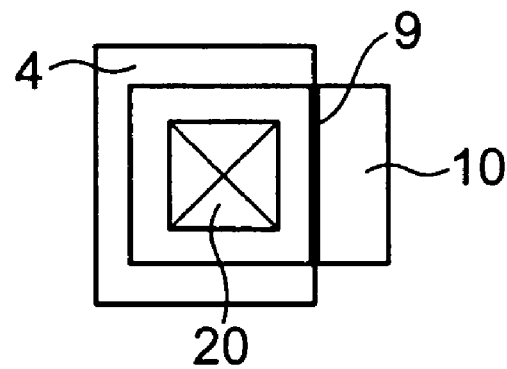
FIG. 10

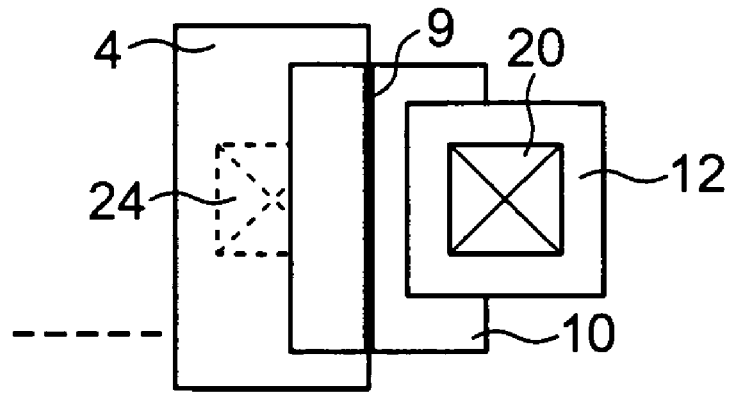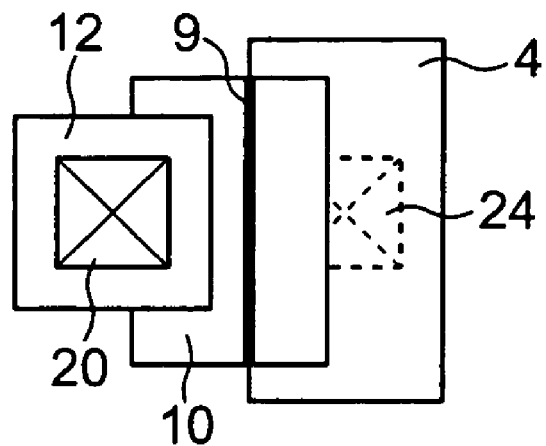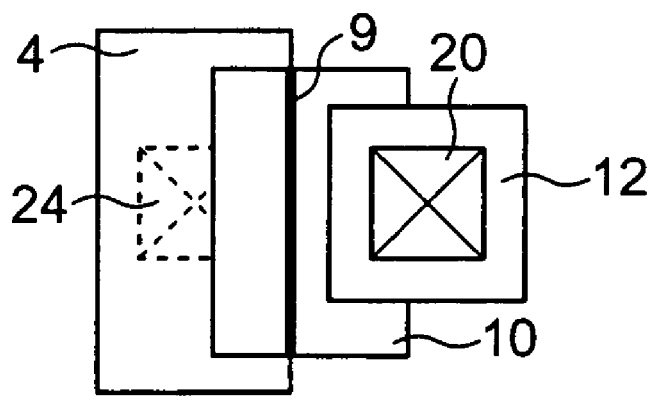
FIG. 12

| | BASE ELECTRODE | INSULATING LAYER | TUNNEL BARRIER LAYER | MAGNETIC RECORDING LAYER | NON-MAGNETIC LAYER | COUNTER ELECTRODE | CURRENT DENSITY (A/cm²) |
|---|---|---|---|---|---|---|---|
| SAMPLE 1 | CoFe(65nm)/PtMn(15nm) | $SiO_2$ | $Al_2O_3$ (1.4nm) | $(Co_{90}Fe_{10})_{80}Pt_{20}$-$AlO_x$(3nm) | Ru(15nm) | Ta(100nm) | $0.47 \times 10^7$ |
| 2 | CoFe(65nm)/PtMn(15nm) | $SiO_2$ | $Al_2O_3$ (1.4nm) | $(Co_{90}Fe_{10})_{80}Pt_{20}$-$AlO_x$(3nm) | Cr(15nm) | Ta(100nm) | $0.56 \times 10^7$ |
| 3 | CoFe(65nm)/PtMn(15nm) | $SiO_2$ | $Al_2O_3$ (1.4nm) | $(Co_{90}Fe_{10})_{80}Pt_{20}$-$AlO_x$(3nm) | RuOs(15nm) | Ta(100nm) | $0.41 \times 10^7$ |
| 4 | CoFe(65nm)/PtMn(15nm) | $SiO_2$ | $Al_2O_3$ (1.4nm) | $Co_{90}Fe_{10}$-$AlO_x$(3nm) | Os(15nm) | Ta(100nm) | $0.40 \times 10^7$ |
| 5 | CoFe(65nm)/PtMn(15nm) | $SiO_2$ | $Al_2O_3$ (1.4nm) | $(Co_{90}Fe_{10})_{80}Pt_{20}$-$AlO_x$(3nm) | Re(15nm) | Ta(100nm) | $0.42 \times 10^7$ |
| 6 | CoFe(65nm)/PtMn(15nm) | $SiO_2$ | $Al_2O_3$ (1.4nm) | $(Co_{90}Fe_{10})_{80}Pt_{20}$-$AlO_x$(3nm) | ReOs(15nm) | Ta(100nm) | $0.39 \times 10^7$ |
| 7 | CoFe(65nm)/PtMn(15nm) | $SiO_2$ | $Al_2O_3$ (1.4nm) | $(Co_{90}Fe_{10})_{80}Pt_{20}$-$AlO_x$(3nm) | Ru(5nm)/$Co_{90}Fe_{10}$(5nm)/PtMn(15nm) | Ru(10nm)/Ta(100nm) | $0.23 \times 10^7$ |
| 8 | CoFe(65nm)/PtMn(15nm) | $SiO_2$ | $Al_2O_3$ (1.4nm) | $(Co_{90}Fe_{10})_{80}Pt_{20}$-$AlO_x$(3nm) | Cr(5nm)/$Co_{90}Fe_{10}$(5nm)/PtMn(15nm) | Ru(10nm)/Ta(100nm) | $0.28 \times 10^7$ |
| 9 | CoFe(65nm)/PtMn(15nm) | $SiO_2$ | $Al_2O_3$ (1.4nm) | $(Co_{90}Fe_{10})_{80}Pt_{20}$-$AlO_x$(3nm) | RuCr(5nm)/$Co_{90}Fe_{10}$(5nm)/PtMn(15nm) | Ru(10nm)/Ta(100nm) | $0.21 \times 10^7$ |
| 10 | CoFe(65nm)/PtMn(15nm) | $SiO_2$ | $Al_2O_3$ (1.4nm) | $Co_{90}Fe_{10}$-$AlO_x$(3nm) | Ir(5nm)/$Co_{90}Fe_{10}$(5nm)/PtMn(15nm) | Ru(10nm)/Ta(100nm) | $0.20 \times 10^7$ |
| 11 | CoFe(65nm)/PtMn(15nm) | $SiO_2$ | $Al_2O_3$ (1.4nm) | $(Co_{90}Fe_{10})_{80}Pt_{20}$-$AlO_x$(3nm) | Re(5nm)/$Co_{90}Fe_{10}$(5nm)/PtMn(15nm) | Ru(10nm)/Ta(100nm) | $0.21 \times 10^7$ |
| 12 | CoFe(65nm)/PtMn(15nm) | $SiO_2$ | $Al_2O_3$ (1.4nm) | $(Co_{90}Fe_{10})_{80}Pt_{20}$-$AlO_x$(3nm) | RuRe(5nm)/$Co_{90}Fe_{10}$(5nm)/PtMn(15nm) | Ru(10nm)/Ta(100nm) | $0.18 \times 10^7$ |
| 13 | CoFe(65nm)/PtMn(15nm) | $SiO_2$ | $Al_2O_3$ (1.4nm) | $(Co_{90}Fe_{10})_{80}Pt_{20}$-$AlO_x$(3nm) | Cu(5nm)/$Co_{90}Fe_{10}$(3nm)/Ru(0.9nm)/$Co_{90}Fe_{10}$(3nm)/PtMn(15nm) | Ru(10nm)/Ta(100nm) | $0.26 \times 10^7$ |
| COMPARATIVE EXAMPLE 1 | CoFe(65nm)/PtMn(15nm) | $SiO_2$ | $Al_2O_3$ (1.4nm) | $(Co_{90}Fe_{10})_{80}Pt_{20}$-$AlO_x$(3nm) | NON | Ta(100nm) | $1.35 \times 10^7$ |
| COMPARATIVE EXAMPLE 2 | CoFe(65nm)/PtMn(15nm) | $SiO_2$ | $Al_2O_3$ (1.4nm) | $Co_{90}Fe_{10}$-$AlO_x$(3nm) | NON | Ta(100nm) | $1.25 \times 10^7$ |

FIG. 34

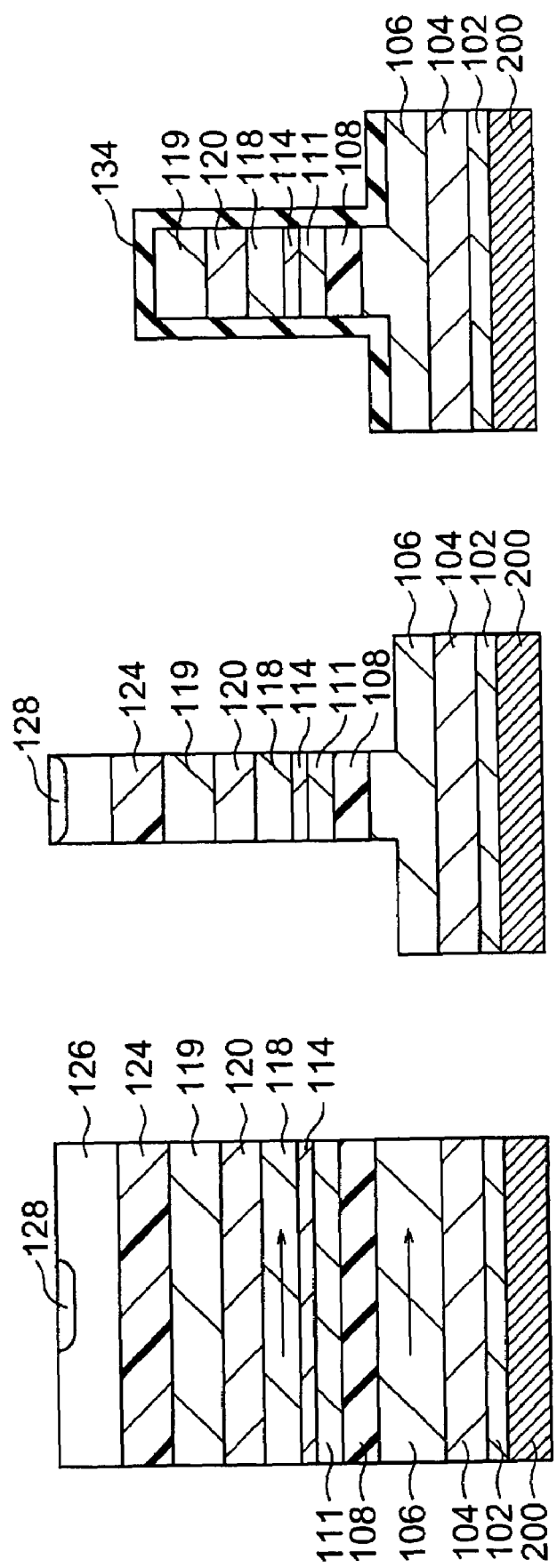

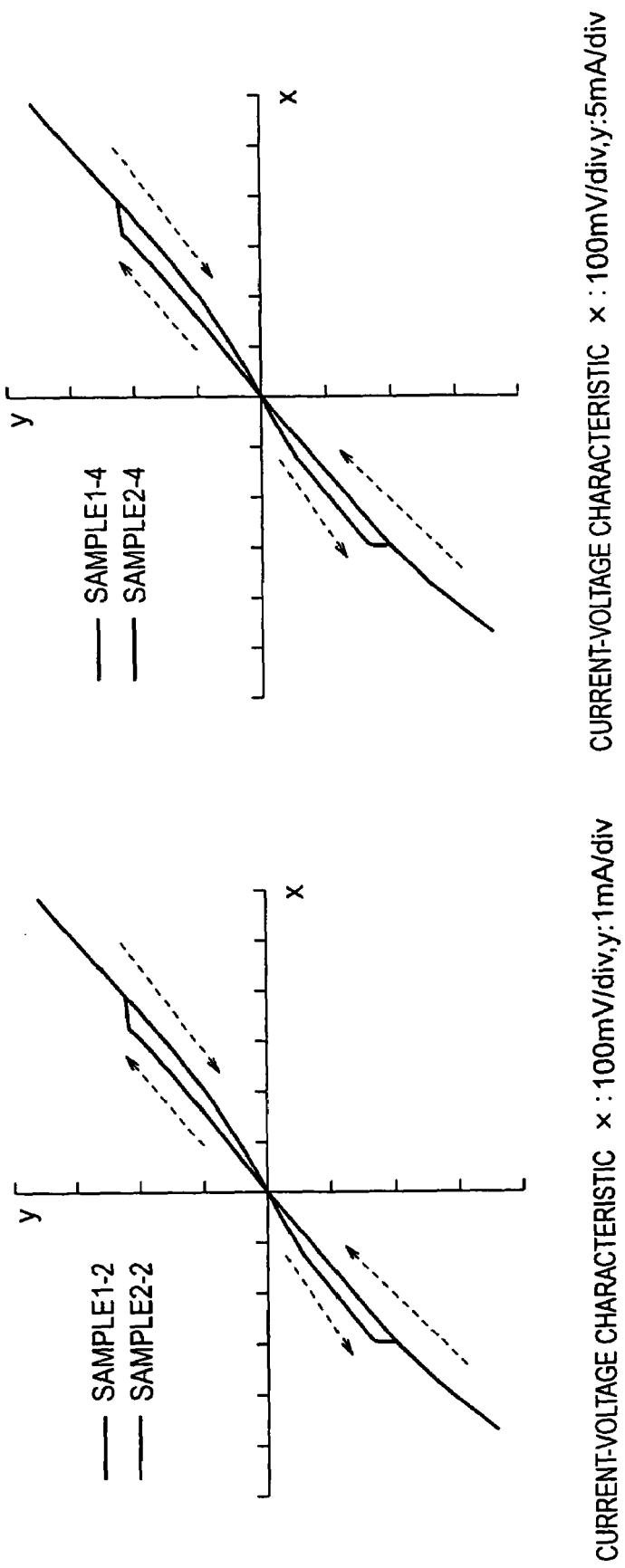

| | BACKGROUND LAYER | ANTI-FERRO-MAGNETIC LAYER | MAGNETIZATION PINNED LAYER | TUNNEL BARRIER LAYER | MAGNETIC RECORDING LAYER | REFLECTING LAYER | CURRENT DENSITY (A/cm²) |
|---|---|---|---|---|---|---|---|
| SAMPLE 6-1 | Ta(50nm)/Ru(10nm) | PtMn(15nm) | Co90Fe10(5nm) | AlOx(1.4nm) | Co80Pt20(3nm) | Ru(5nm) | $1.4 \times 10^7$ |
| 6-2 | Ta(50nm)/Ru(10nm) | PtMn(15nm) | Co90Fe10(5nm) | AlOx(1.4nm) | Co80Pt20(3nm) | Ru(5nm)/Co90Fe10(5nm)/PtMn(15nm) | $0.7 \times 10^7$ |
| 6-3 | Ta(50nm)/Ru(10nm) | PtMn(15nm) | Co90Fe10(5nm) | AlOx(1.4nm) | Co80Pt20(3nm) | Cr(5nm)/Co90Fe10(5nm)/PtMn(15nm) | $0.75 \times 10^7$ |
| 6-4 | Ta(50nm)/Ru(10nm) | PtMn(15nm) | Co90Fe10(5nm) | AlOx(1.4nm) | Co80Pt20(3nm) | RuCr(5nm)/Co90Fe10(5nm)/PtMn(15nm) | $0.65 \times 10^7$ |
| 6-5 | Ta(50nm)/Ru(10nm) | PtMn(15nm) | Co90Fe10(5nm) | AlOx(1.4nm) | Co80Pt20(3nm) | Ir(5nm) | $1.5 \times 10^7$ |
| 6-6 | Ta(50nm)/Ru(10nm) | PtMn(15nm) | Co90Fe10(5nm) | AlOx(1.4nm) | Co80Pt20(3nm) | Ir(5nm)/Co90Fe10(5nm)/PtMn(15nm) | $0.75 \times 10^7$ |
| 6-7 | Ta(50nm)/Ru(10nm) | PtMn(15nm) | Co90Fe10(5nm) | AlOx(1.4nm) | Co80Pt20(3nm) | IrRu(5nm) | $1.45 \times 10^7$ |
| 6-8 | Ta(50nm)/Ru(10nm) | PtMn(15nm) | Co90Fe10(5nm) | AlOx(1.4nm) | Co80Pt20(3nm) | IrRu(5nm)/Co90Fe10(5nm)/PtMn(15nm) | $0.65 \times 10^7$ |
| 6-9 | Ta(50nm)/Ru(10nm) | PtMn(15nm) | Co90Fe10(5nm) | AlOx(1.4nm) | Co80Pt20(3nm) | Re(5nm)/Co90Fe10(5nm)/PtMn(15nm) | $0.6 \times 10^7$ |
| 6-10 | Ta(50nm)/Ru(10nm) | PtMn(15nm) | Co90Fe10(5nm) | AlOx(1.4nm) | Co80Pt20(3nm) | RuRe(5nm)/Co90Fe10(5nm)/PtMn(15nm) | $0.65 \times 10^7$ |
| 6-11 | Ta(50nm)/Ru(10nm) | PtMn(15nm) | Co90Fe10(5nm) | AlOx(1.4nm) | Co90Fe10(4nm) | Ru(5nm)/Co90Fe10(5nm)/PtMn(15nm) | $0.45 \times 10^7$ |
| 6-12 | Ta(50nm)/Ru(10nm) | PtMn(15nm) | Co90Fe10(5nm) | AlOx(1.4nm) | Co90Fe10(4nm) | Ir(5nm)/Co90Fe10(5nm)/PtMn(15nm) | $0.55 \times 10^7$ |
| 6-13 | Ta(50nm)/Ru(10nm) | PtMn(15nm) | Co90Fe10(5nm) | AlOx(1.4nm) | Co90Fe10(4nm) | Cu(5nm)/Co90Fe10(4nm)/Ru(0.9nm)/Co90Fe10(5nm)/PtMn(15nm) | $0.8 \times 10^7$ |
| 6-14 | Ta(50nm)/Ru(10nm) | PtMn(15nm) | Co90Fe10(5nm) | AlOx(1.4nm) | Co90Fe10(4nm) | Cu(5nm)/Co90Fe10(5nm)/IrMn(15nm) | $0.9 \times 10^7$ |
| 6-15 | Ta(50nm)/Ru(10nm) | PtMn(15nm) | Co90Fe10(5nm) | AlOx(1.4nm) | Co90Fe10(4nm) | Cu(5nm)/Co90Fe10(4nm)/Ru(0.9nm)/Co90Fe10(5nm)/PtMn(15nm) | $0.85 \times 10^7$ |
| COMPARATIVE EXAMPLE1-1 | Ta(50nm)/Ru(10nm) | PtMn(15nm) | Co90Fe10(5nm) | AlOx(1.4nm) | Co90Fe10(4nm) | NON | $1.8 \times 10^7$ |
| COMPARATIVE EXAMPLE1-2 | Ta(50nm)/Ru(10nm) | PtMn(15nm) | Co90Fe10(5nm) | AlOx(1.4nm) | Co80Pt20(3nm) | NON | $2.1 \times 10^7$ |

FIG. 64

EXAMPLE OF REFLECTING MATERIAL FOR NON-MAGNETIC LAYER

| | BACKGROUND LAYER | ANTI-FERRO-MAGNETIC LAYER | MAGNETIZATION PINNED LAYER | TUNNEL BARRIER LAYER | MAGNETIC RECORDING LAYER | REFLECTING LAYER | CURRENT DENSITY (A/cm²) |
|---|---|---|---|---|---|---|---|
| SAMPLE6-2 | Ta (50nm)/Ru (10nm) | PtMn (15nm) | Co$_{90}$Fe$_{10}$(5nm) | AlOX (1.4nm) | Co$_{80}$Pt$_{20}$ (3.0nm) | Ru(5nm)/Co$_{90}$Fe$_{10}$(5nm) /PtMn(15nm) | $0.7 \times 10^7$ |
| SAMPLE6-3 | Ta (50nm)/Ru (10nm) | PtMn (15nm) | Co$_{90}$Fe$_{10}$(5nm) | AlOX (1.4nm) | Co$_{80}$Pt$_{20}$ (3.0nm) | Cr(5nm)/Co$_{90}$Fe$_{10}$(5nm) /PtMn(15nm) | $0.75 \times 10^7$ |
| SAMPLE6-4 | Ta (50nm)/Ru (10nm) | PtMn (15nm) | Co$_{90}$Fe$_{10}$(5nm) | AlOX (1.4nm) | Co$_{80}$Pt$_{20}$ (3.0nm) | RuCr(5nm)/Co$_{90}$Fe$_{10}$(5nm) /PtMn(15nm) | $0.65 \times 10^7$ |
| COMPARATIVE EXAMPLE2-1 | Ta (50nm)/Ru (10nm) | PtMn (15nm) | Co$_{90}$Fe$_{10}$(5nm) | AlOX (1.4nm) | Co$_{80}$Pt$_{20}$ (3.0nm) | Cu (5nm)/Co$_{90}$Fe$_{10}$(5nm) /PtMn(15nm) | $2.2 \times 10^7$ |
| COMPARATIVE EXAMPLE2-2 | Ta (50nm)/Ru (10nm) | PtMn (15nm) | Co$_{90}$Fe$_{10}$(5nm) | AlOX (1.4nm) | Co$_{80}$Pt$_{20}$ (3.0nm) | Rh (5nm)/Co$_{90}$Fe$_{10}$(5nm) /PtMn(15nm) | $2.1 \times 10^7$ |
| COMPARATIVE EXAMPLE2-3 | Ta (50nm)/Ru (10nm) | PtMn (15nm) | Co$_{90}$Fe$_{10}$(5nm) | AlOX (1.4nm) | Co$_{80}$Pt$_{20}$ (3.0nm) | Ag (5nm)/Co$_{90}$Fe$_{10}$(5nm) /PtMn(15nm) | $2.05 \times 10^7$ |
| COMPARATIVE EXAMPLE2-4 | Ta (50nm)/Ru (10nm) | PtMn (15nm) | Co$_{90}$Fe$_{10}$(5nm) | AlOX (1.4nm) | Co$_{80}$Pt$_{20}$ (3.0nm) | Au (5nm)/Co$_{90}$Fe$_{10}$(5nm) /PtMn(15nm) | $2.3 \times 10^7$ |

FIG. 65

EXAMPLE OF MAGNETIC RECORDING LAYER HAVING FERROMAGNETIC PARTICLES OR AN CONTINUOUS FERROMAGNETIC LAYER

| | BACKGROUND LAYER | ANTI-FERRO-MAGNETIC LAYER | MAGNETIZATION PINNED LAYER | TUNNEL BARRIER LAYER | MAGNETIC RECORDING LAYER | REFLECTING LAYER | CURRENT DENSITY (A/cm$^2$) |
|---|---|---|---|---|---|---|---|
| SAMPLE6-11 | Ta(50nm)/Ru (10nm) | PtMn(15nm) | Co$_{90}$Fe$_{10}$(5nm) | AlOx(1.4nm) | Co$_{90}$Fe$_{10}$(4nm) | Ru(5nm)/Co$_{90}$Fe$_{10}$(5nm) /PtMn(15nm) | 0.45 × 10$^7$ |
| SAMPLE6-16 | Ta(50nm)/Ru (10nm) | PtMn(15nm) | Co$_{90}$Fe$_{10}$(5nm) | AlOx(1.4nm) | Co$_{90}$Fe$_{10}$(4nm) | Cr(5nm)/Co$_{90}$Fe$_{10}$(5nm) /PtMn(15nm) | 0.55 × 10$^7$ |
| SAMPLE6-17 | Ta(50nm)/Ru (10nm) | PtMn(15nm) | Co$_{90}$Fe$_{10}$(5nm) | AlOx(1.4nm) | Co$_{90}$Fe$_{10}$(4nm) | RuCr(5nm)/Co$_{90}$Fe$_{10}$(5nm) /PtMn(15nm) | 0.52 × 10$^7$ |
| COMPARATIVE EXAMPLE3-1 | Ta(50nm)/Ru (10nm) | PtMn(15nm) | Co$_{90}$Fe$_{10}$(5nm) | AlOx(1.4nm) | Co$_{90}$Fe$_{10}$(4nm) | Ru(5nm)/Co$_{90}$Fe$_{10}$(5nm) /PtMn(15nm) | 1.1 × 10$^7$ |
| COMPARATIVE EXAMPLE3-2 | Ta(50nm)/Ru (10nm) | PtMn(15nm) | Co$_{90}$Fe$_{10}$(5nm) | AlOx(1.4nm) | Co$_{90}$Fe$_{10}$(4nm) | Cr(5nm)/Co$_{90}$Fe$_{10}$(5nm) /PtMn(15nm) | 1.5 × 10$^7$ |
| COMPARATIVE EXAMPLE3-3 | Ta(50nm)/Ru (10nm) | PtMn(15nm) | Co$_{90}$Fe$_{10}$(5nm) | AlOx(1.4nm) | Co$_{90}$Fe$_{10}$(4nm) | RuCr(5nm)/Co$_{90}$Fe$_{10}$(5nm) /PtMn(15nm) | 1.3 × 10$^7$ |

FIG. 66

ARRANGEMENT OF A MAGNETO-RESISTANCE EFFECT ELEMENT HAVING A SURFACE CONTACTING A SIDE FACE OF AN ELECTRODE AND MAGNETIC MEMORY USING THIS ARRANGEMENT

CROSS-REFERENCE TO RELATED APPLICATION

This application is based upon and claims the benefit of priority from prior Japanese Patent Application No. 2004-59408, 2004-286396, and 2004-308532 filed on Mar. 3, 2004, Sep. 30, 2004 and Oct. 22, 2004 in Japan, the entire contents of which are incorporated herein by reference.

BACKGROUND ART

1. Field of the Invention

The present invention relates to a magneto-resistance effect element and a magnetic memory.

2. Related Art

It has been proposed that a magneto-resistance effect element using magnetic films is used for a magnetic head, a magnetic sensor or the like, and is also used for a solid state magnetic memory (MRAM: Magnetic Random Access Memory).

In recent years, in a sandwiching structure film where a dielectric layer is interposed between two ferromagnetic layers, the so-called ferromagnetic tunnel junction element (Tunneling Magneto-resistance Effect element: TMR element) has been proposed as a magneto-resistance effect element utilizing a tunnel current obtaining by causing a current to flow in a film face perpendicularly thereto. Since a magneto-resistance change ratio (MR ratio) has reached 20% or more in the TMR element, there has been growing technical developments for public applications to MRAM.

The TMR element can be realized by, after forming a thin Al (aluminum) layer with a thickness of 0.6 nm to 2.0 nm on a ferromagnetic electrode, exposing a surface thereof to oxygen glow discharging or oxygen gas to form a tunnel barrier layer made from $Al_2O_3$.

A ferromagnetic single tunnel junction having a structure obtained by applying an anti-ferromagnetic layer to a ferromagnetic layer of the ferromagnetic single tunnel junction on one side thereof to make the ferromagnetic layer on the one side a magnetization pinned layer has been proposed.

A ferromagnetic tunnel junction including magnetic particles dispersed in dielectric and a ferromagnetic double tunnel junction (a continuous film) have also been proposed.

There is a possibility that these junctions are applied to the MRAM, because the magneto-resistance change ratio of 20% to 50% has been achieved and decrease in magneto-resistance change ratio can be suppressed even when a value of voltage applied to a TMR element is increased in order to obtain a desired output voltage value.

A magnetic recording element using the ferromagnetic single tunnel junction or the ferromagnetic double tunnel junction is non-volatile, and has a fast writing/reading time such as 10 nanoseconds or less and a potential that the number of rewriting times is $10^{15}$ or more.

Regarding a cell size of a memory, however, when an architecture where a memory cell includes one transistor and one TMR element is used, there is such a problem that the cell can not be reduced in size to a DRAM (Dynamic Random Access Memory) formed from semiconductor or smaller.

In order to solve this problem, a diode type architecture where a cell constituted of a TMR element and a diode connected in series are arranged between a bit line and a word line and a simple matrix type architecture where a cell constituted of a TMR element is arranged between a bit line and a word line have been proposed.

In both the cases, however, since reversion is performed by a current magnetic field due to current pulses at a time of writing in a storage layer, there is such a problem that power consumption becomes large, mass storage can not be achieved due to an allowable current density limit in wiring, and a driver area for allowing current to flow becomes large.

In order to overcome the above problem, there has been proposed a solid magnetic storage device where a thin film made from magnetic material with a high magnetic permeability is provided around a writing wire. According to such a magnetic storage device, since the magnetic film with a high magnetic permeability is provided around the writing wire, a value of a current required for information or data writing into a magnetic recording layer can be reduced efficiently. Even if such a storage device is used, it is very difficult to reduce writing current to 1 mA or less.

In order to solve these problems, a writing method utilizing a spin injection process has been proposed (for example, refer to U. S. Pat. No. 6,256,223). The writing method is constituted to utilize such a fact that magnetization of a magnetization free layer in a magneto-resistance effect element is spin-reversed by spin-injecting spin-polarized current into the magneto-resistance effect element.

In the writing method utilizing the spin injection, when spin injection is performed, annular magnetic field due to spin injection current is generated and spin reversion does not occur, when an element area is large. Therefore, an element with a small area is required.

Further, since high integration is required for application as a solid magnetic memory, it is necessary to form an element with a small area and with reduced area fluctuation.

As explained above, the spin injection process operating with a low writing current requires a formation of an element with a small area and also requires reduced area fluctuation for high integration.

In addition, in the spin injection process, when magnetization of a magnetic recording layer is reversed by injecting spin-polarized current, annular magnetic field due to the above current occurs in a memory element with a large area so that reversion of magnetization does not occur.

Since high integration is required for application as a solid magnetic memory, it is necessary to form an element with a small area and with reduced area fluctuation. Further, it is necessary to allow low current writing in cells with various sizes including a small cell with a size of 0.1×0.1 $\mu m^2$ or less which is a limit for heat fluctuation resistance and provide heat stability of a magnetic recording layer to heat fluctuation. When the spin injection process is utilized, it is necessary to provide stability of magnetization in a magnetization pinned layer at a writing time.

SUMMARY OF THE INVENTION

A magneto-resistance effect element according to a first aspect of the invention includes: a first electrode having an end face; a magneto-resistance effect film which is formed such that a surface thereof comes in contact with the end face of the first electrode and which includes a magnetization pinned layer whose magnetization direction is pinned, a magnetization free layer whose magnetization direction is changeable, and a first non-magnetic layer which is provided between the magnetization pinned layer and the magnetization free layer; and a second electrode which is formed on another surface of the magneto-resistance effect film opposed from the surface coming in contact with the surface of the first electrode.

A magneto-resistance effect element according to a second aspect of the invention includes: a first electrode which has an end face and whose magnetization direction is pinned; a first non-magnetic layer which is formed such that a film face thereof comes in contact with the end face of the first electrode; a magnetization free layer which is formed on the first non-magnetic layer and whose magnetization direction is changeable; and a second electrode which is formed on the magnetization free layer.

A magneto-resistance effect element according to a fourth aspect of the invention includes a first magnetization pinned layer which has at least one magnetic layer and whose magnetization direction is pinned; a magnetization free layer which has a plurality of ferromagnetic particles separated from one another by dielectric and whose magnetization direction is changeable; a tunnel barrier layer which is provided between the first magnetization pinned layer and the magnetization free layer; and a first non-magnetic layer which is provided at an opposite side of the magnetization free layer from the tunnel barrier layer, wherein the magnetization direction of the ferromagnetic particles in the magnetization free layer is made changeable by current flowing in a direction of a film thickness.

A magneto-resistance effect element according to a fifth aspect of the invention includes a stacked layers film where an anti-magnetic layer and a magnetization pinned layer whose magnetization direction is pinned are alternately stacked, one face of the stacked layers film constituting a magnetization pinned layer; a magnetization free layer whose magnetization direction is changeable; a tunnel barrier layer which is provided between the magnetization pinned layer of the stacked layers film which forms the one face and the magnetization free layer; and a non-magnetic layer which is provided at an opposite side of the magnetization free layer from the tunnel barrier layer, wherein the magnetization direction of the magnetization free layer is made changeable by current flowing in a direction of a film thickness A magneto-resistance effect element according to a sixth aspect of the invention includes a magnetization pinned layer whose magnetization direction is pinned; a magnetization free layer whose magnetization direction is changeable; a tunnel barrier layer which is provided between the magnetization pinned layer and the magnetization free layer; and a plurality of insulators which are provided between one of the magnetization pinned layer and the magnetization free layer, and the tunnel barrier layer so as to be separated from each other.

A magnetic memory according to a seventh aspect of the invention includes a memory cell including a magneto-resistance effect element described in either one of the aspects; a first wire which is electrically connected to one end of the magneto-resistance effect element; and a second wire which is electrically connected to the other end of the magneto-resistance effect element.

BRIEF DESCRIPTION OF THE DRAWINGS

FIG. 10 is an upper view of memory cells arranged in a column direction in the magnetic memory according to the fifth embodiment;

FIG. 12 is an upper view of memory cells arranged in a column direction in the magnetic memory according to the modification of the fourth embodiment;

FIG. 34 is a table showing measurement results of current densities of samples manufactured in a sixth example of the invention;

FIGS. 53A to 53C are sectional views showing manufacturing steps of a magneto-resistance effect element according to the twenty-third embodiment of the invention;

FIGS. 61A and 61B are graphs showing a current-voltage characteristic of samples manufactured in the first example of the invention;

FIG. 64 is a table showing measurement results of current densities of samples manufactured in a third example of the invention;

FIG. 65 is a table showing measurement results of current densities of samples manufactured in the third example of the invention;

FIG. 66 is a table showing measurement results of current densities of samples manufactured in a third example of the invention;

DETAILED DESCRIPTION OF THE INVENTION

Embodiments of the present invention will be explained below with reference to the drawings.

FIRST EMBODIMENT

Figure 1:
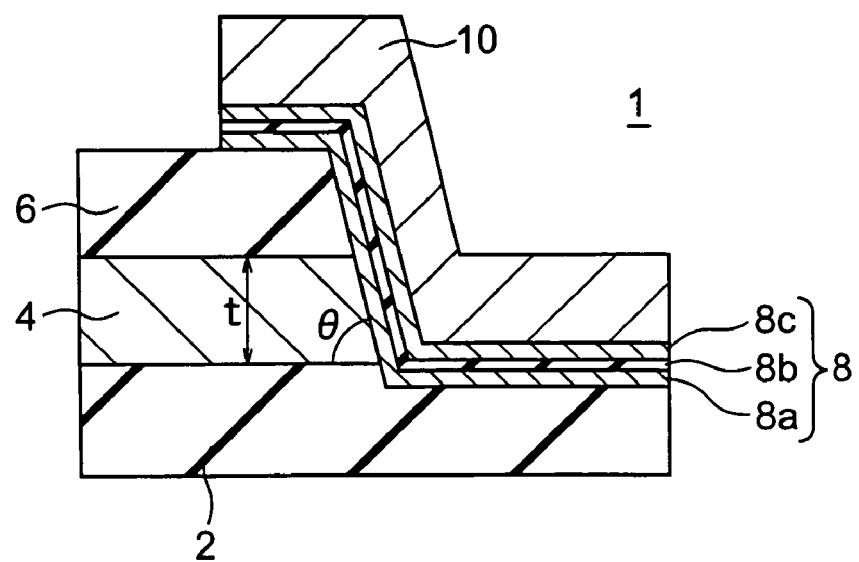
FIG. 1 is a sectional view showing a constitution of a magneto-resistance effect element according to a first embodiment of the present invention.
Figure 2:
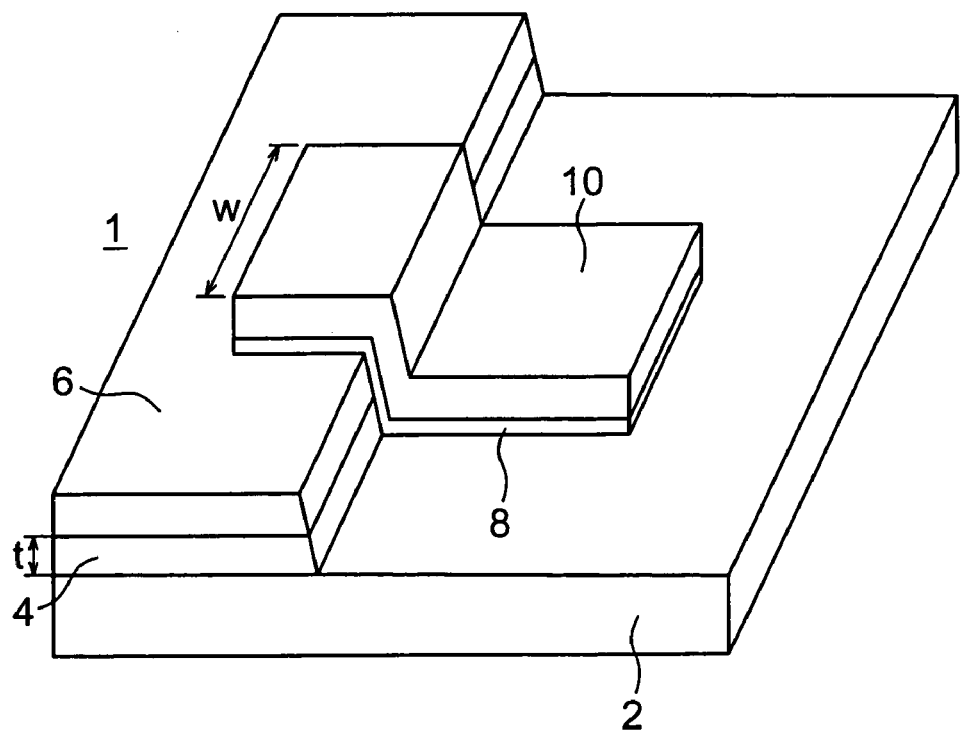
FIG. 2 is a perspective view of the magneto-resistance effect element according to the first embodiment.

A magneto-resistance effect element according to a first embodiment of the invention is shown in FIGS. 1 and 2. FIG. 1 is a sectional view showing a magneto-resistance effect element 1 according to the first embodiment, and FIG. 2 is a perspective view showing the magneto-resistance effect element 1 according to the embodiment.

Figure 68:
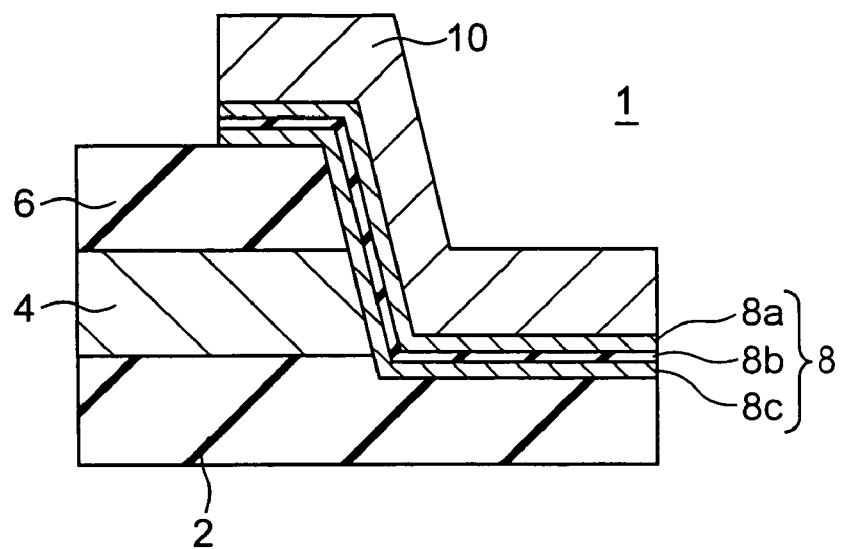
FIG. 68 is a sectional view showing a constitution of a magneto-resistance effect element according to a modification of the first embodiment.

The magneto-resistance effect element 1 according to the embodiment is a TMR element, and it is provided with a base electrode 4 formed on a substrate (not shown) on which an insulating film 2 is formed, a TMR film 8 formed so as to contact with an end face of the base electrode 4, and a counter electrode 10 formed so as to cover the TMR film 8. Incidentally, the TMR film 8 is formed so as to not only contact with the end face of the base electrode 4 but also extend on a region of the insulating film 2 on which the base electrode 4 is not formed and extend on an insulating film 6 formed on the base electrode 4. The TMR film 8 constituted a stacked layer including a ferromagnetic layer 8a whose magnetization direction is pinned and serves as a magnetization pinned layer, a ferromagnetic layer 8c serving as magnetization free layer whose magnetization direction is changeable, and a tunnel barrier layer 8b provided between the ferromagnetic layers 8a and 8c. Incidentally, when the magneto-resistance effect element 1 is used for a memory cell in a magnetic memory, the magnetization free layer is also called "a magnetic recording layer". In this embodiment, arrangement has been made such that the ferromagnetic layer 8a serving as the magnetization pinned layer comes in contact with the end face of the base electrode 4 and the ferromagnetic layer 8c serving as the magnetization free layer comes in contact with a counter electrode 10, but these layers 8a and 8c may be arranged in a inverse manner. That is, as shown in FIG. 68, such an arrangement may be employed that the ferromagnetic layer 8c serving as the magnetization free layer comes in contact with the end face of the base electrode 4 and the ferromagnetic layer 8a serving as the magnetization pinned layer comes in contact with the counter electrode 10.

An area A of the TMR element according to the embodiment depends on a thickness t of the base electrode 4, a width w of the TMR film 8, and an angle θ formed between the end portion of the base electrode 4 and a film face (a substrate face) of the insulating film 2. The relationship among these parameters is defined by the following equation.

$$A = w \times t / \sin \theta$$

In the embodiment, a film thickness direction of the base electrode 4 is utilized as one side of the TMR element. In general, it is easy to control a thickness of a thin film and it is possible to thin the thin film very much. Therefore, it is made possible to form the TMR element 1 with a small area easily by setting the thickness direction of the film to one side of the TMR element 1. Further, when the term "sin θ" defined by the angle θ formed between the substrate face and the end portion of the base electrode 4 and the width w of the counter electrode 10 are compared with each other, the width w is larger in fluctuation in a manufacturing process of a TMR element than the term "sin θ". Therefore, fluctuation in area of the TMR element 1 mainly depends on the fluctuation of the width w of the counter electrode 10.

In the conventional technique that a TMR film is formed on a base electrode without coming in contact with an end face of the base electrode 4, which is different from this embodiment, fluctuation in area of the TMR element depends on a width and a length thereof. Therefore, when a size error occurring in exposure technique is represented as δ, a relative fluctuation of an area of a TMR element is expressed as "2δ/w". Since a rectangle having one side with about the minimum size obtained by the exposure technique has rounded corners, fluctuation is further increased.

On the other hand, in the embodiment, since the width w of the counter electrode 10 is the dominant factor to the fluctuation in area of the TMR element 1, the relative fluctuation of the area of the TMR element 1 is expressed as "δ/w", which is half of the conventional case or less.

Figure 3:
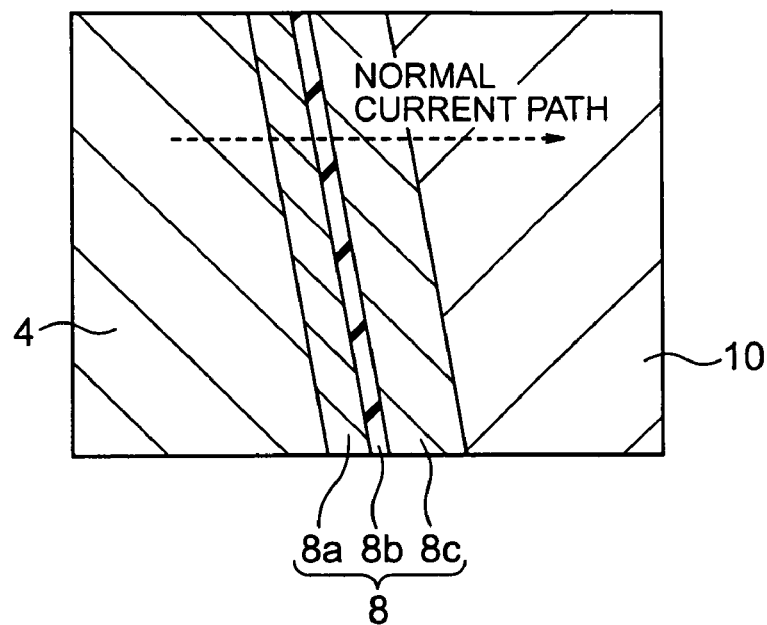
FIG. 3 is a sectional view for explaining a route of current according to the first embodiment.
Figure 4:
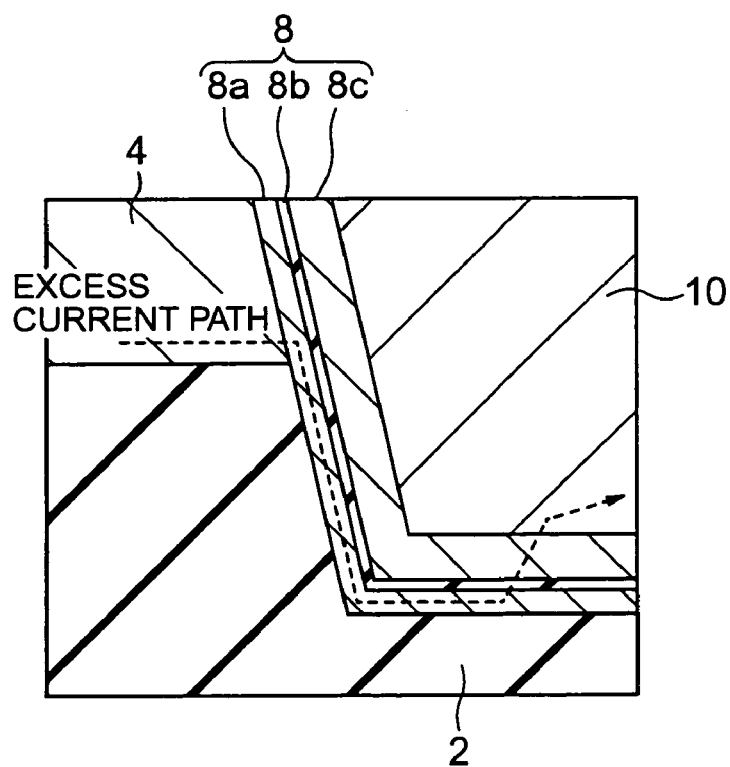
FIG. 4 is a sectional view for explaining the route of current according to the first embodiment.

In the magneto-resistance effect element 1 according to the embodiment, current flowing from the base electrode 4 to the counter electrode 10 flows through the TMR film 8. As shown in FIG. 3, major part of the current flows to the counter electrode 10 through the TMR film 8 coming in contact with the end portion of the base electrode 4, but a path for current flowing from the lowermost portion of the base electrode end portion along the magnetization pinned layer (the magnetic recording layer in the arrangement with reversed layers) so as to cross the tunnel barrier layer 8b from the bottom of the counter electrode is also present, as shown in FIG. 4. A current flows in the current path shown in FIG. 4, which results in lowering of a resistance change ratio. Therefore, it is desirable that one ferromagnetic layer 8a (the magnetization pinned layer in this embodiment) in the TMR film 8 which comes in contact with the end portion of the base electrode 4 is made higher in sheet resistance than the other ferromagnetic layer 8c. Accordingly, when the ferromagnetic layers 8a and 8c are formed from the same material, it is desirable that one ferromagnetic layer 8a in the TMR film 8 which comes in contact with the end portion of the base electrode 4 is formed to be thinner than the other ferromagnetic layer 8c in the TMR film 8.

As explained above, according to the embodiment, an area of an element can be made small and fluctuation of the area can be reduced.

In general, since the magnetization pinned layer is required to have a sufficient thickness so as not to cause easy magnetization reversion, it is difficult to thin the magnetization pinned layer. Therefore, as shown in FIG. 68, when a layer arrangement (a layer arrangement reverse to the layer arrangement in the embodiment) where the ferromagnetic layer coming in contact with the base electrode 4 is set to the magnetization free layer (magnetic recording layer) is employed, it is made possible to form a very thin magnetic recording layer with a thickness of 10 nm or less, so that the direction of magnetization of the magnetic recording layer can be spin-reversed easily.

The magnetization pinned layer may be a stacked layers film where a ferromagnetic layer and an anti-ferromagnetic layer are alternately stacked one on another.

Second Embodiment

Next, a magneto-resistance effect element according to a second embodiment of the invention will be explained with reference to FIG. 5. A magneto-resistance effect element 1 according to the embodiment has a constitution that a base electrode 5 also serves as the magnetization pinned layer in the first embodiment. Therefore, according to the embodiment, it is unnecessary to provide the magnetization pinned layer 8a provided in the first embodiment in FIG. 1, where a member coming in contact with the end face of the base electrode 5 which also serving as the magnetization pinned layer is the tunnel barrier layer 8b in the TMR film 8.

With such a constitution, the current path shown in FIG. 4 can be removed, a large resistance change ratio can be obtained as compared with the structure in the first embodiment shown in FIG. 1. It is made possible to form a magnetic recording layer 8c with a film thicker than that in the first embodiment, so that a volume of the magnetic recording layer 8c can be made large. Thereby, the magnetization of the magnetic recording layer 8c becomes hard to reverse and tolerance to thermal disturbance increases.

In the magneto-resistance effect element 1 according to this embodiment, an area of an element can be made small and fluctuation of the area can be reduced like the first embodiment.

Third Embodiment

Next, a magneto-resistance effect element according to a third embodiment of the invention will be explained with reference to FIG. 6. A magneto-resistance effect element 1 according to this embodiment has such a constitution that an anti-ferromagnetic layer 3 is provided between the magnetization pinned layer 5 and the insulating film 2 in the second embodiment. That is, in the embodiment, a base electrode is constituted of the anti-ferromagnetic layer 3 and the magnetization pinned layer 5. The anti-ferromagnetic layer 3 pins the direction of magnetization of the magnetization pinned layer 5 utilizing exchange coupling with the magnetization pinned layer 5. Since the magnetization pinned layer 5 is stabilized in direction of magnetization due to the exchange coupling, a magneto-resistance effect element with a high reliability can be obtained. As the anti-ferromagnetic layer 3, such material as Fe—Mn (iron—manganese), Pt—Mn (platinum—manganese), Pt—Cr—Mn (platinum—chromium—manganese), Ni—Mn (nickel—manganese), Ir—Mn (iridium—manganese), NiO (nickel oxide), or CoO (cobalt oxide) can be used.

In the embodiment, since a current path formed of the anti-ferromagnetic layer 3/the tunnel barrier layer 8b/the magnetic recording layer 8c occurs, the resistance change ratio is reduced as compared with that in the second embodiment. For this reason, in the embodiment, when material having a sheet resistance higher than a resistance occurring when a current flows in the tunnel barrier layer 8b and the magnetic recording layer 8c is selected as material for the anti-ferromagnetic layer 3, a current flows in a path of the magnetization pinned layer 5/the tunnel barrier layer 8b/the magnetic recording layer 8c more easily than a path of the anti-ferromagnetic layer 3/the tunnel barrier layer 8b/the magnetic recording layer 8c, so that the resistance change ratio can be prevented from lowering. Anti-ferromagnetic material where a gap of SDW (Spin Density Wave) is present in a Fermi surface, such as Pt—Mn (platinum—manganese), Pt—Cr—Mn (platinum—chromium—manganese), Ni—Mn (nickel—manganese), or anti-ferromagnetic oxides such as NiO (nickel oxide), CoO (cobalt oxide) are desirable as material for the anti-ferromagnetic layer for preventing the resistance change ratio from lowering.

Figure 69:
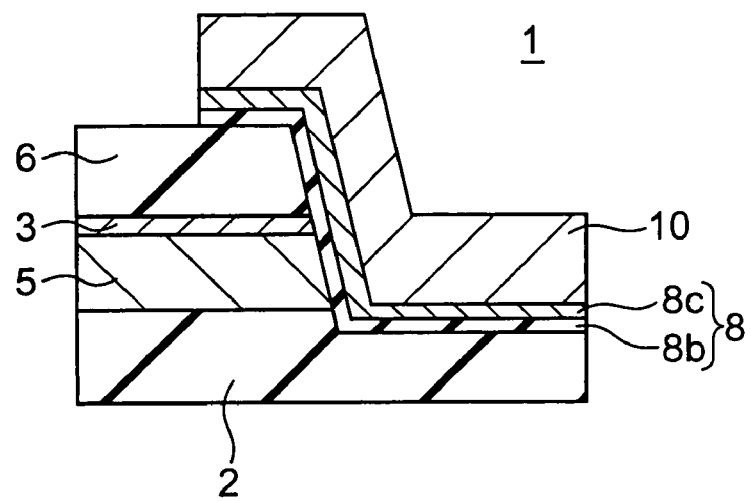
FIG. 69 is a sectional view showing a constitution of a magneto-resistance effect element according to a first modification of the third embodiment.

In the embodiment, as shown in FIG. 69, the anti-ferromagnetic layer 3 is provided below the magnetization pinned layer, but the anti-ferromagnetic layer 3 may be provided above the magnetization pinned layer. When a three layers structure of an anti-ferromagnetic layer/a ferromagnetic layer/an anti-ferromagnetic layer, or a structure where a plurality of stacked layers films constituted of an anti-ferromagnetic layer/a ferromagnetic layer are stacked is used as the base electrode according to magnitude of magnetization pinning force, a further strong magnetization pinning force can be obtained, which is advantageous regarding reliability.

Figure 70:
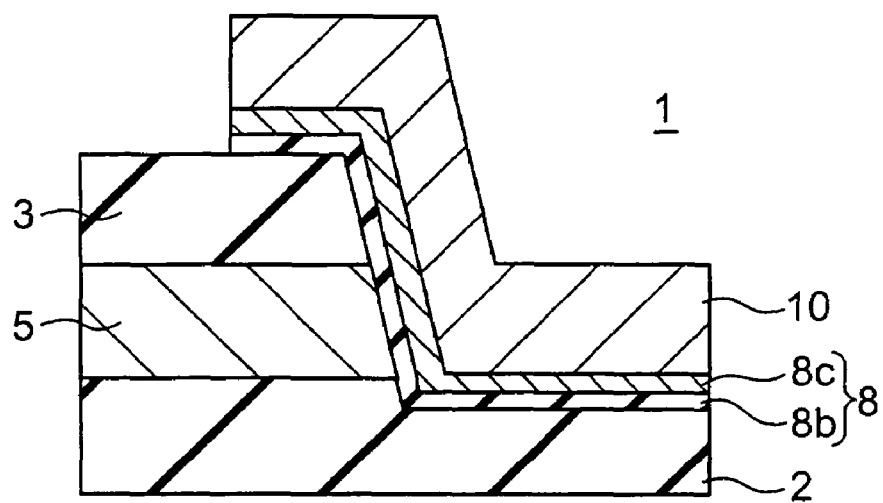
FIG. 70 is a sectional view showing a constitution of a magneto-resistance effect element according to a second modification of the third embodiment.

Incidentally, in a modification shown in FIG. 69 of the present embodiment, when an insulating material, for example NiO (nickel oxide), CoO (cobalt oxide) or stacked layers of these material, as serving the anti-ferromagnetic layer 3 is used, the insulating film 6 can be deleted as shown in FIG. 70.

Figure 71:
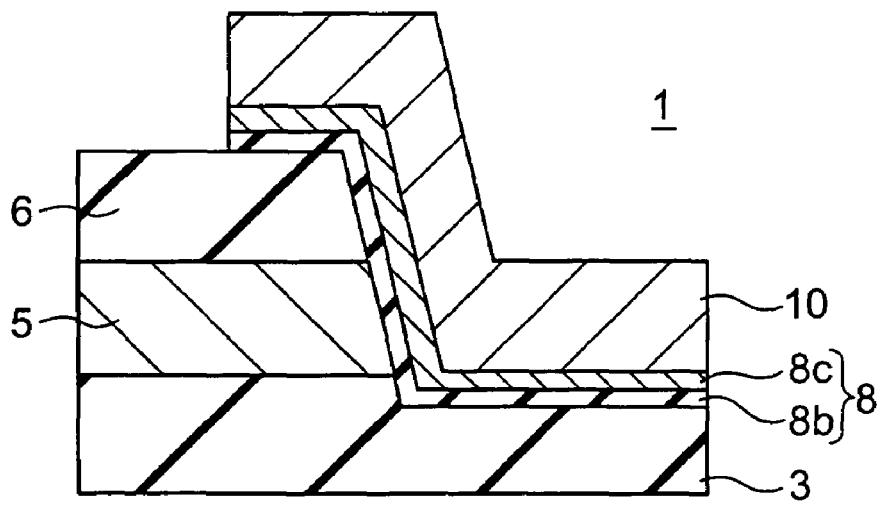
FIG. 71 is a sectional view showing a constitution of a magneto-resistance effect element according to a third modification of the third embodiment.
Figure 72:
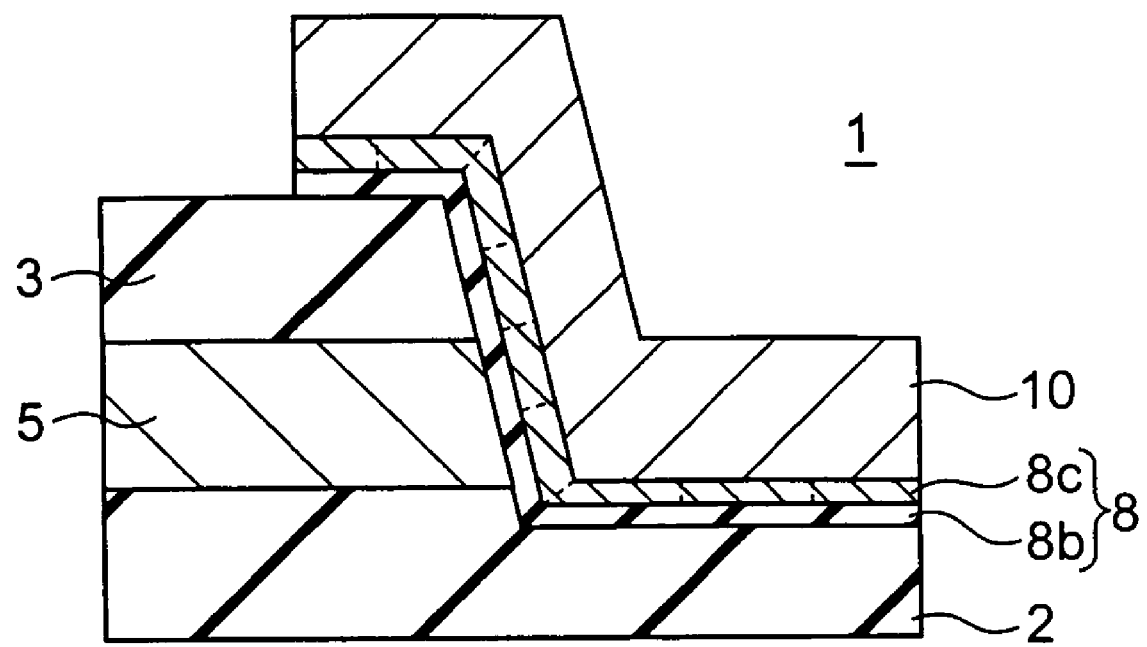
FIG. 72 is a sectional view showing a constitution of a magneto-resistance effect element according to a fourth modification of the third embodiment.

Further, when an insulating material, for example NiO (nickel oxide), CoO (cobalt oxide) or stacked layers of these material, as serving the anti-ferromagnetic layer 3 is used, the insulating film 2 can be replaced with the anti-ferromagnetic layer 3 of the insulating material as shown in FIG. 71.

In the modification shown in FIG. 70, as explained an eighth embodiment, grain boundaries are formed in the magnetic recording layer 8c by adding non-magnetic elements (for example, Cr or Pt) into the magnetic recording layer 8c. In this case, small magnetic domains are formed in the magnetic recording layer 8c, so that a total volume of spin-reversed regions becomes small. Thereby, the spin reversing is made easy, so that a current density of the spin reversion can be reduced.

Figure 73:
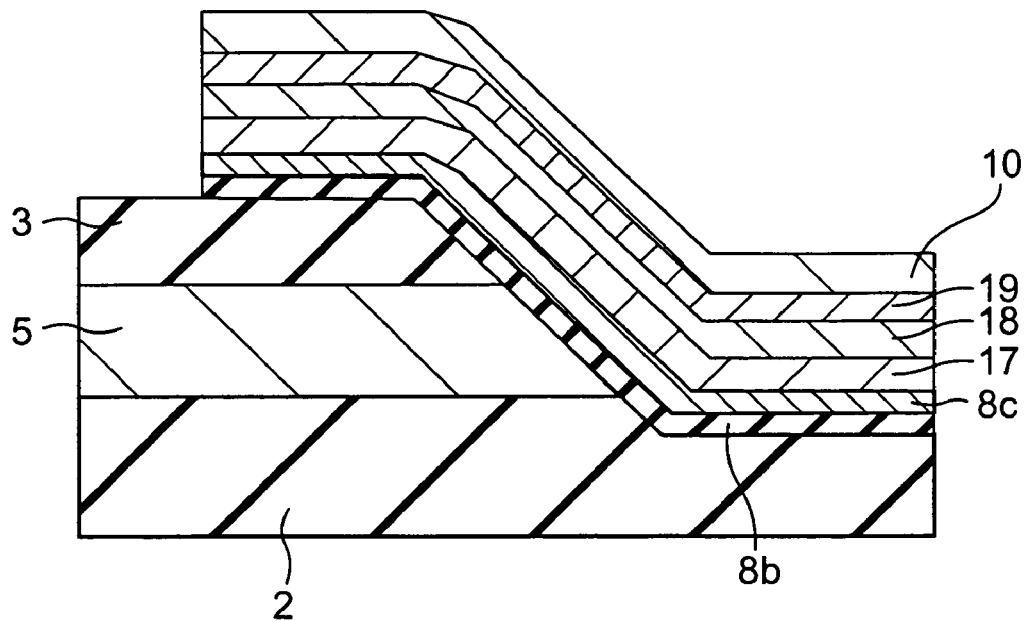
FIG. 73 is a sectional view showing a constitution of a magneto-resistance effect element according to a fifth modification of the third embodiment.

In the present embodiment, as shown in FIG. 73, a non-magnetic layer 17, a magnetic layer 18, and an anti-ferromagnetic layer 19 can be provided between the magnetic recording layer 8c and the counter electrode 10. Using this constitution, a spin injection writing can be implemented by changing a flowing direction of the current and a writing current can be reduced like a fifteenth embodiment.

Figure 74:
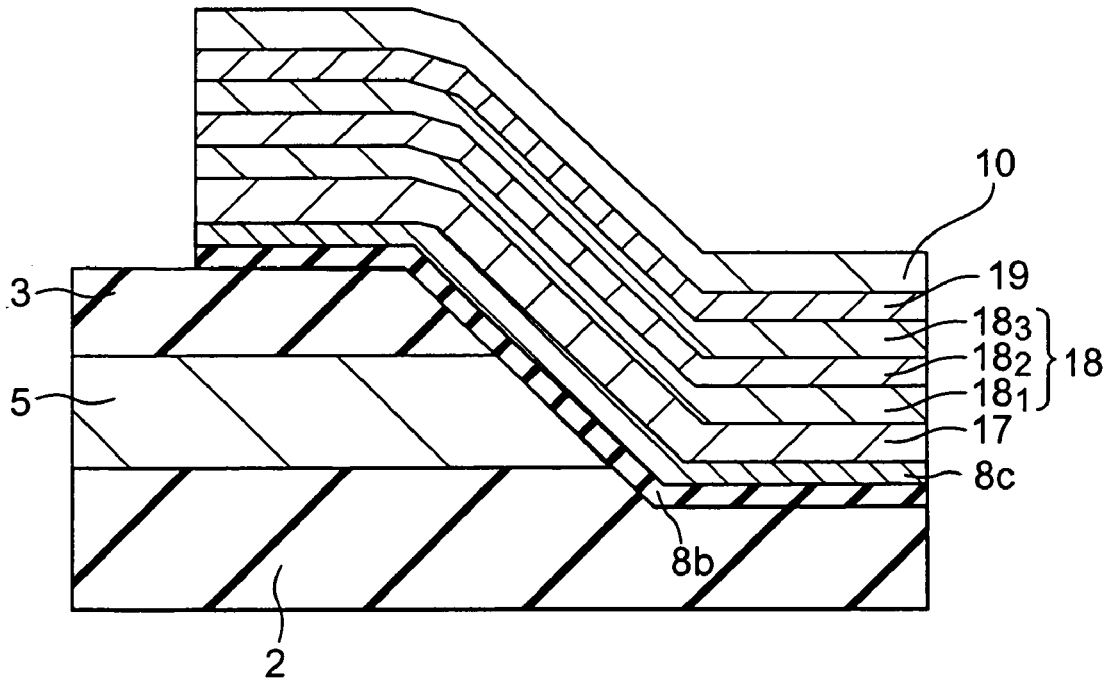
FIG. 74 is a sectional view showing a constitution of a magneto-resistance effect element according to a sixth modification of the third embodiment.

In the modification shown in FIG. 73, the magnetization pinned layer 18 can be replaced with two magnetic layers $18_1, 18_3$ having a ferromagnetic coupling and a nonmagnetic layer $18_2$ sandwiched between the two magnetic layers $18_1$, $18_3$ as shown in FIG. 74. In this case, two magnetic layers $18_1, 18_3$ can have an anti-ferromagnetic coupling in stead of the ferromagnetic coupling.

In the magneto-resistance effect element according to this embodiment, an area of an element can be made small and fluctuation of the area can be reduced like the second embodiment.

Fourth Embodiment

Figure 7:
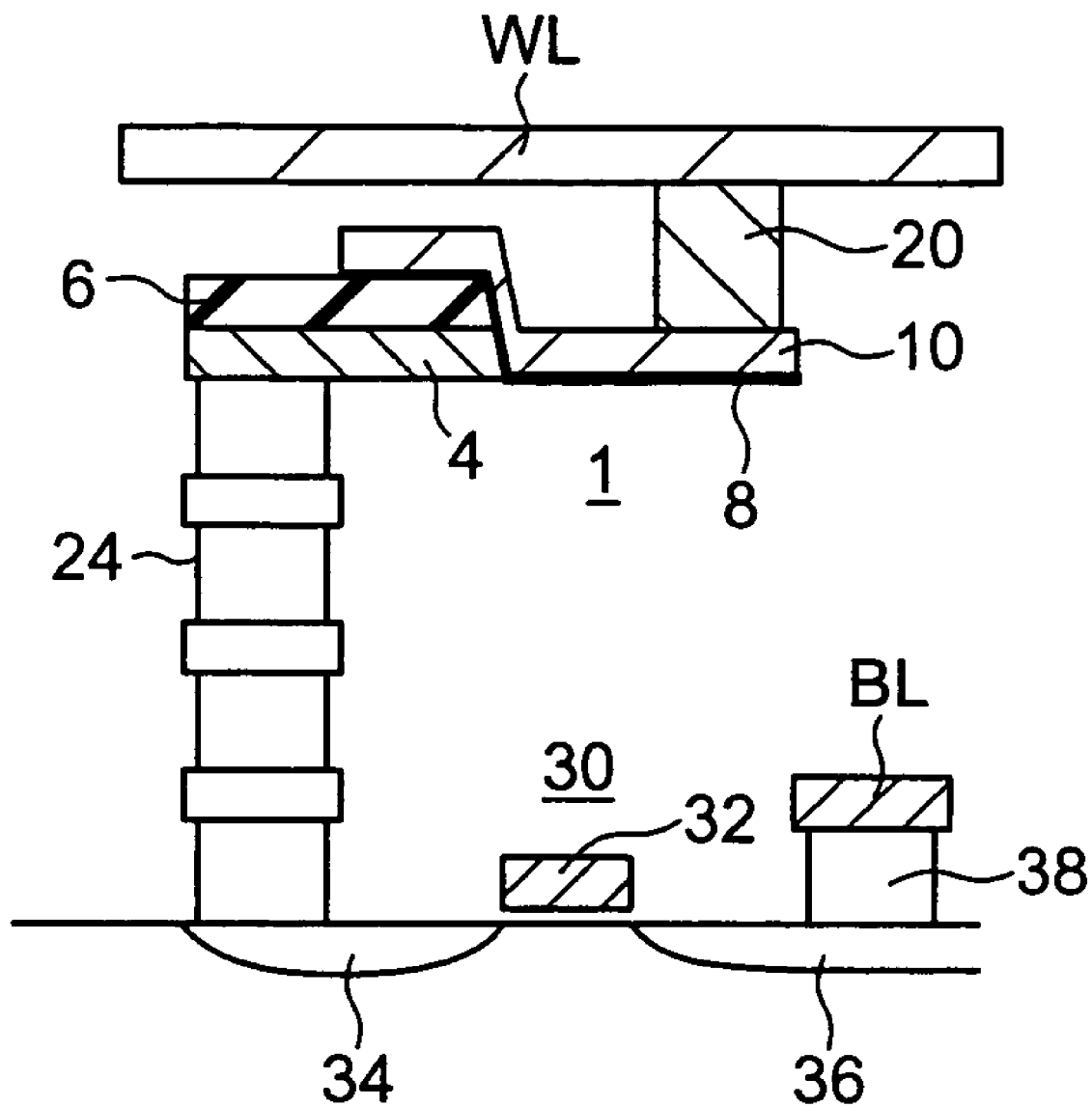
FIG. 7 is a sectional view showing a constitution of a memory cell in a magnetic memory according to a fourth embodiment of the invention.

Next, a magnetic memory according to a fourth embodiment of the invention will be explained with reference to FIG. 7 and FIG. 8. A magnetic memory according to the embodiment has a plurality of bit lines BL, a plurality of word lines WL, and a plurality of memory cells arranged in a matrix. FIG. 7 is a view showing the constitution of the memory cell and FIG. 8 is a top view of memory cells arranged in a column direction.

The memory cell in the magnetic memory according to the embodiment is provided in the vicinity of a region at which a bit line BL and a word line WL cross each other and is provided with a magneto-resistance effect element 1 and a selecting transistor 30 having both writing function/reading function. The magneto-resistance effect element 1 is the same as that in the first embodiment 1. That is, the magneto-resistance effect element 1 is a TMR element, and it is provided with a base electrode 4, a TMR film 8, and a counter electrode 10. The TMR film 8 is formed so as to come in contact with an end face of the base electrode 4. Incidentally, the TMR film 8 is formed so as to not only come in contact with the end face of the base electrode 4 but also extend on a region of an insulating film (not shown) on which the base electrode 4 is not formed and extend on an insulating film 6 formed on the base electrode 4. The selecting transistor 30 is a MOS transistor formed on the substrate, and it is provided with a gate 32, a source 34, and a drain 36.

The base electrode 4 of the TMR element 1 is connected to the source 34 of the selecting transistor 30 via a connecting portion 24. The drain 36 of the selecting transistor 30 is connected to the bit line BL via a connecting portion 38. On the other hand, the counter electrode 10 of the TMR element 1 is connected to the word line WL via a contact 20.

Figure 8:
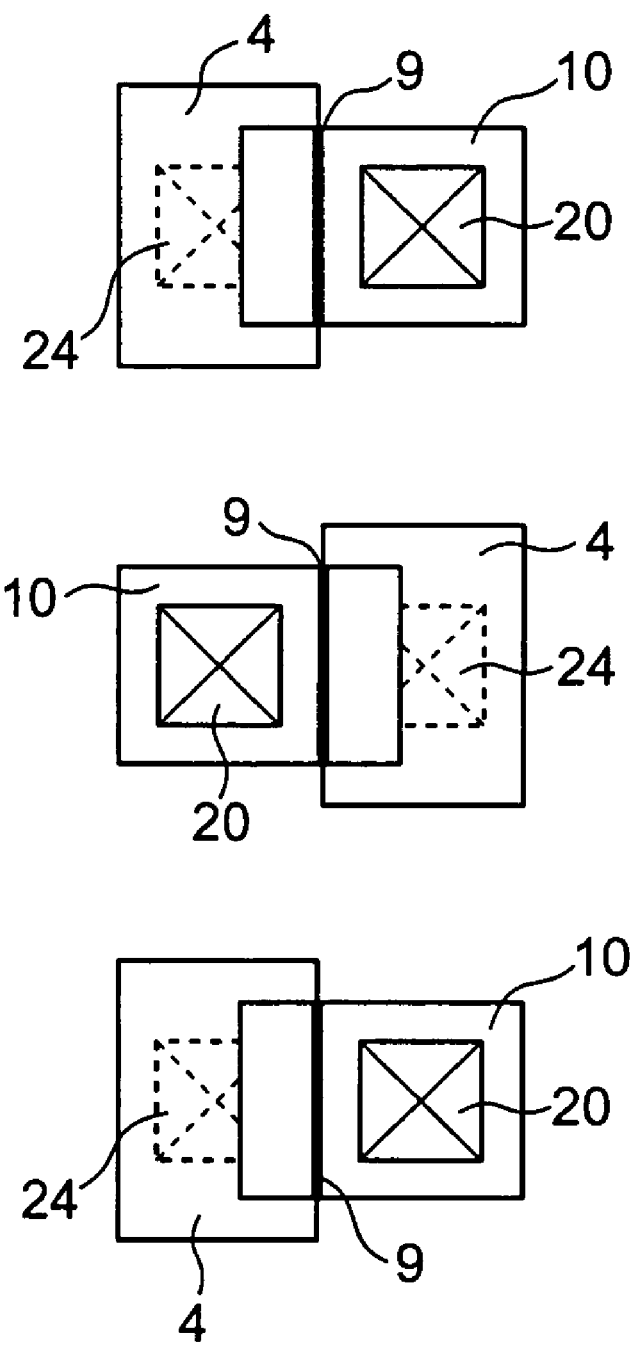
FIG. 8 is an upper view of memory cells arranged in a column direction in the magnetic memory according to the fourth embodiment.

In the embodiment, as shown in FIG. 8, such an arrangement is employed that the base electrode 4 and the counter electrode 10 are positioned in a reversed manner to each other for each row of respective memory cells. With such an arrangement, more memory cells can be integrated on one chip, that is, can be made high-density. In FIG. 8, reference numeral 9 denotes a joined portion of the TMR element 1.

In the embodiment, reading is performed by turning the selecting transistor 30 ON and utilizing the TMR element 1 to make determination about "1" or "0". Writing "1" or "0" is performed by turning the selecting transistor 30 ON and performing spin injection. In a reading/writing operation utilizing the spin injection, a reading current is set to be smaller than a writing current.

According to the embodiment, an element area can be reduced easily and the spin injection writing is made possible.

In the embodiment, the magneto-resistance effect element of the first embodiment is used as the magneto-resistance effect element 1, but each of the magneto-resistance effect elements used in the second and third embodiments can be used.

Fifth Embodiment

Figure 9:
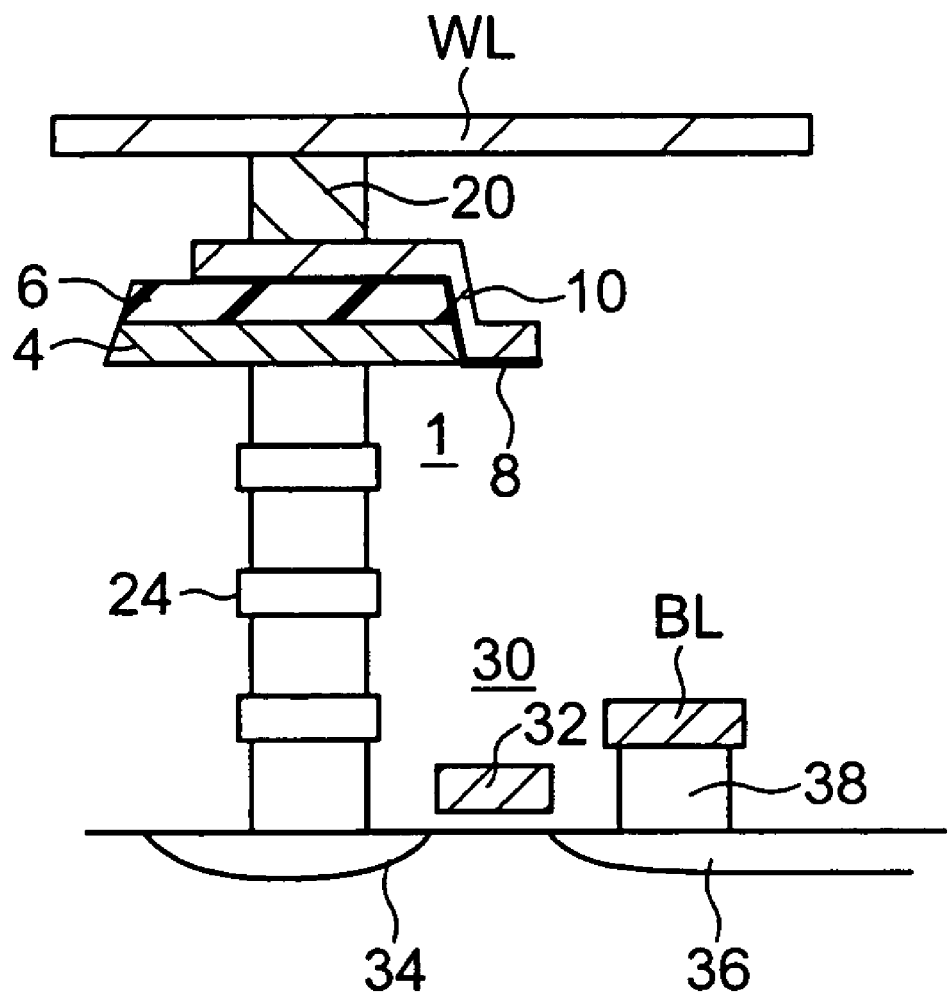
FIG. 9 is a sectional view showing a constitution of a memory cell in a magnetic memory according to a fifth embodiment of the invention.

Next, a magnetic memory according to a fifth embodiment of the invention is shown in FIG. 9 and FIG. 10. A magnetic memory according to the embodiment has a plurality of bit lines BL, a plurality of word lines WL, and a plurality of memory cells arranged in a matrix. FIG. 9 is a view showing the constitution of the memory cell and FIG. 10 is a top view of memory cells arranged in a column direction.

The memory cell in the magnetic memory according to the embodiment is constituted such that the contact 20 is positioned just above the connecting portion 24 in the magnetic memory of the fourth embodiment on a plan view. Therefore, the TMR film 8 is constituted such that a portion thereof which extends on the insulating film 6 formed on the base electrode 4 is larger than that in the fourth embodiment. The contact 20 is formed on a region of the counter electrode 10 formed on the TMR film 8 extending on the insulating film 6 and positioned just above the connecting portion 24.

By positioning the contact 20 connected with the word line WL just above the connecting portion 24 to the selecting transistor 30, as shown in FIG. 10, the memory cell can be reduced in size as compared with the memory cell in the fourth embodiment, and it can be further high-density. In that case, it is unnecessary to arrange the base electrodes 4 and the counter electrodes 10 for each row alternatively, which is different from the fourth embodiment.

In this embodiment, an element area can be reduced easily and the spin injection writing is made possible.

In the fifth embodiment, the magneto-resistance effect element of the first embodiment is used as the magneto-resistance effect element 1, but each of the magneto-resistance effect elements used in the second and third embodiments may be used.

In each of the described-above embodiments, each of the magnetic films in the magneto-resistance effect element (the magnetization pinned layer and the magnetization free layer (magnetic recording layer)) may be constituted of at least one thin film selected from the group consisting of Ni—Fe alloy, Co—Fe alloy, Co—Fe—Ni alloy, amorphous materials such as (Co, Fe, Ni)—(Si, B), (Co, Fe, Ni)—(Si, B)—(P, Al, Mo, Nb, Mn) base material or Co—(Zr, Hf, Nb, Ta, Ti) base material, or Heusler alloys such as $Co_2(Cr_xFe_{1-x})Al$ base alloy, $Co_2MnSi$ base alloy, $Co_2MnAl$ base alloy, or a stacked film of these materials.

When the magneto-resistance effect element is used for the memory cell in the magnetic memory, a sense current control element circuit for controlling a sense current flowing in the magneto-resistance effect element for reading information or data stored in the magneto-resistance effect element, a driver and a sinker are further provided.

It is desirable that the magnetization pinned layer has an unidirectional anisotropy and the magnetic recording layer has an uniaxial anisotropy. It is preferable that a thickness of each layer is in a range of 0.1 nm to 100 nm. Further, the film thickness of the ferromagnetic layer is required to be set to such a thickness that the layer does not become super-paramagnetic property and it is preferably 0.4 nm or more.

It is desirable that magnetization is fixed by adding an anti-magnetic film to the ferromagnetic layer used as the magnetization pinned layer.

The magnetic material constituting these layers can be adjusted not only in magnetic properties but also in various physical properties such as crystal properties, mechanical properties, chemical properties by adding therein such a non-magnetic element as Ag (silver), Cu (copper), Au (gold), Al (aluminum), Mg (magnesium), Si (silicon), Bi (bismuth), Ta (tantalum), B (boron), C (carbon), O (oxygen), N (nitrogen), Pd (palladium), Pt (platinum), Zr (zirconium), Ir (iridium), W (tungsten), Mo (molybdenum), or Nb (niobium), As the magnetic recording layer, such a two-layered structure of a soft magnetic layer/a ferromagnetic layer, or such a three-layered structure of a ferromagnetic layer/a soft magnetic layer/a ferromagnetic layer may be used. Such a preferable effect or result can be obtained using such a three-layered structure of a ferromagnetic layer/a non-magnetic layer/a ferromagnetic layer or such a five-layered structure of a ferromagnetic layer/a non-magnetic layer/a ferromagnetic layer/a non-magnetic layer/a ferromagnetic layer as a magnetic recording layer to control a strength of exchange interaction between ferromagnetic layers, that, even if a cell width of the magnetic recording layer which is the memory cell reaches a sub-micron meter size or less, it is unnecessary to increase a spin injection writing current. It is preferable in the spin injection writing that the strength of an interaction, especially, the interlayer interaction, is 2000 Oe or less. It is further preferable that a sign of the exchange interaction is positive (ferromagnetic). It is made possible to reduce a current by selecting the strength or the sign of the interlayer interaction. At that time, the kind or the film thickness of the ferromagnetic layer(s) may be changed.

It is further preferable that a writing current can be reduced while keeping a resistance change ratio high by using Co—Fe, Co—Fe—Ni, Fe-rich Ni—Fe which reaches a large resistance change ratio owing to a magneto-resistance effect in the ferromagnetic layer near the tunnel barrier and using N-rich Ni—Fe, Ni rich Ni—Fe—Co, or the like in the ferromagnetic layer which does not come in contact with the tunnel barrier. The non-magnetic material to be used includes Ag (silver), Cu (copper), Au (gold), Al (aluminum), Ru (ruthenium), Rh (rhodium), Os (osmium), Re (rhenium), Si (silicon), Bi (bismuth), Ta (tantalum), B (boron), C (carbon), Pd (palladium), Pt (platinum), Zr (zirconium), Ir (iridium), W (tungsten), Mo (molybdenum), Nb (niobium) or alloys thereof.

The magnetic recording layer can be adjusted not only in magnetic properties but also in various physical properties such as crystal properties, mechanical properties, chemical properties by adding, in magnetic material, such a non-magnetic element as Ag (silver), Cu (copper), Au (gold), Al (aluminum), Ru (ruthenium), Os (osmium), Re (rhenium), Ta (tantalum), B (boron), C (carbon), O (oxygen), N (nitrogen), Pd (palladium), Pt (platinum), Zr (zirconium), Ir (iridium), W (tungsten), Mo (molybdenum), or Nb (niobium), On the other hand, when the tunneling junction is used for the magneto-resistance effect element, as an insulating layer provided between the magnetization pinned layer and the magnetic recording layer to be used can include various insulating materials such as $Al_2O_3$ (aluminum oxide), $SiO_2$ (silicon oxide), MgO (magnesium oxide), AlN (aluminum nitride), $Bi_2O_3$ (bismuth oxide), $MgF_2$ (magnesium fluoride), $CaF_2$ (calcium fluoride), $SrTiO_3$ (strontium titanate), $LaAlO_3$ (lanthanum aluminate), Al—N—O (aluminium-nitrogen-oxide), and HfO (hafnium oxide).

These compounds are not required to have an accurate composition completely in view of stoichiometry, where shortage, excess or deficiency of oxygen, nitrogen, fluorine, or the like may be present. It is desirable that the thickness of the insulating layer is thin to such an extent that a tunnel current flows therein. In fact, the thickness is preferably 10 nm or less, more preferably 2 nm or less.

Such a magneto-resistance effect element can be formed on a predetermined substrate using an ordinary thin film forming process such as various sputtering processes, vapor deposition processes, molecular beam epitaxy. In this case, as the substrates which can be used, there are various substrates made of such material as Si (silicon), $SiO_2$ (silicon oxide), $Al_2O_3$ (aluminum oxide), or spinel, AlN (aluminum nitrogen).

As a background layer, a protective layer, a hard mask or the like, a layer made from Ta (tantalum), Ti (titanium), Pt (platinum), Pd (palladium), Au (gold), Ti/Pt (titanium/platinum), Ta/Pt (tantalum/platinum), Ti/Pd (titanium/palladium), Ta/Pd (tantalum/palladium), Cu (copper), Al—Cu (aluminum—copper), Ru (ruthenium), Ir (iridium), Os (osmium), Rh (rhodium) may be provided.

When a magneto-resistance effect element where a first magnetization pinned layer (an anti-ferromagnetic layer/a ferromagnetic layer or the like)/a tunnel barrier layer/a magnetic recording layer/a non-magnetic metal layer/a second magnetization pinned layer (a ferromagnetic layer/a non-magnetic metal layer/a ferromagnetic layer or the like)/a anti-ferromagnetic layer are stacked in this order from the base electrode side, and a direction of magnetization of the ferromagnetic recording layer of the second magnetization pinned layer nearer to the magnetic recording layer is reversed to a direction of magnetization of the ferromagnetic layer of the first magnetization pinned layer by an angle of about 180° is used, the writing current can be further reduced. In the magneto-resistance effect element, since a resistance among the first magnetization pinned layer/the tunnel barrier layer/the magnetic recording layer is considerably larger than a resistance value among the magnetic recording layer/the non-magnetic metal layer/the second magnetization pinned layer, change in resistance value is determined depending on a relative direction of spin among the first magnetization pinned layer/the tunnel barrier layer/the magnetic recording layer.

Figure 11:
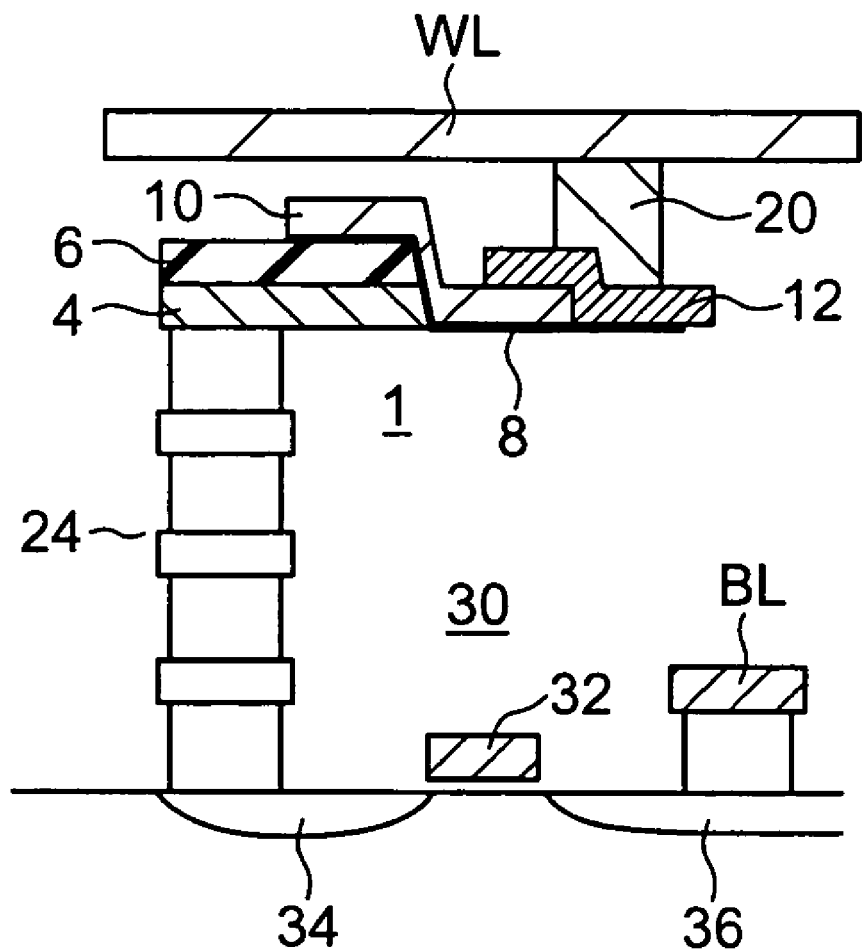
FIG. 11 is a sectional view showing a constitution of a memory cell in a magnetic memory according to a modification of the fourth embodiment of the invention.

In the respective embodiments described above, it is preferable that a direction of easy axis of magnetization of the magneto-resistance effect element, namely, an direction of magnetization, is perpendicular to a drawing sheet, for example, in FIG. 1 on a joined plane. When the direction of axis of easy magnetization is set to be perpendicular to the drawing plane, a stray field from an end of the magnetic layer becomes small. In that case, by making a length of the TMR film 8 in a direction perpendicular to the drawing sheet in FIG. 1 longer than a length thereof in a direction parallel to drawing plane and imparting shape anisotropy on the magnetic layer in the TMR film 8, the easy axis of magnetization of the magneto-resistance effect element becomes perpendicular to the drawing plane in FIG. 1. When a magneto-resistance effect element with such a constitution is used in a memory cell in the magnetic memory according to the fourth embodiment shown in FIG. 7, there is a possibility that a connecting region between the contact 20 and the counter electrode 10 is not secured. In that case, as shown in FIGS. 11 and 12, the contact 20 can be connected to the counter electrode 10 via the second counter electrode 12 electrically connected to the counter electrode 10 without directly connecting the contact 20 to the counter electrode 10. FIG. 11 is a sectional view showing a constitution of a magnetic memory according to a modification of the fourth embodiment, and FIG. 12 is a top view showing memory cells arranged in a column direction of the magnetic memory according to the modification of the fourth embodiment. In the modification, it is made possible to reduce a size of the TMR film 8 in the direction of hard axis of magnetization perpendicular to a direction of easy axis of magnetization as compared with that in the fourth embodiment, and the direction of magnetization of the magnetic film in the TMR film 8 can be directed to the direction of easy axis of magnetization easily. When the connecting region between the contact 20 and the counter electrode 10 is secured, it is unnecessary to form the second counter electrode 12 shown in FIGS. 11 and 12.

In FIG. 1, the direction of magnetization of the magnetic recording layer 8c may correspond to a direction along the inclination face. In that case, however, a height of the inclination face is considerably smaller than the width w of the magneto-resistance effect film 8, the direction of magnetization of the magnetic recording layer 8c is perpendicular to the direction of shape anisotropy, which is not desirable.

Sixth Embodiment

Figure 13:
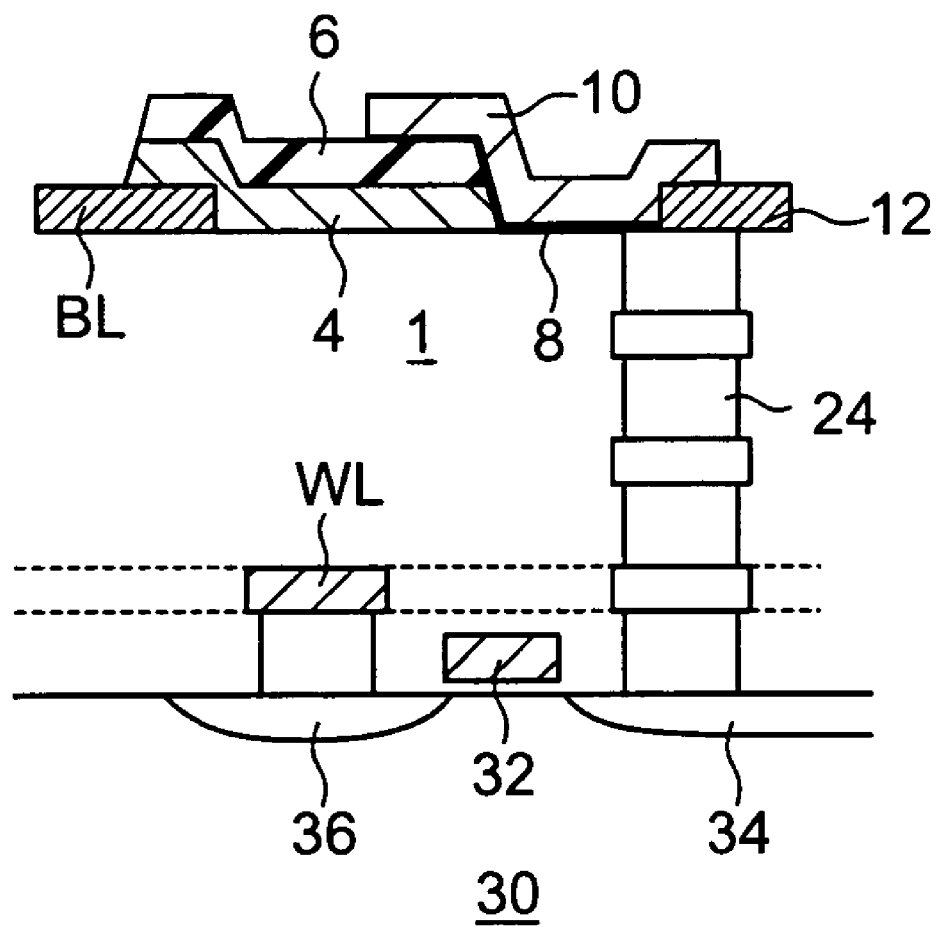
FIG. 13 is a sectional view showing a constitution of a memory cell in a magnetic memory according to a sixth embodiment of the invention.
Figure 14:
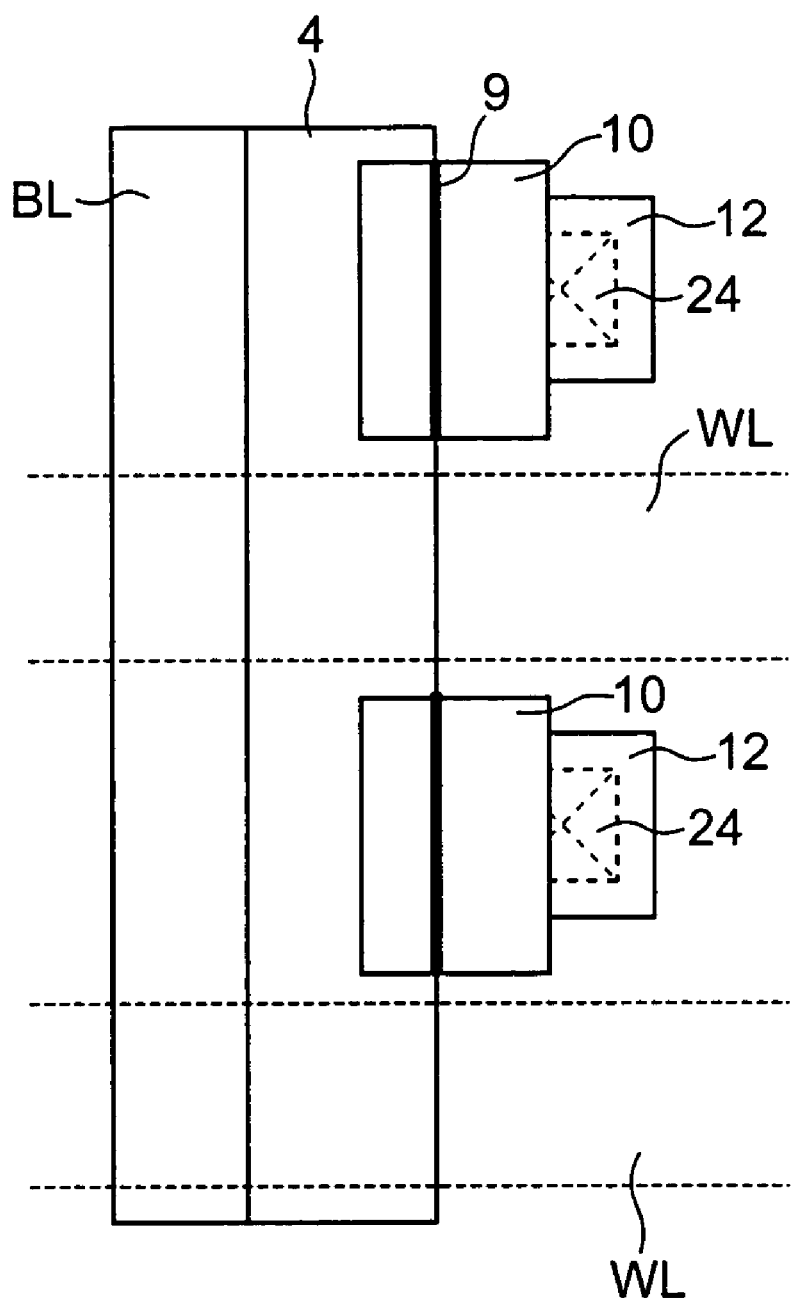
FIG. 14 is an upper view of memory cells arranged in a column direction in the magnetic memory according to the sixth embodiment.

Next, a magnetic memory according to a sixth embodiment of the invention will be explained with reference to FIGS. 13 and 14. FIG. 13 is a sectional view showing a memory cell in the magnetic memory according to the embodiment, and FIG. 14 is a top view showing memory cells arranged in a column direction of the magnetic memory according to the embodiment.

The magnetic memory according to the embodiment has a plurality of bit lines BL, a plurality of word lines WL, and a plurality of memory cells arranged in a matrix. Each memory cell is provided with the magneto-resistance effect element 1 according to any one of the first to third embodiments, and a selecting transistor 30. In the embodiment, formation is made such that the base electrode 4 is electrically connected to the bit line BL in parallel therewith, that is, the base electrode 4 is formed to be integrated with the bit line BL. Therefore, such a constitution can be obtained that the counter electrode 10 is connected to the source 34 of a selecting transistor 30 via a second counter electrode 12 and a connecting portion 24, and the drain of the selecting transistor 30 is connected to the word line WL.

In the magnetic memory according to the embodiment, since the base electrode 4 is integrated with the bit line BL, a stray field can be made further small.

In the embodiment, the base electrode 4 is electrically connected to the bit line BL in parallel therewith, but if a resistance of the base electrode 4 is approximately the same as that of the bit line BL, such a constitution may be employed that the base electrode 4 also serves as the bit line BL without providing the bit line BL. In the embodiment, though the second counter electrode 12 is provided, if the counter electrode 10 can be directly connected to the connecting portion 24, it is unnecessary to provide the second counter electrode 12.

In the embodiment, an element area can be reduced easily and spin injection writing can be performed.

Seventh Embodiment

Figure 15:
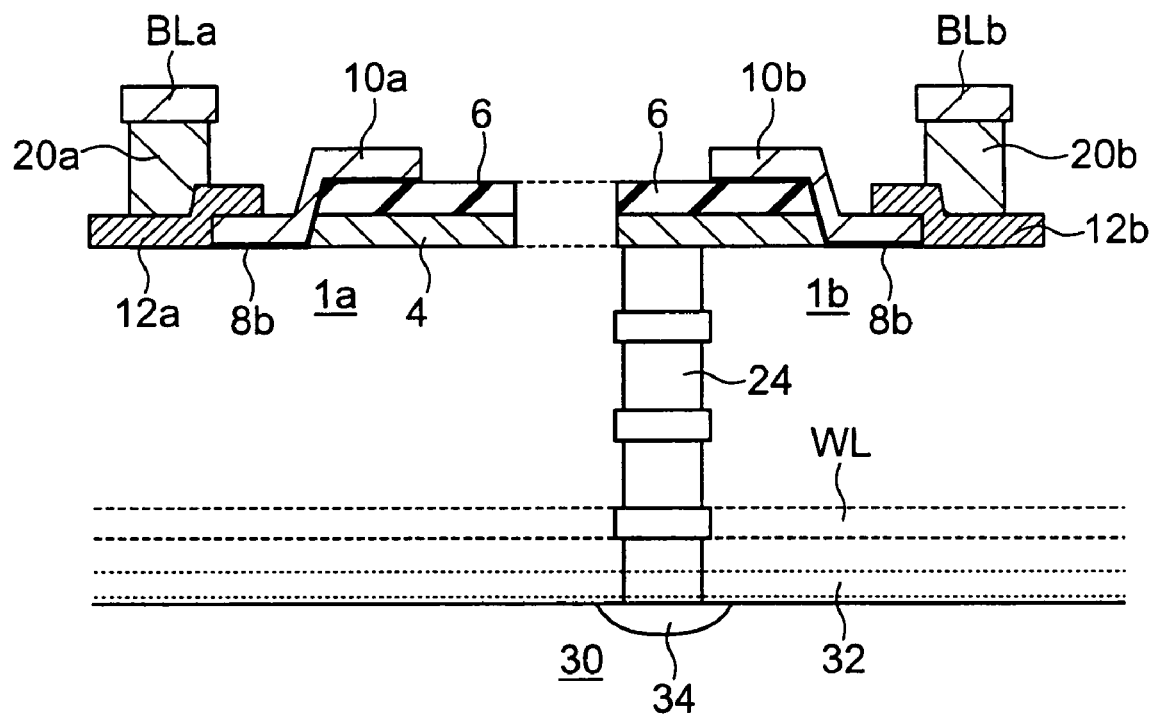
FIG. 15 is a sectional view showing a constitution of a memory cell in a magnetic memory according to a seventh embodiment of the invention.
Figure 16:
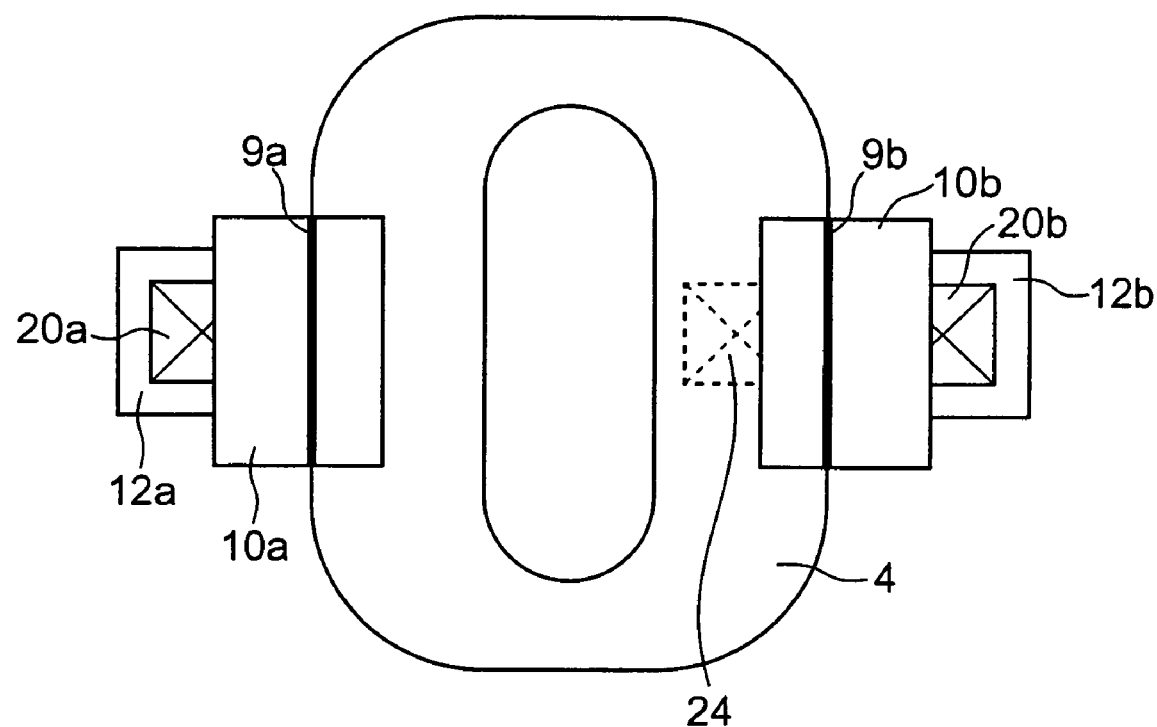
FIG. 16 is an upper view of memory cells arranged in a column direction in the magnetic memory according to the seventh embodiment.

Next, a magnetic memory according to a seventh embodiment of the invention will be explained with reference to FIGS. 15 and 16. FIG. 15 is a sectional view showing a constitution of a memory cell in the magnetic memory according to the embodiment, and FIG. 16 is a top view showing memory cells arranged in a column direction of the magnetic memory according to the embodiment.

The magnetic memory according to the embodiment has a plurality of bit lines BL, a plurality of word lines WL, and a plurality of memory cells arranged in a matrix. Each memory cell is provided with a magneto-resistance effect element. In the embodiment, such a constitution is employed that two adjacent memory cells constitute one pair and magneto-resistance effect elements 1a and 1b of respective memory cells share one base electrode 4. Therefore, the shared base electrode 4 is formed in an annular shape. The magneto-resistance effect element 1i (i=a, b) is provided with a TMR film 8i (i=a, b), a counter electrode 10i (i=a, b), and a second counter electrode 12i (i=a, b). The second counter electrode 12i (i=a, b) is connected to a bit line BLi (i=a, b) via a contact electrode 20i (i=a, b). The shared base electrode 4 is connected to the source 34 of a shared selecting transistor 30 via a connecting portion 24. A drain (not shown) of the selecting transistor 30 is connected to the word line WL.

In the embodiment, since the base electrode 4 is formed in an annular shape, magnetic field constitutes a closed domain, so that the stray field can be reduced. In the embodiment, since the second counter electrodes 12a and 12b are provided, but if the contact electrode 20i (i=a, b) can be directly connected to the counter electrode 10i, it is unnecessary to provide the second counter electrode 12i.

In the embodiment, an element area can be reduced easily and spin injection writing can be performed.

Eighth Embodiment

Figure 18:
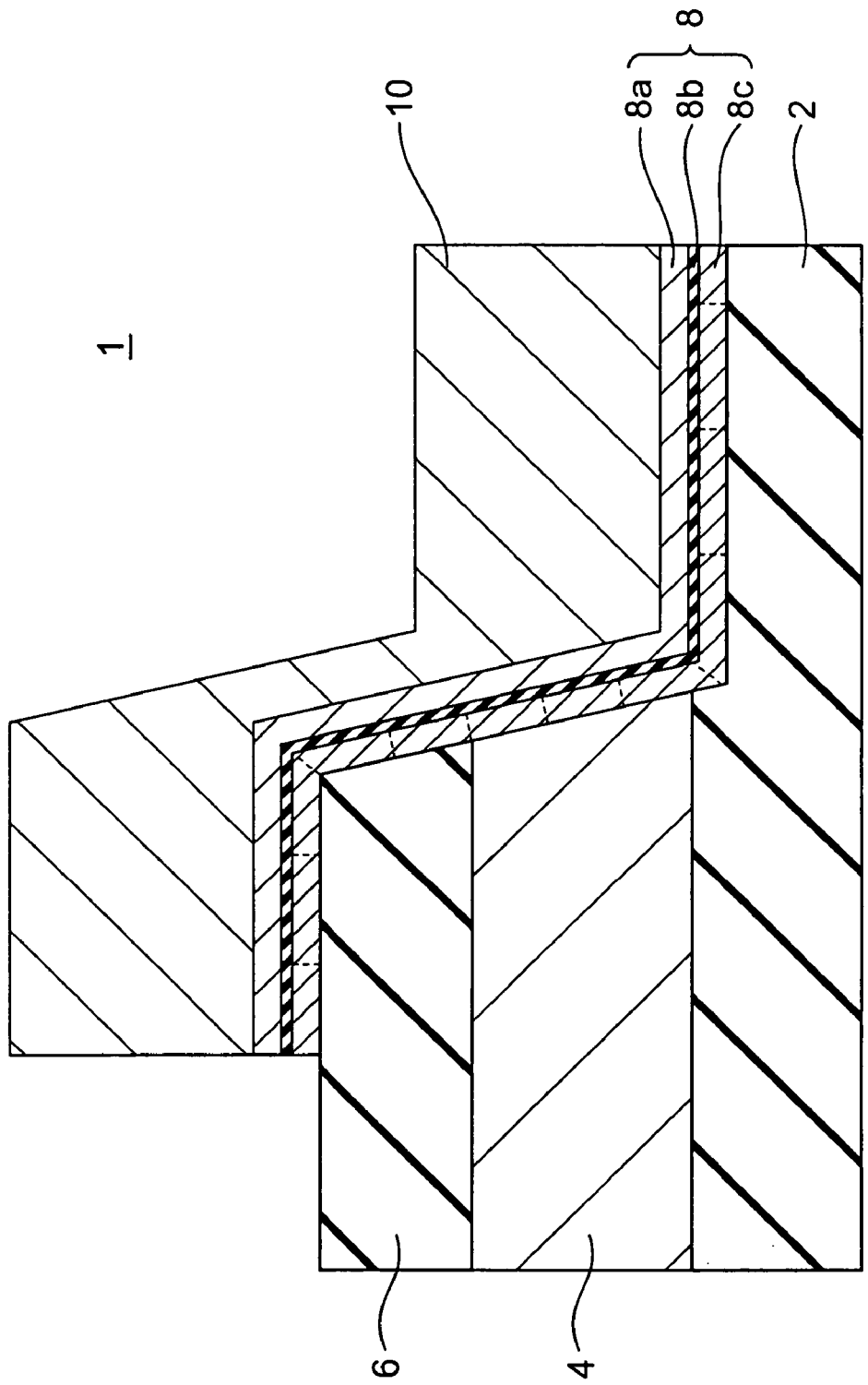
FIG. 18 is a sectional view showing a constitution of a magneto-resistance effect element according to an eighth embodiment of the present invention.

Next, a magneto-resistance effect element according to an eighth embodiment of the invention is shown in FIG. 18. A magneto-resistance effect element 1 in the embodiment has such a constitution that layer arrangement in the TMR film 8 is reversed regarding that in the magneto-resistance effect element in the first embodiment shown in FIG. 1, namely, the ferromagnetic layer coming in contact with the base electrode layer 8c is arranged as the magnetic recording layer 4, and grain boundaries (shown with a broken line in FIG. 18) are formed in the magnetic recording layer 8c by adding non-magnetic elements (for example, Cr or Pt) into the magnetic recording layer 8c. The magnetic recording layer 8c may be made from ferromagnetic material including non-magnetic element, for example, CoCrPt, CoFeCrPt or the like.

In the embodiment, since the grain boundaries are formed in the magnetic recording layer 8c, small magnetic domains are formed in the magnetic recording layer 8c, so that a volume of a spin-reversed region becomes small. Thereby, the spin reversing is made easy, so that a current density of the spin reversion can be reduced.

In the embodiment, a device area can be reduced and fluctuation of an area can be reduced like the first embodiment.

Therefore, the magneto-resistance effect element in the embodiment allows spin injection writing with a low current and it is suitable for a mass storage memory.

In the embodiment, since one side of an element size is controlled with a film thickness, fluctuation of a writing current can be suppressed within 5% or less in the wafer.

(Ninth Embodiment)

Figure 19:
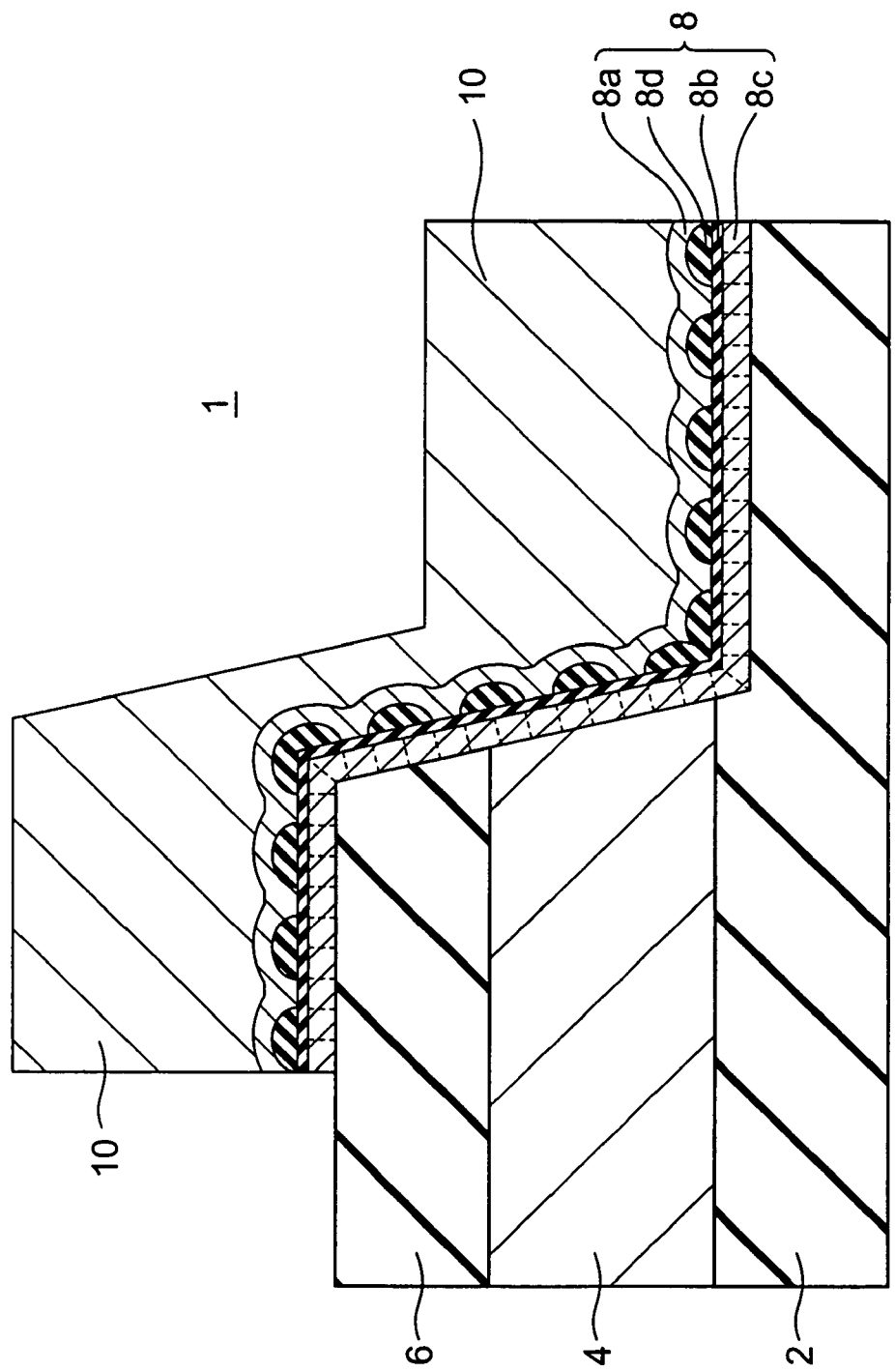
FIG. 19 is a sectional view showing a constitution of a magneto-resistance effect element according to a ninth embodiment of the present invention.

Next, a magneto-resistance effect element according to a ninth embodiment of the invention is shown in FIG. 19. A magneto-resistance effect element 1 according to the embodiment has such a constitution that a plurality of insulators 8d are provided so as to be separated from one another between the tunnel barrier layer 8b and the magnetization pinned layer 8a in the magneto-resistance effect element according to the eighth embodiment shown in FIG. 18. That is, in the embodiment, the TMR film 8 is constituted of the magnetic recording layer 8c, the tunnel barrier layer 8b, the plurality of insulators 8d, and the magnetization pinned layer 8a.

Since the plurality of insulators 8d are separately provided between the tunnel barrier layer 8b and the magnetization pinned layer 8a, a film thickness of the tunnel barrier between magnetic recording layer 8c and the magnetization pinned layer 8a is a film thickness of the tunnel barrier layer 8b in a region where the insulators 8d are not provided, while it is a film thickness coincident with the sum of the film thickness of the tunnel barrier layer 8b and the film thickness of the insulator 8d.

On the other hand, a tunnel current density lowers in an exponential function manner to the film thickness of the tunnel barrier. Therefore, a density of the tunnel current flowing through the region where the insulators 8d are provided lowers to such an extent that it can be ignored as compared with a density of the tunnel current flowing through the region where the insulators 8d are not provided. That is, the region where the insulators 8d are formed develops a high resistance, so that an area through which the tunnel current flows can be reduced effectively to an area of an element shape.

Therefore, even if a spin-polarized current is caused to flow at a writing time, an annular magnetic field is not generated by the writing current, so that magnetization of the magnetic recording layer is stabilized to be reversed, and a writing operation can be performed securely.

Incidentally, formation of the insulators 8d may be formed without covering the whole surface of the tunnel barrier layer 8b, that is, by a process which does not planarize the insulator 8d to be formed, when an average film thickness of the insulators 8d is 5 nm or less, insulators which do not cover the entire surface of the tunnel barrier layer 8b can be formed. At that time, a size of the insulator depends on the average film thickness of the insulators to be formed.

In the embodiment, when the magnetic recording layer 8c was formed of CoCrPt with a film thickness of 3 nm, a magneto-resistance effect element with a small area of 0.08× 0.3 µm$^2$ could be formed, so that a spin reversion due to current injection could be realized. At that time, a resistance change ratio of 21% could be obtained. A current density was calculated from an effective area through which a current flowed instead of an apparent current density based upon an area of an element shape. A current density of spin reversion was $7.3×10^6$ A/cm$^2$, when the direction of magnetization of the magnetic recording layer was reversed from anti-parallel direction to the magnetization pinned layer to a parallel direction thereto. On the contrary, the current density is $1.1×10^7$ A/cm$^2$, when the direction was reversed from the parallel direction to the anti-parallel direction.

In the embodiment, when the magnetic recording layer 8c was formed of CoFeCrPt with a film thickness of 3 nm, a magneto-resistance effect element with a small area of 0.08× 0.3 µm$^2$ can be formed, so that a spin reversion due to current injection could be realized. At that time, a resistance change ratio of 21% could be obtained. An effective current density of spin reversion was $7.1×10^6$ A/cm$^2$, when the direction of magnetization of the magnetic recording layer was reversed from anti-parallel direction to the magnetization pinned layer to a parallel direction thereto. On the contrary, the current density is $1.0×10^7$ A/cm$^2$, when the direction was reversed from the parallel direction to the anti-parallel direction.

In the embodiment, a current density of spin reversion can be reduced like the eighth embodiment. An element area can be reduced and fluctuation of an area can be reduced. Further, an effective area through which a current flows can be reduced.

Therefore, the magneto-resistance effect element in the embodiment allows spin injection writing with a low current and it is suitable for a mass storage memory.

In the embodiment, since one side of an element size is controlled with a film thickness, fluctuation of a writing current can be suppressed within 5% or less in the wafer.

In the embodiment, such a constitution may be employed that the tunnel barrier layer 8b and the insulators 8d are arranged in a reversing manner, namely, the plurality of insulators 8d separated from one another are provided on the magnetic recording layer 8c, the tunnel barrier layer 8b is provided so as to cover these insulators, and the magnetic fixing layer 8a may be provided so as to cover the tunnel barrier layer.

Tenth Embodiment

Figure 20:
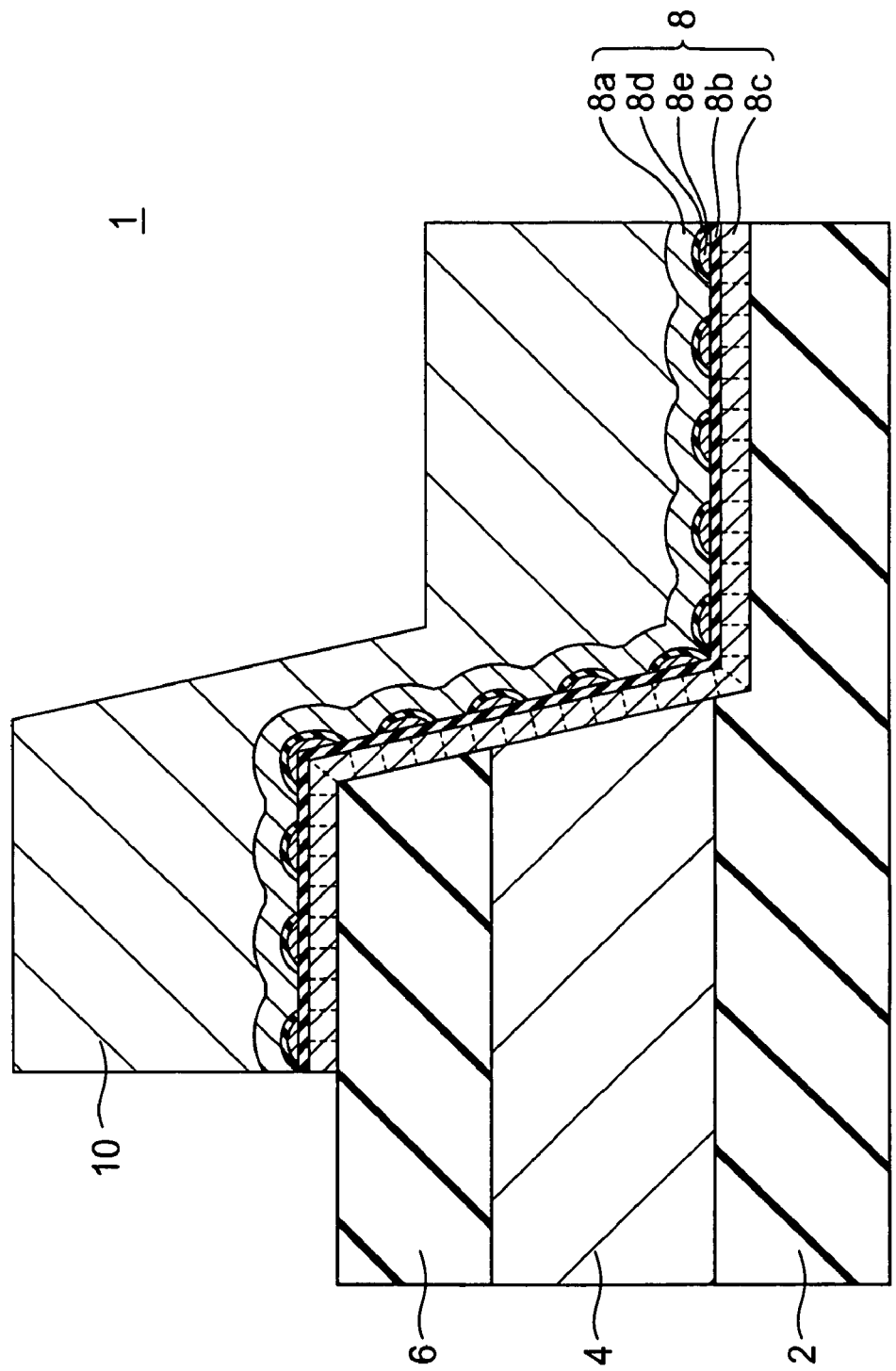
FIG. 20 is a sectional view showing a constitution of a magneto-resistance effect element according to a tenth embodiment of the present invention.

Next, a magneto-resistance effect element according to a tenth embodiment of the invention is shown in FIG. 20. A magneto-resistance effect element 1 according to the embodiment has such a constitution that non-magnetic materials 8e are provided between the tunnel barrier layer 8b and the insulators 8d in the magneto-resistance effect element according to the ninth embodiment shown in FIG. 19. The insulator 8d may be formed by oxidizing surfaces of the non-magnetic materials 8e.

It is preferable that the non-magnetic material 8e includes at least one element selected from a group consisting of Mg, Al, Ga, In, Hf, Ta, semiconductor, and earth rare metal, or it is compound or alloy of these elements.

In the embodiment, a density of the tunnel current flowing through a region of the tunnel barrier layer 8b where the insulators 8d are provided lowers to such an extent that it can be ignored as compared with a density of the tunnel current flowing through a region of the tunnel barrier layer 8b where the insulators 8d are not provided. Therefore, the region where the insulators 8d have been deposited develops a high resistance, so that an area through which the tunnel current flows can be reduced effectively to an area of an element shape.

As explained above, according to the embodiment, since the area through which a tunnel current flows can be reduced effectively to an area of an element shape, even if a spin-polarized current is caused to flow at a writing time, an annular magnetic field is not generated by the writing current, so that magnetization of the magnetic recording layer is stabilized to be reversed, and a writing operation can be performed securely.

In the embodiment, a current density of spin reversion can be reduced like the eighth embodiment. A device area can be reduced and fluctuation of an area can be reduced. Further, an effective area through which a current flows can be reduced.

Therefore, the magneto-resistance effect element in the embodiment allows spin injection writing with a low current and it is suitable for a mass storage memory.

In the embodiment, since one side of an element size is controlled with a film thickness, fluctuation of a writing current can be suppressed within 5% or less in the wafer.

In the magneto-resistance effect elements according to the eighth to tenth embodiments, though a layer coming in contact with an end face of the base electrode 4 is the magnetic recording layer 8c, such a constitution may be employed that the magnetic recording layer 8c and the magnetization pinned layer 8a are arranged in a reversing manner and the magnetization pinned layer 8a is provided so as to come in contact with the end face of the base electrode 4.

In the magneto-resistance effect elements according to the eighth to tenth embodiments, such a constitution may be employed that the magnetization pinned layer is a stacked layers film where a ferromagnetic layer and an anti-ferromagnetic layer are alternatively stacked.

Figure 35:
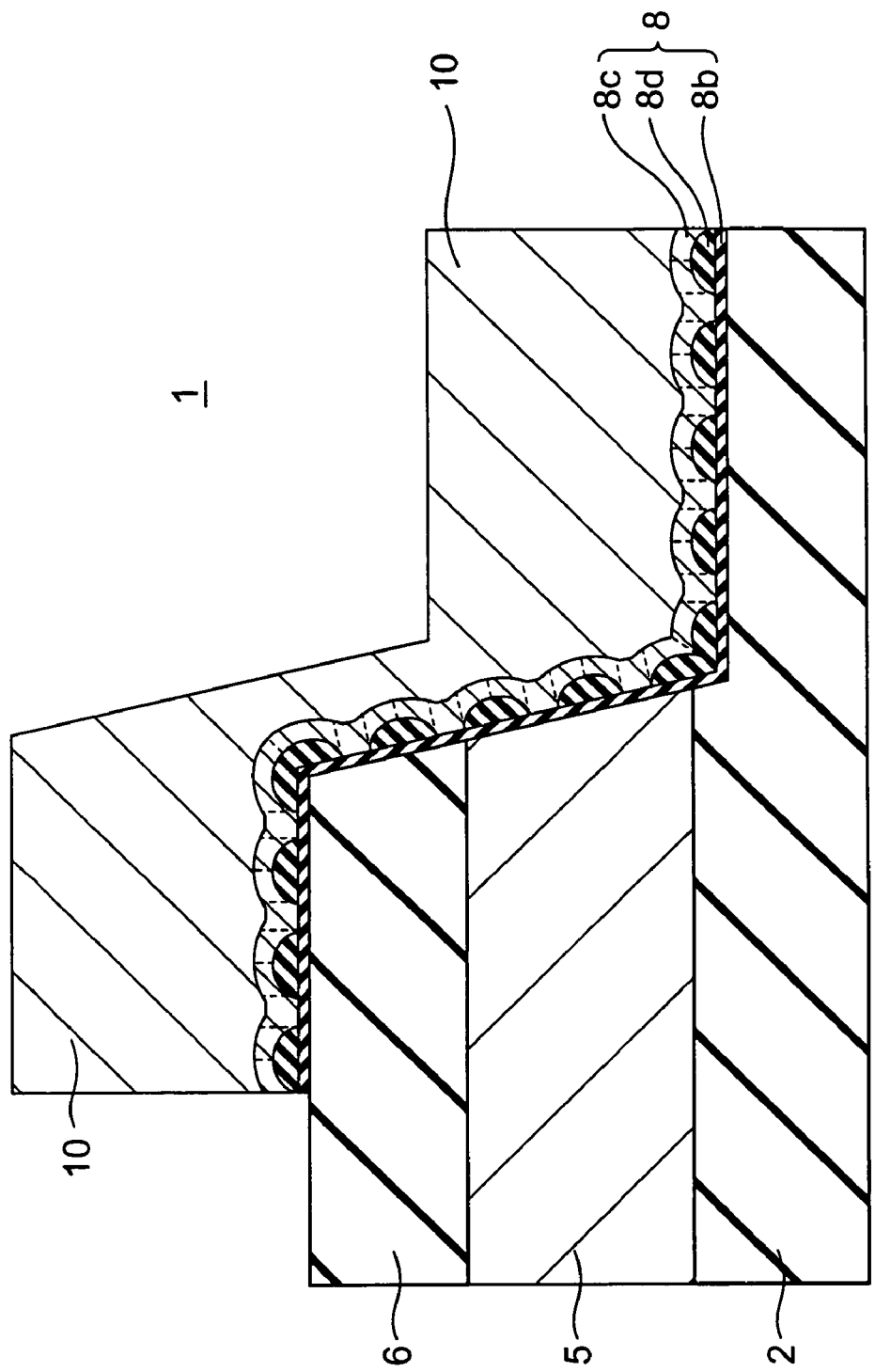
FIG. 35 is a sectional view showing a constitution of a magneto-resistance effect element according to a modification of the ninth embodiment of the present invention.

In the magneto-resistance effect elements according to the ninth or tenth embodiment, the base electrode 4 may also have a function serving as the magnetization pinned layer. In that case, for example, as shown in FIG. 35, it becomes unnecessary to provide the magnetization pinned layer 8a according to the ninth embodiment, and a member coming in contact with the end face of the base electrode 5 which also serves as the magnetization pinned layer is the tunnel barrier layer 8b.

Such a constitution may be employed that the tunnel barrier layer 8b and the insulators 8d are arranged in a reversing manner, that is, the plurality of insulators 8d separated from one another is provided before the tunnel barrier layer $8b$ is provided, the tunnel barrier layer $8b$ is provided so as to cover the insulators $8d$, and the magnetic recording layer $8c$ may be provided so as to cover the tunnel barrier layer $8b$.

In the ninth or tenth embodiment, the magnetic recording layer $8c$ is constituted of the small magnetic domains by adding non-magnetic element, but it may be constituted of a ferromagnetic material which is not added with non-magnetic element.

Eleventh Embodiment

Figure 21:
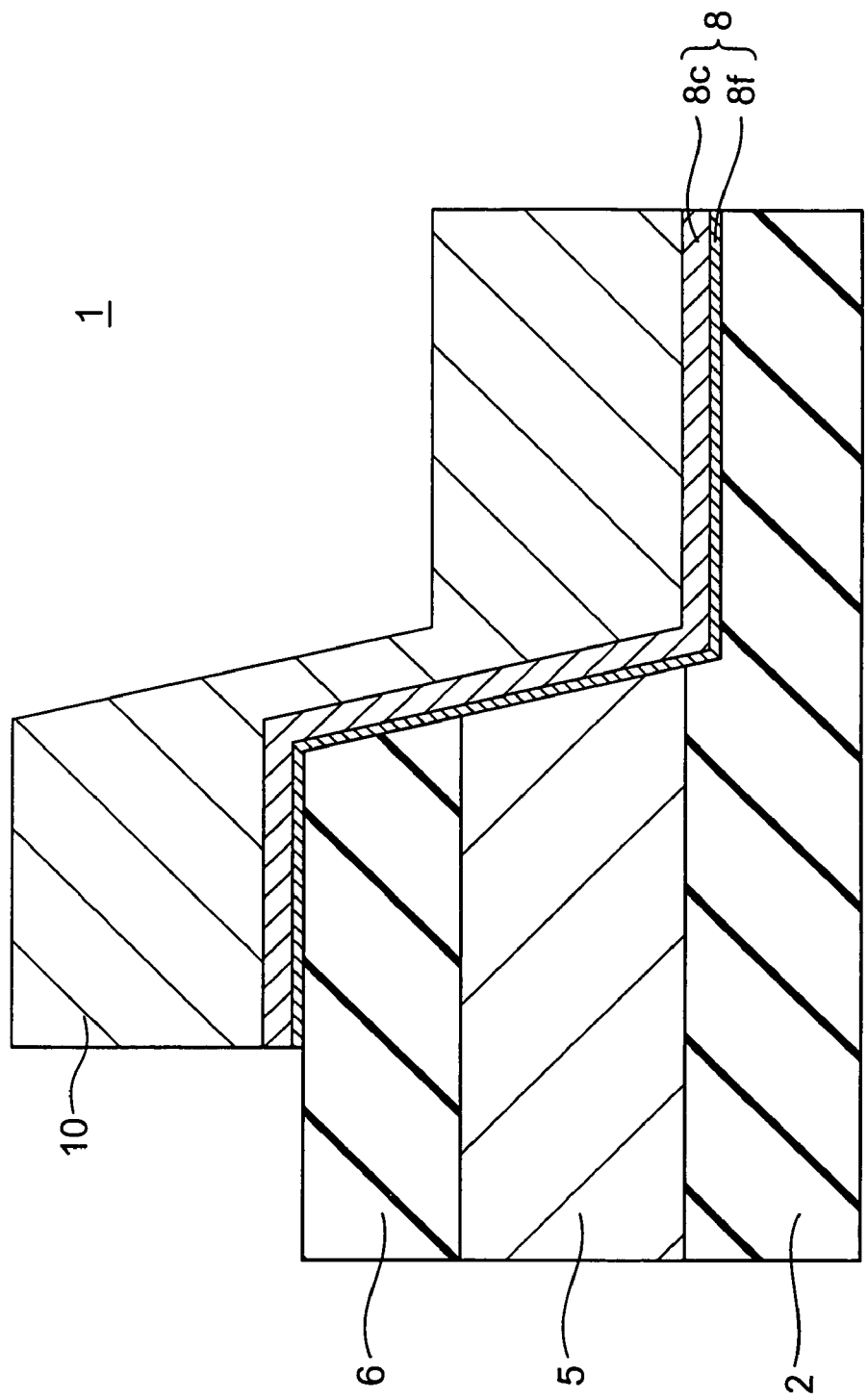
FIG. 21 is a sectional view showing a constitution of a magneto-resistance effect element according to an eleventh embodiment of the present invention.

Next, a magneto-resistance effect element according to an eleventh embodiment of the invention is shown in FIG. 21. A magneto-resistance effect element 1 of the embodiment has a constitution that the tunnel barrier layer $8b$ is replaced with a non-magnetic layer $8f$ made from, for example, Cu, and the magnetic recording layer $8c$ is formed from a ferromagnetic material added with non-magnetic element (for example, Cr, Pt) in the magneto-resistance effect element of the second embodiment shown in FIG. 5. Therefore, grain boundaries are formed in the magnetic recording layer $8c$ and small magnetic domains are formed in the magnetic recording layer $8c$, so that a volume of a region where spin reversion is generated becomes small. Thereby, the spin reversion is made easy, so that a current density of spin reversion can be lowered.

In the embodiment, when a non-magnetic layer $8f$ was formed of Cu with a film thickness of 4 nm and a magnetic recording layer $8c$ was formed of CoFeCrPt with a film thickness of 3 nm, a magneto-resistance effect element with a small area of $13 \times 160$ nm$^2$ could be formed so that spin reversion could be realized by current injection. At that time, a resistance change ratio of 8.7% could be obtained. A current density of spin reversion was $1.2 \times 10^7$ A/cm$^2$, when the direction of magnetization of the magnetic recording layer was reversed from anti-parallel direction to the magnetization pinned layer to a parallel direction thereto. On the contrary, the current density is $2.0 \times 10^7$ A/cm$^2$, when the direction was reversed from the parallel direction to the anti-parallel direction.

In the embodiment, since the non-magnetic layer was used instead of the tunnel barrier layer, it was confirmed that the magneto-resistance effect element was destroyed even with a high current density of $1 \times 10^8$ A/cm$^2$.

In the embodiment, since a resistance of Cu is small, excess current path flowing parallel to the non-magnetic layer $8f$ made from Cu is present. However, since a film thickness of the non-magnetic layer $8f$ made from Cu is thin such as 4 nm, influence of the excess current path is small.

In the embodiment, an element area can be reduced and fluctuation of an area can be reduced.

Needless to say, each of the magneto-resistance effect elements 1 according to the eighth to eleventh embodiments can be used as a magneto-resistance effect element for a magnetic memory.

Twelfth Embodiment

Figure 22:
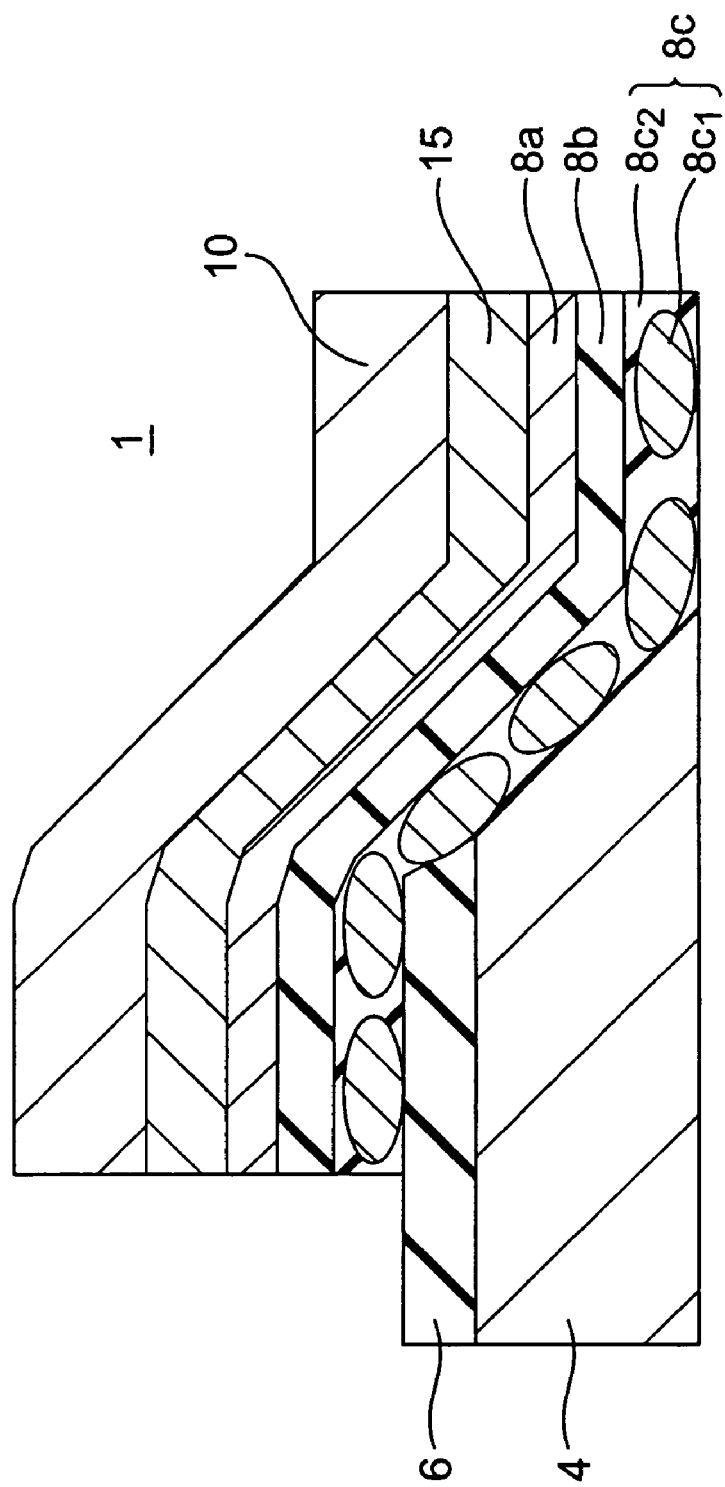
FIG. 22 is a sectional view showing a constitution of a magneto-resistance effect element according to a twelfth embodiment of the present invention.

Next, a magneto-resistance effect element according to an twelfth embodiment of the invention is shown in FIG. 22. A magneto-resistance effect element 1 of the embodiment has a constitution that the magnetization pinned layer $8a$ and the magnetic recording layer $8c$ are arranged in a reversing manner, the magnetic recording layer $8c$ is constituted of a plurality of ferromagnetic particles $8c_1$ spaced from one another by dielectric $8c_2$, and an anti-ferromagnetic layer 15 is further provided between the magnetization pinned layer $8a$ and the counter electrode 10 in the magneto-resistance effect element of the first embodiment shown in FIG. 1. The anti-ferromagnetic layer 15 pins magnetization of the magnetization pinned layer $8a$ by exchange coupling with the magnetization pinned layer $8a$.

In the magneto-resistance effect element 1 of the embodiment thus constituted, since an effective junction area of ferromagnetic tunnel junction is defined by a projection area of the plurality of ferromagnetic particles $8c_1$ spaced by the dielectric $8c_2$ to the magnetization pinned layer $8a$ in a direction perpendicular to a film face, the effective junction area is smaller than that of a continuous film of the magnetic recording layer $8c$ made from ferromagnetic material. Therefore, even if spin-polarized current is caused to flow at a writing time, annular magnetic field due to the writing current is very small, so that magnetization of the magnetic recording layer $8c$ is also reversed stably in the magnetic recording layer $8c$, and a writing operation can be performed securely.

In the embodiment, as the ferromagnetic particles $8c_1$ spaced by the dielectric $8c_2$, it is preferable that material which has a high magnetic anisotropy energy density Ku (a large coercive force) even at the room temperature and has a resistance to thermal fluctuation, such as Co—Pt base, Co—Fe—Pt base, or Fe—Pt base material is used. By using such material, a problem about thermal stability of the magnetic recording layer to thermal fluctuation is solved.

When the ferromagnetic particle $8c_1$ is made from Co-rich ferromagnetic material, alloy thereof, or compound thereof, it is preferable that material for the base electrode 4 includes at least one element selected from a group consisting of Cr, Ru, Ir, Os, and Re, or it is alloy thereof.

When the ferromagnetic particle $8c_1$ is made from Fe-rich ferromagnetic material, alloy thereof, or compound thereof, it is preferable that material for the base electrode 4 includes at least one element selected from a group consisting of Cr, Ru, Os, Re, Rh, W, Mn, V, Ti and Mo, or it is alloy thereof.

When the ferromagnetic particle $8c_1$ is made from Ni-rich ferromagnetic material, alloy thereof, or compound thereof, it is preferable that material for the base electrode 4 includes at least one element selected from a group consisting of Cr, Ru, Os, Re, Rh, Ir, W, Nb, V, Ta, and Mo, or it is alloy thereof.

In the embodiment, since the magnetic recording layer $8c$ is formed of the plurality of ferromagnetic particles $8c_1$ spaced from one another by the dielectric $8c_2$, a writing current can be further reduced as compared with the first embodiment. In the embodiment, a device area can be reduced and fluctuation of an area can be reduced like the first embodiment.

In the embodiment, since the magnetic recording layer provided with the plurality of ferromagnetic particles spaced by the dielectric with the large coercive force is used, thermal stability of the recording magnetic layer to thermal fluctuation is excellent, and since an area of the magnetization pinned layer can be made relatively large as compared with the junction area, stability of magnetization of the magnetization pinned layer at a spin injection writing time can be maintained.

Thirteenth Embodiment

Figure 23:
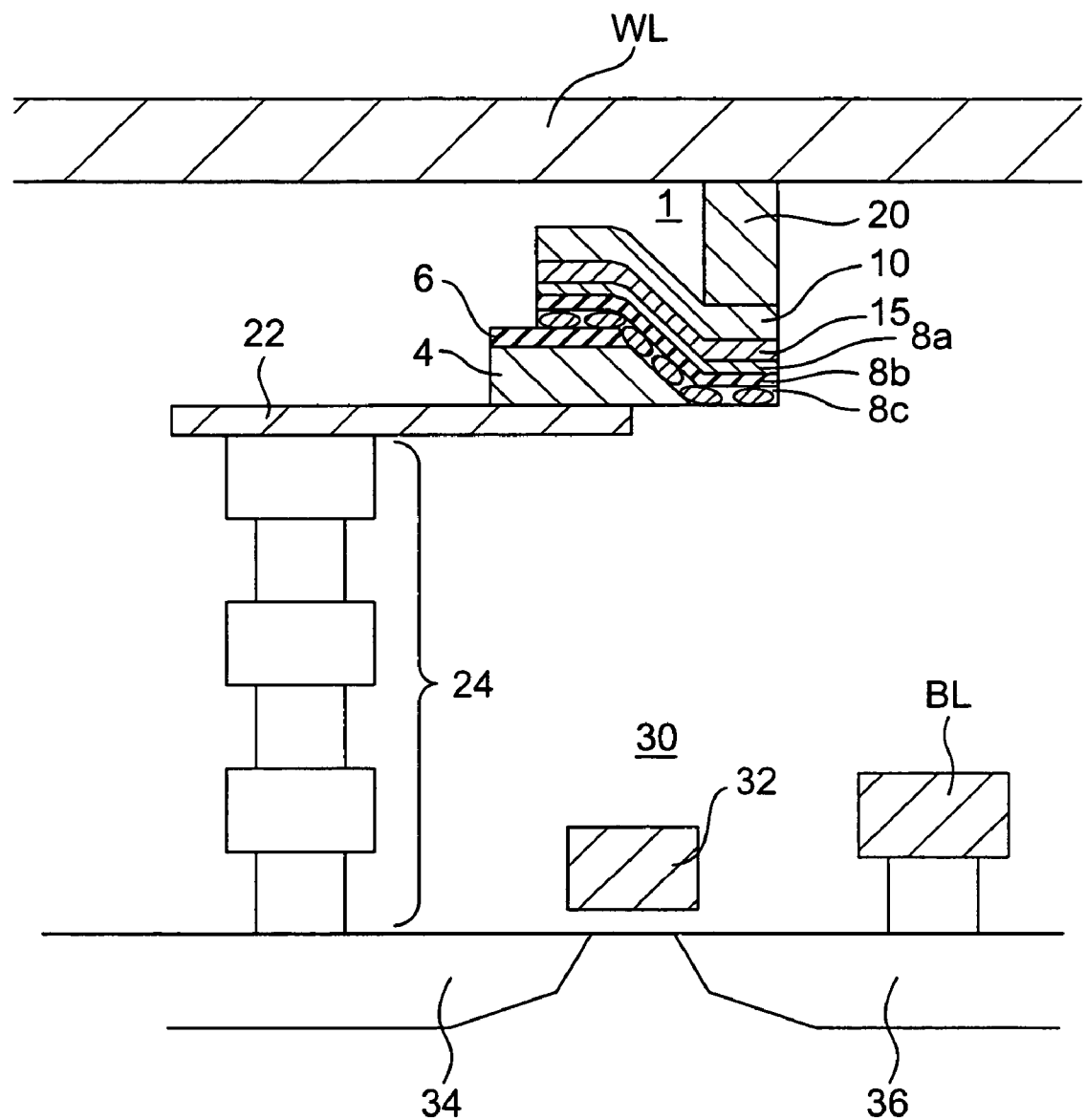
FIG. 23 is a sectional view showing a constitution of a memory cell in a magnetic memory according to a thirteenth embodiment of the invention.

Next, a magnetic memory according to a thirteenth embodiment of the present invention is shown in FIG. 23. A magnetic memory of the embodiment has such a constitution that the magneto-resistance effect element in the magnetic memory of the fourth embodiment shown in FIG. 7 is replaced with the magneto-resistance effect element 1 of the twelfth embodiment shown in FIG. 22 and a leading electrode 22 is further provided between the base electrode 4 and the connecting portion 24.

The magnetic memory of the embodiment can further reduce a writing current as compared with that in the magnetic memory of the fourth embodiment.

Figure 24:
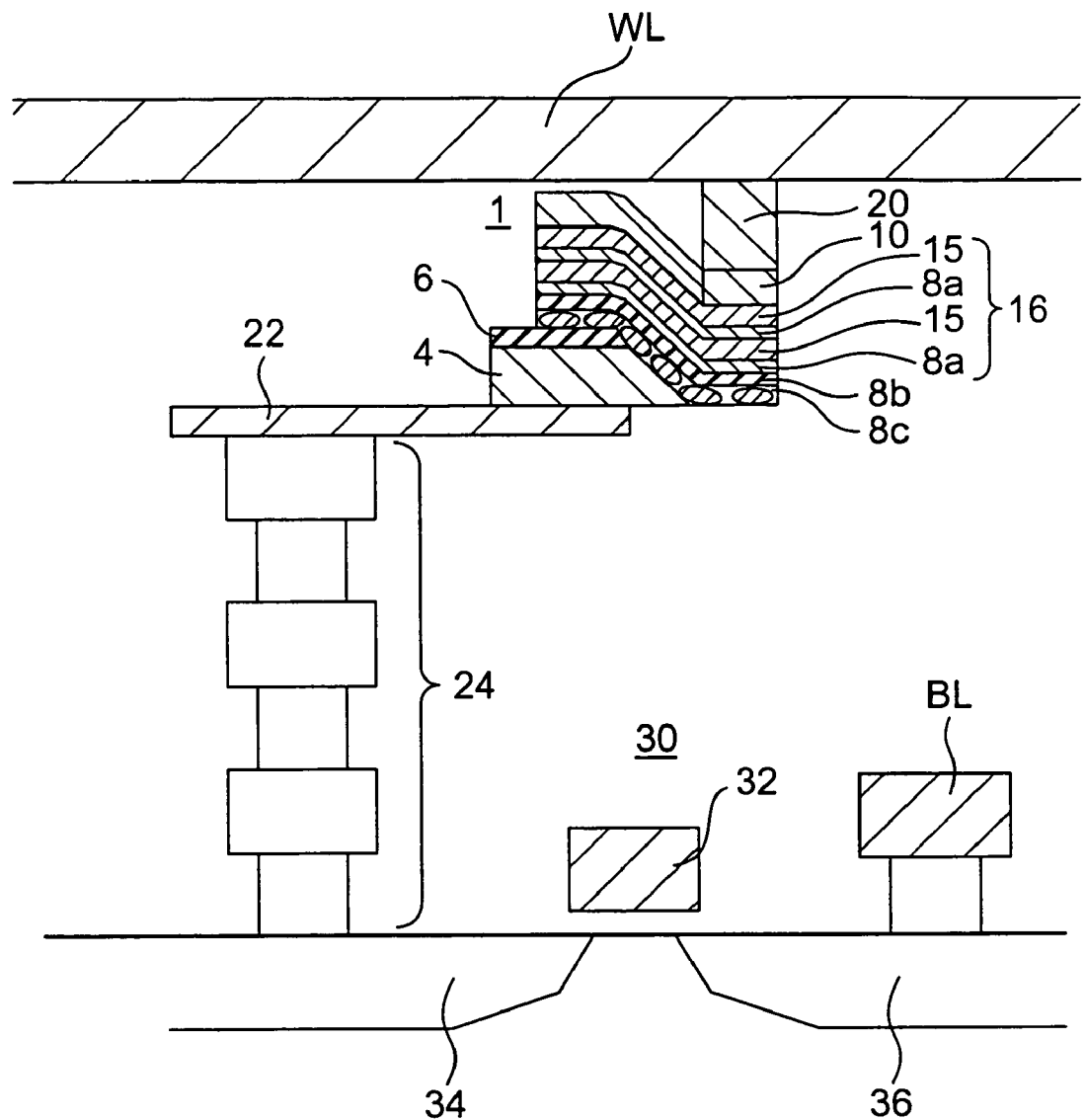
FIG. 24 is a sectional view showing a constitution of a memory cell in a magnetic memory according to a first modification of the thirteenth embodiment of the invention.

In the magnetic memory of the embodiment, though magnetization of the magnetization pinned layer 8a at a spin injection writing time is kept stable like the twelfth embodiment, as shown in FIG. 24, if a stacked layers film 16 where the ferromagnetic layer 8a and the anti-ferromagnetic layer 15 are alternatively stacked one on another instead of the magnetization pinned layer 8a and the anti-ferromagnetic layer 15, magnetization of the magnetization pinned layer at a spin injection writing time can be kept more stable.

Figure 25:
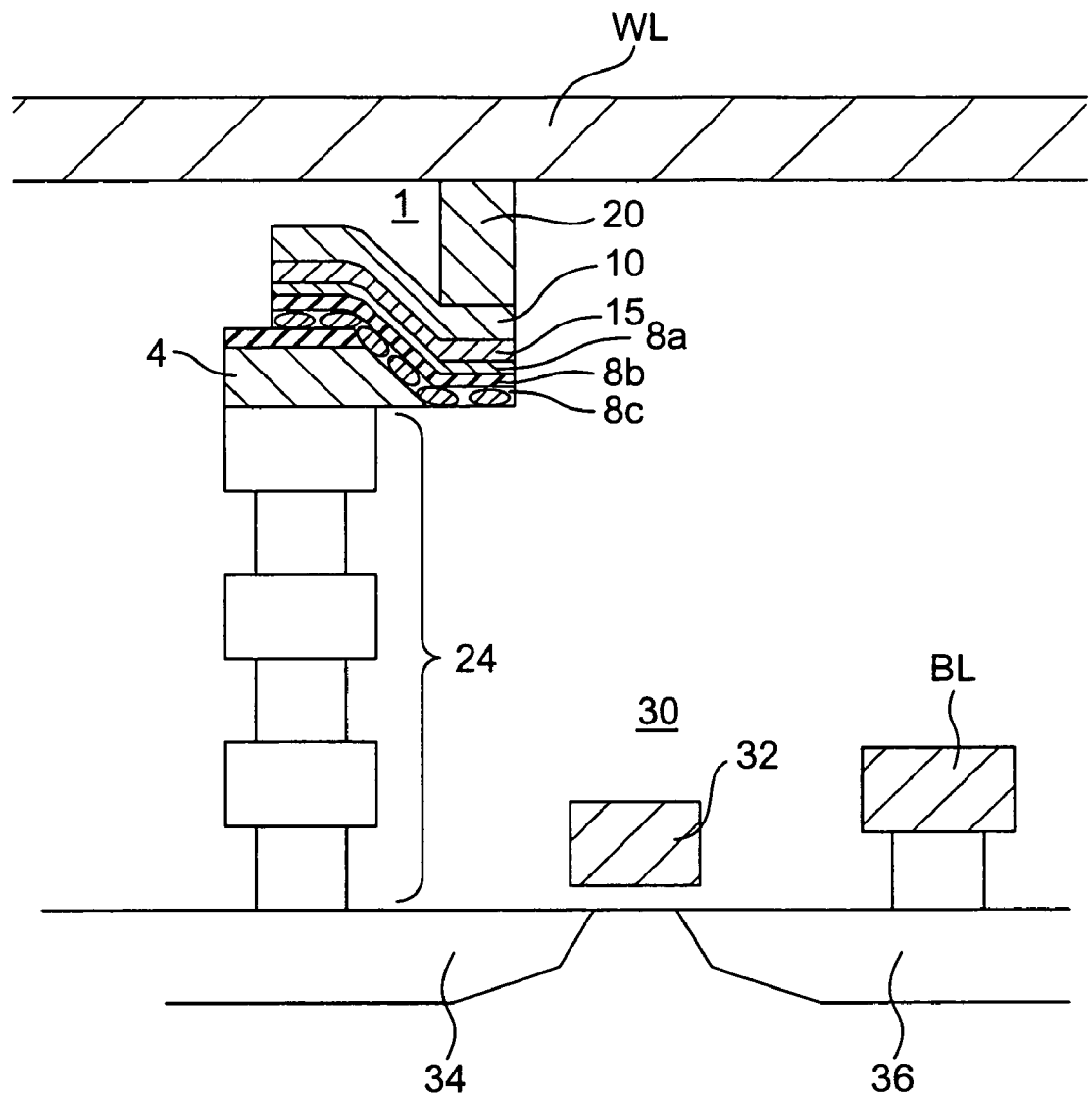
FIG. 25 is a sectional view showing a constitution of a memory cell in a magnetic memory according to a second modification of the thirteenth embodiment of the invention.

In the embodiment, though the base electrode 4 of the magneto-resistance effect element 1 is connected to the connecting portion 24 via the leading electrode 22, as shown in FIG. 25, the base electrode 4 can be directly connected to the connecting portion 24 without providing the leading electrode 22. With such a constitution, an occupation area of the memory can be made smaller than this embodiment and manufacturing the same can be made easy.

Figure 26:
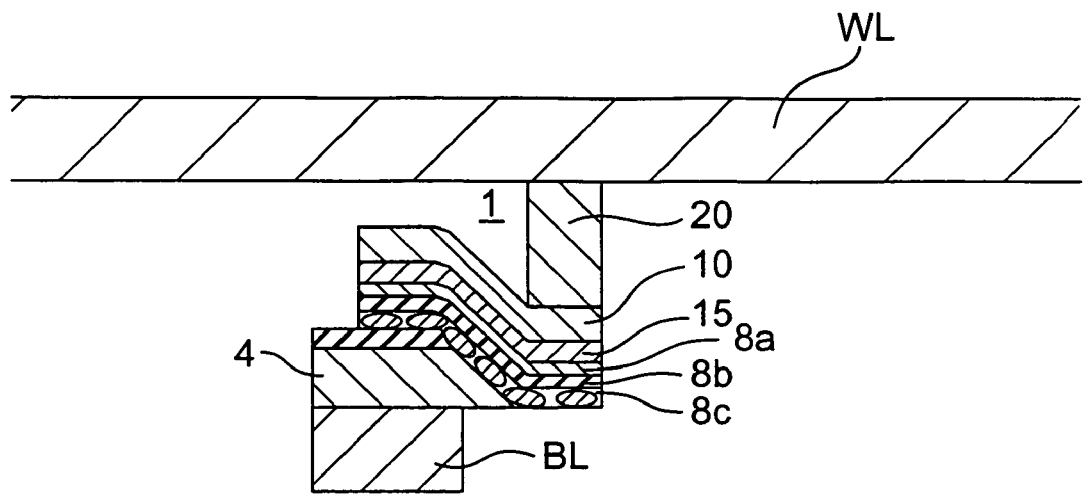
FIG. 26 is a sectional view showing a constitution of a memory cell in a magnetic memory according to a third modification of the thirteenth embodiment of the invention.
Figure 27:
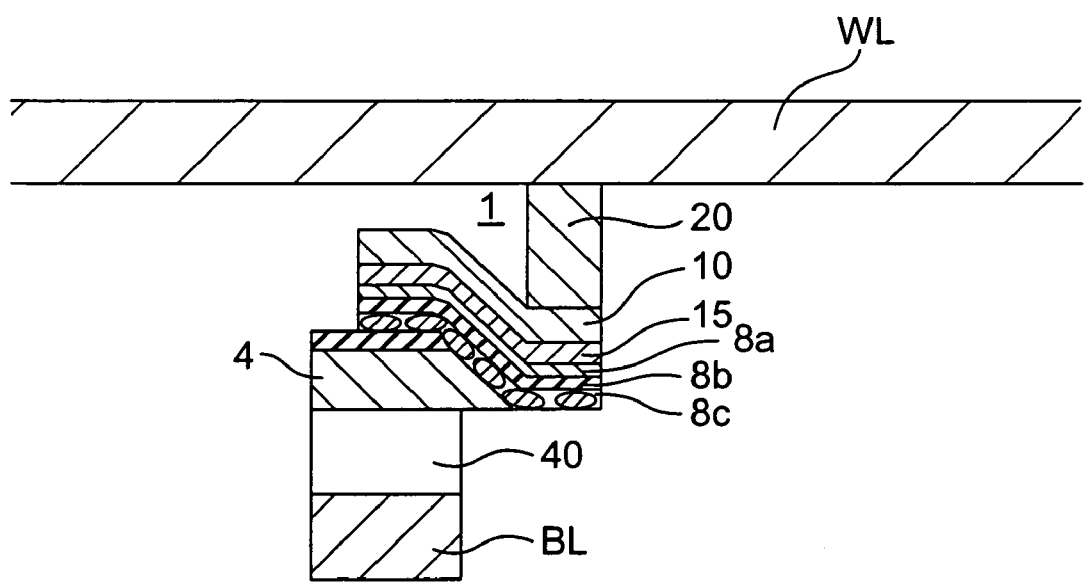
FIG. 27 is a sectional view showing a constitution of a memory cell in a magnetic memory according to a fourth modification of the thirteenth embodiment of the invention.

As shown in FIGS. 26 and 27, a simple matrix type cross point architecture may be applied to a memory cell structure. By using the architecture, a mass storage memory can be realized. FIG. 26 is a view showing a constitution where the base electrode 4 of the magneto-resistance effect element 1 is directly connected to the bit line BL, and FIG. 27 is a view showing a constitution where the base electrode 4 of the magneto-resistance effect element 1 is connected to the bit line BL via a diode 40.

Fourteenth Embodiment

Figure 28:
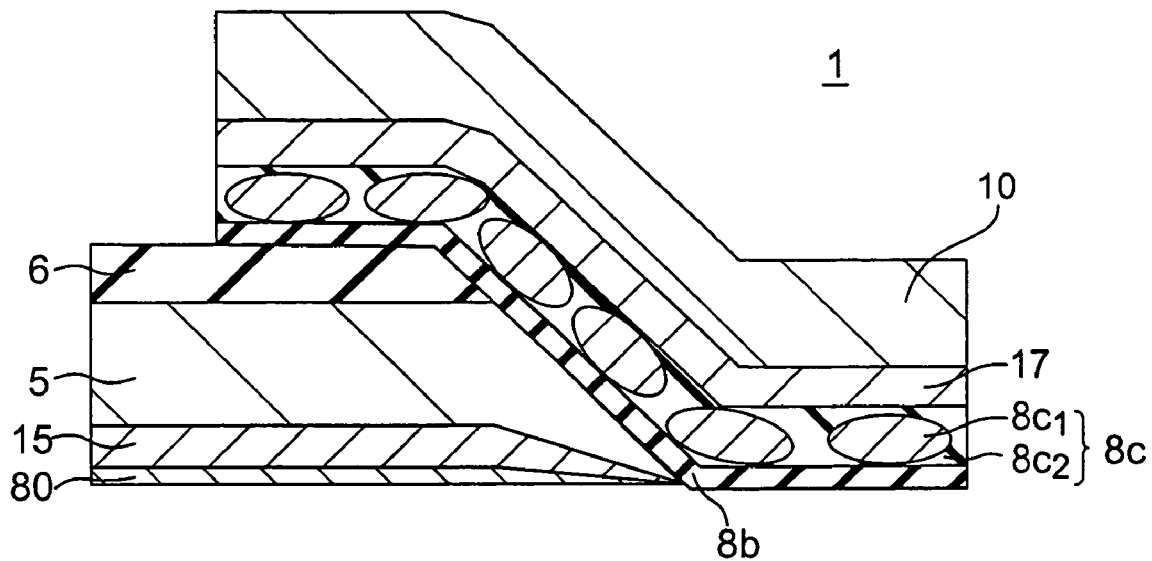
FIG. 28 is a sectional view showing a constitution of a magneto-resistance effect element according to a fourteenth embodiment of the present invention.
Figure 29:
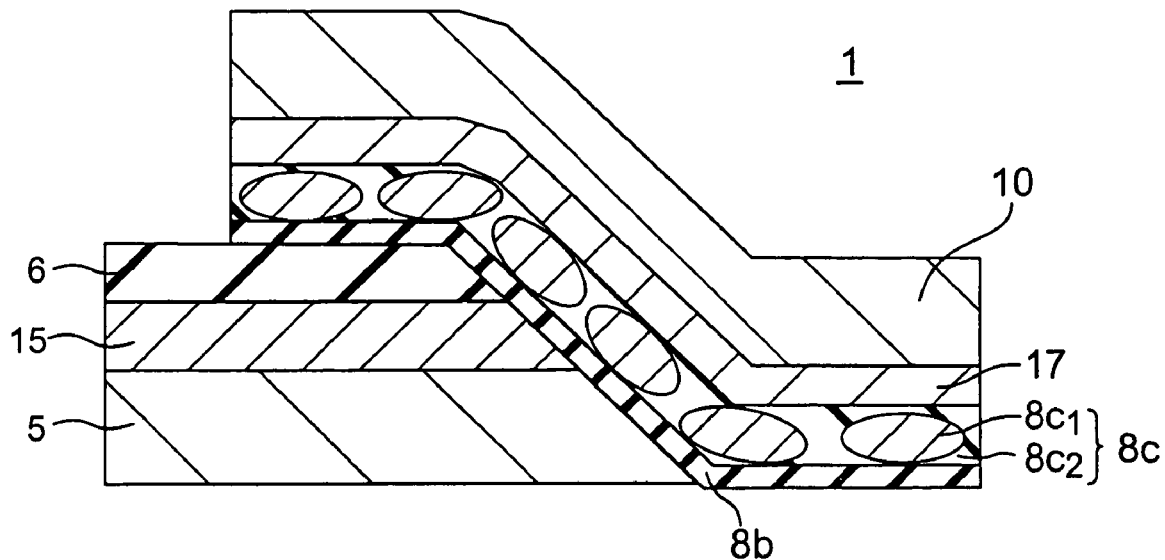
FIG. 29 is a sectional view showing a constitution of a magneto-resistance effect element according to a modification of the fourteenth embodiment of the present invention.

Next, a magneto-resistance effect element according to a fourteenth embodiment of the present invention is shown in FIG. 28. A magneto-resistance effect element 1 of the embodiment has such a constitution that a non-magnetic layer 17 is provided between the magnetic recording layer 8c and the counter electrode 10 without providing the tunnel barrier layer 8b, the magnetization pinned layer 8a, and the anti-ferromagnetic layer 15, a magnetization pinned layer 5 which also serves as a base electrode is provided without providing the base electrode 4, and a tunnel barrier layer 8b is provided between the an inclined end face of the magnetization pinned layer 5 serving as the base electrode and the magnetic recording layer 8c. An anti-ferromagnetic layer 15 is provided under the magnetization pinned layer 5 serving as the base electrode, and the a background layer 80 is provided below the anti-ferromagnetic layer 15. As shown in FIG. 29, the anti-ferromagnetic layer 15 is not provided under the magnetization pinned layer 5 but it may be provided between the magnetization pinned layer 5 and the insulating layer 6.

In the embodiment, an element area can be reduced and fluctuation of an area can be reduced like the twelfth embodiment.

In the embodiment, when material for the ferromagnetic particles $8c_1$ of the magnetic recording layer 8c is made from ferromagnetic material including Co, alloy thereof, or compound thereof, it is preferable that material for the non-magnetic layer 17 includes at least one element selected from the group consisting of Cr, Ru, Ir, Os, and Re, or it is alloy thereof.

Material for the ferromagnetic particles $8c_1$ of the magnetic recording layer 8c is made of ferromagnetic material including Fe, alloy thereof, or compound thereof, it is preferable that material for the non-magnetic layer 17 includes at least one element selected from the group consisting of Cr, Ru, Os, Re, W, Mn, V, Ti, and Mo, or it is alloy thereof.

Material for the ferromagnetic particles $8c_1$ of the magnetic recording layer 8c is made from ferromagnetic material including Ni, alloy thereof, or compound thereof, it is preferable that material for the non-magnetic layer 17 includes at least one element selected from the group consisting of Cr, Ru, Os, Re, Rh, Ir, W, Nb, V, Ta, and Mo, or it is alloy thereof.

As is understood from the above, when material for the ferromagnetic particles $8c_1$ of the magnetic recording layer 8c includes Ni—Co, Ni—Fe, Co—Fe, or Co—Fe—Ni, it is preferably that material for the non-magnetic layer 17 includes at least one element selected from the group consisting of Cr, Ru, Os, and Re, or it is alloy thereof. By using these materials, a current at a spin injection writing time can be reduced.

Fifteenth Embodiment

Figure 30:
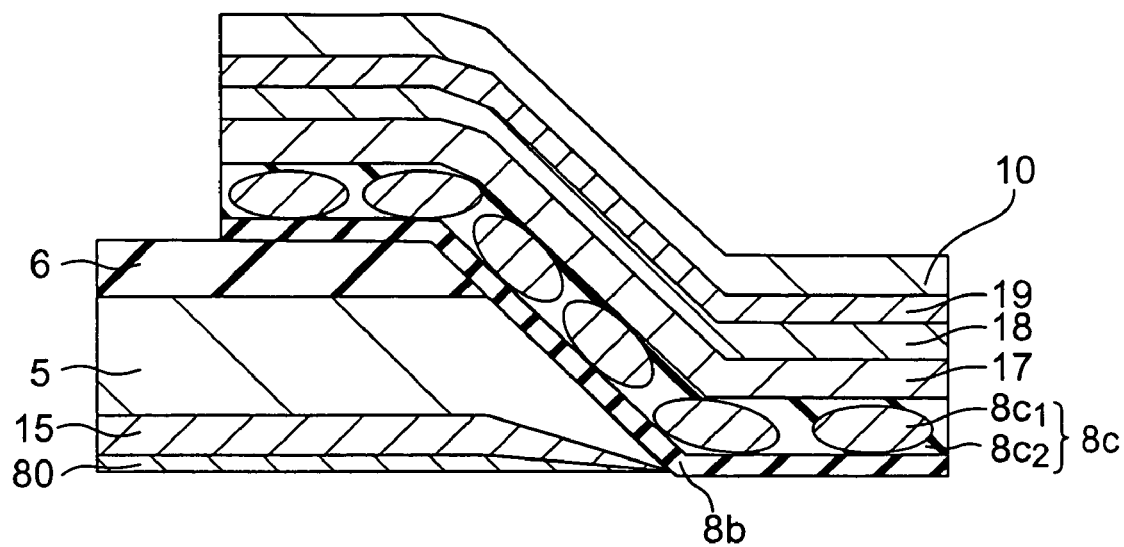
FIG. 30 is a sectional view showing a constitution of a magneto-resistance effect element according to a fifteenth embodiment of the present invention.

Next, a magneto-resistance effect element according to a fifteenth embodiment of the present invention is shown in FIG. 30. A magneto-resistance effect element 1 of the embodiment has such a constitution that a stacked layers film constituted of a magnetic layer 18 and an anti-ferromagnetic layer 19 is provided between the non-magnetic layer 17 and the counter electrode 10 in the magneto-resistance effect element of the fourteenth embodiment of the invention shown in FIG. 28.

The magnetic layer 18 constitutes a magnetization pinned layer by pinning magnetization direction through exchange coupling with the anti-ferromagnetic layer 19. That is, in the embodiment, the first magnetization pinned layer 5 is provided on one side of the magnetic recording layer 8c via the tunnel barrier layer 8b, while the second magnetization pinned layer 18 is provided on the other side thereof via the non-magnetic layer 17. Magnetization directions of the magnetization pinned layer 5 and the magnetization pinned layer 18 are different from each other by an angle of about 180°.

In the embodiment, since the magnetization directions of the magnetization pinned layer 5 and the magnetization pinned layer 18 are different from each other by an angle of about 180° in this manner, a case that spin injection is conducted from the magnetization pinned layer 5 toward the magnetization pinned layer 18, and another case that the spin injection is conducted in a reversed manner are eventually different in magnetization direction of the magnetic recording layer 8c from each other.

That is, in the embodiment, when electrons are injected from the magnetization pinned layer 5 to magnetic recording layer 8c in order to spin-reverse spin moment (magnetization) among the magnetization pinned layer 5, the tunnel barrier layer 8b, and the magnetic recording layer 8c from anti-parallel spin from parallel spin, electrons spin-polarized in the magnetization pinned layer 5 tunnels the tunnel barrier layer 8b to apply spin torque on the magnetic recording layer 8c. At that time, since the spin-polarized electrons flows from the magnetic recording layer 8c to the magnetization pinned layer 18 via the non-magnetic layer 17, while spin of the magnetic recording layer 8c is anti-parallel to spin of the magnetization pinned layer 5, the magnetic recording layer 8c and the magnetization pinned layer 18 are parallel in spin, so that reflected spin electrons reflected by the magnetization pinned layer 18 apply spin torque on the magnetic recording layer 8c to reverse spin of the magnetic recording layer 8c relative to spin of the magnetization pinned layer 5 from anti-parallel direction to parallel direction. Direction of spin in the magnetic recording layer 8c is changed by the two spin torques.

In the embodiment, when electrons are injected from the magnetization pinned layer 18 toward the magnetic recording layer 8c in order to spin-reverse spin moment among the magnetization pinned layer 5, the tunnel barrier layer 8b, and the magnetic recording layer 8c from parallel spin to anti-parallel spin, electrons spin-polarized in the magnetization pinned layer 18 pass through the non-magnetic layer 17 to the magnetic recording layer 8c to apply spin torque thereon. At that time, though spin-polarized electrons are caused to tunnel the tunnel barrier layer 8b to flow into the magnetization pinned layer 5, when they tunnel the tunnel barrier layer 8b, electrons with the same spin direction as that in the magnetization pinned layer 5 flow easily owing to a high tunneling probability, but electrons with anti-parallel spin are reflected. Electrons reflected by the magnetic recording layer 8c apply spin torque on the magnetic recording layer 8c, so that spin in the magnetic recording layer 8c is reversed by the two spin torque from parallel spin to anti-parallel spin.

In the magneto-resistance effect element 1 of the embodiment, therefore, spin injection writing is made possible by changing a current flow direction, so that writing of "1" or "0" can be performed.

In the embodiment, the magnetization pinned layer 18 and the anti-ferromagnetic layer 19 serve as reflecting layers to spin-polarized electrons. Therefore, the writing current can be reduced as compared with the fourteenth embodiment.

In the magneto-resistance effect element of the embodiment, like the first embodiment, even if spin-polarized current flows at a writing time, annular magnetic field due to the writing current is very small, so that magnetization of the magnetic recording layer is stabilized and reversed, which allows secure writing operation.

Figure 31:
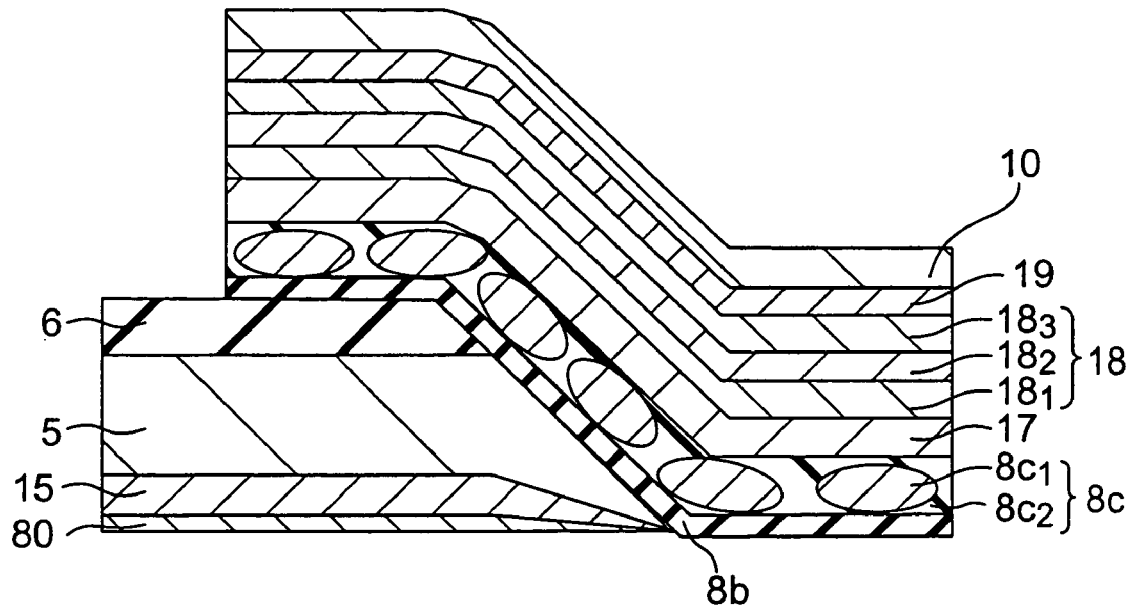
FIG. 31 is a sectional view showing a constitution of a magneto-resistance effect element according to a modification of the fifteenth embodiment of the present invention.

As shown in FIG. 31, even if the magnetization pinned layer 18 of the embodiment is replaced with two ferromagnetic layers 18₁ and 18₃ coupled via a non-magnetic layer 18₂ in a ferromagnetic manner, similar advantage can be obtained. The two ferromagnetic layers 18₁ and 18₃ may be coupled in an anti-ferromagnetic manner.

In the embodiment, an element area can be reduced and fluctuation of an area can be reduced like the fourteenth embodiment.

In the embodiment, it is preferable that Cu or Cu alloy with a long spin spreading length is used as material for the non-magnetic layer.

Material for the anti-ferromagnetic layer may be Fe—Mn (iron—manganese), Pt—Mn (platinum—manganese), Pt—Cr—Mn (platinum—chromium—manganese), Ni—Mn (nickel—manganese), Ir—Mn (iridium—manganese), NiO (nickel oxide), CoO (cobalt oxide) or the like. However, in the embodiment where the magnetization pinned layer also serves as the base electrode, it is preferable that a sheet resistance of the anti-ferromagnetic layer is equal to or more than a resistance via the tunnel barrier layer. As candidates for these anti-ferromagnetic layers, there are anti-ferromagnetic films where SDW gap is present on a Fermi surface, such as Pt—Mn (platinum—manganese), Pt—Cr—Mn (platinum—chromium—manganese), Ni—Mn (nickel—manganese), and oxidized anti-ferromagnetic materials such as NiO (nickel oxide), or CoO (cobalt oxide). Since these materials have large resistivities, influence to a resistance change rate regarding a current flowing via the anti-ferromagnetic layer/the tunnel barrier layer/the magnetic recording layer can be reduced.

In the embodiment, though the anti-ferromagnetic layer 15 is disposed under the magnetization pinned layer 5, the anti-ferromagnetic layer 15 may be disposed above the magnetization pinned layer 5. When a three-layered film of an anti-ferromagnetic layer/a ferromagnetic layer/an anti-ferromagnetic layer, or a multi-layered film where an anti-ferromagnetic layer and a ferromagnetic layer are alternatively stacked is used as the base electrode according to strength of fixation, a further strong fixing force can be obtained, which results in advantage or merit regarding reliability.

The magneto-resistance effect element according to each of the fourteenth and fifteenth embodiments can be used as a magneto-resistance effect element for a magnetic memory, of course.

The embodiments of the invention will be explained below in detail with reference examples.

EXAMPLE 1

A magneto-resistance effect element with the structure shown in FIGS. 1 and 2 was manufactured as Example 1 of the invention. The magneto-resistance effect element of the Example was formed as follows:

First of all, a base electrode film with a thickness of 80 nm made from Ta, and an insulating film with a thickness of 100 nm made from $SiO_2$ were formed on a substrate 2 made from $SiO_2$ by sputtering process. After a resist pattern with a base electrode shape was formed on the insulating film using resist, the insulating film and the base electrode film were patterned by applying a reactive ion etching using the resist pattern as a mask so that a base electrode 4 was formed and simultaneously an end face of the base electrode 4 was formed. After the resist pattern was peeled off, a TMR film 8 was formed. The TMR film 8 was formed by forming a magnetic recording layer with a thickness of 3 nm made from CoFe, a tunnel barrier layer with a thickness of 1.0 nm made from $Al_2O_3$, a magnetization pinned layer with a thickness of 5 nm made from CoFe, an anti-ferromagnetic layer with a thickness of 15 nm made of PtMn, and a cap layer with a thickness of 3 nm made from Ru in this order. Thereafter, a counter electrode film with a thickness of 100 nm made of Ta was formed on the cap layer.

Next, after a resist pattern with a counter electrode shape was formed on the counter electrode film using resist, the counter electrode film was etched by applying reactive ion etching thereon to form the counter electrode 10. Thereafter, the cap layer, the anti-ferromagnetic layer, the magnetization pinned layer, the tunnel barrier layer, and the magnetic recording layer were etched by applying ion milling thereon, and the resist pattern was peeled off. Then, while magnetic field was being applied in a direction of a longitudinal axis of the magnetic layer, annealing was performed at a temperature of 280° C. The direction of the longitudinal axis of the magnetic layer at that time was a direction perpendicular to a drawing sheet on which FIG. 1 is shown, and a size of the direction of the longitudinal axis of the TMR film 8 was longer than a size of a direction of a short axis thereof perpendicular to a direction of the longitudinal axis. The direction of longitudinal axis was a direction of axis of easy magnetization.

A device with a small area of $0.08 \times 0.3 \ \mu m^2$ was formed by this manufacturing method. In the Example, since the device with a small area was formed, spin reversion was realized by current injection, and a resistance change was obtained.

Figure 17:
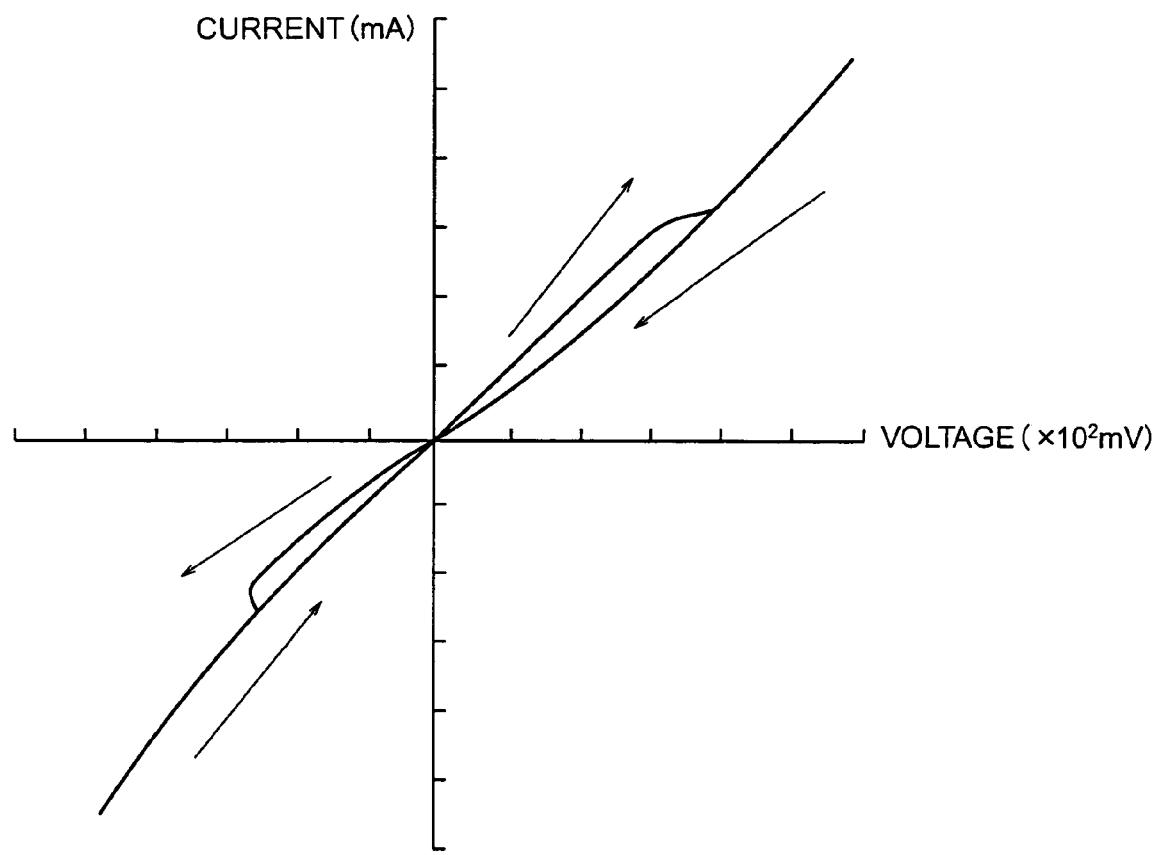
FIG. 17 is a graph showing a current-voltage characteristic of a magneto-resistance effect element according to a first example of the present invention.

A current-voltage characteristic in the Example is shown in FIG. 17. Spin reversion was generated by spin injection and change in junction resistance was observed. When the direction of magnetization in the magnetic recording layer was reversed from anti-parallel spin to the magnetization pinned layer to parallel spin thereto, a current density in the spin reversion was $1.1 \times 10^7$ A/cm², and when reversion was performed from the parallel spin to the anti-parallel spin, a current density in the spin reversion was $1.6 \times 10^7$ A/cm².

It is desirable that a current caused to flow in the formed element flows across the tunnel barrier layer in parallel to the substrate 2, as shown in FIG. 3. As shown in FIG. 4, however, an excess current path where a current flows into the counter electrode via the magnetic recording layer positioned under the tunnel barrier layer is present at the lowermost portion of an end portion of the base electrode. Since a current density is small on the excess current path, spin reversion does not occur. Therefore, a resistance change rate lowers corresponding to an excess current.

In the Example, since the magnetic recording layer is very thin such as 3 nm, influence due to the excess current path is very small in the structure shown in FIG. 3 where the magnetic recording layer is formed in advance. In the Example, since the magneto-resistance effect of 18% was observed, influence of the current path shown in FIG. 4 is probably very small.

It was found that the structure in the Example allowed spin injection writing and was suitable as mass storage memory. Since one side of an element size was controlled by its thickness, fluctuation of a writing current was suppressed to such a small range as 5% or less in a wafer.

EXAMPLE 2

Figure 5:
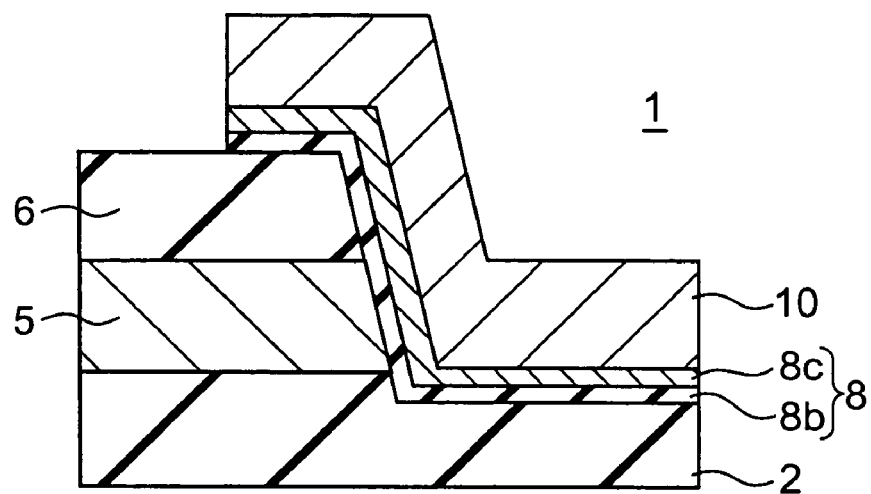
FIG. 5 is a sectional view showing a constitution of a magneto-resistance effect element according to a second embodiment of the present invention.

A magneto-resistance effect element with the structure shown in FIG. 5 was manufactured as Example 2 of the invention. The magneto-resistance effect element of the Example was formed as follows:

First of all, a magnetization pinned layer with a thickness of 80 nm made from CoFe, and an insulating film with a thickness of 100 nm made from $SiO_2$ were formed on a substrate 2. Here, the magnetization pinned layer was utilized as a base electrode. Thereafter, the magnetization pinned layer which also served as the base electrode was patterned by applying a ion milling process thereto using the patterned insulating layer as a hard mask. At that time, an end face of the base electrode 5 was formed. Then, a tunnel barrier layer with a thickness of 1.0 nm made from $Al_2O_3$, a magnetic recording layer having a stacked structure constituted of CoFe with a thickness of 3 nm/a non-magnetic layer with a thickness of 1.6 nm made from Ru/CoFe with a thickness of 3 nm, and a counter electrode film with a thickness of 100 nm made from Ta were formed in this order. After a resist pattern with a counter electrode shape was formed using resist, the counter electrode film was etched by applying reactive ion etching thereto using the resist pattern as a mask so that a counter electrode 10 was formed. Thereafter, the magnetic recording layer, the tunnel barrier layer, and the magnetization pinned layer were etched by applying ion milling process thereon using the counter electrode 10 as a hard mask, and the resist pattern was peeled off. Then, while magnetic field was being applied to the magnetic layer in a direction of a longitudinal axis thereof, annealing was performed at a temperature of 280°.

An element with a small area of $0.08 \times 0.3$ μm² was formed by this manufacturing method.

In Example 2, when an direction of magnetization of the magnetic recording layer was reversed from anti-parallel spin to the magnetization pinned layer to parallel spin thereto, a current density of spin reversion was $0.8 \times 10^7$ A/cm², and when reversion was performed from the parallel spin to the anti-parallel spin, a current density in spin reversion was $1.0 \times 10^7$ A/cm².

In Example 2, since the excess current path explained in FIG. 4 did not occur, a relatively high MR value such as 25% was obtained. Since a resistance change rate due to influence of an excess current path was not reduced, the magnetic recording layer was formed in a thick three-layered structure. Since one side of an element size was controlled by its thickness, fluctuation of a writing current was suppressed to such a small range as 4% or less in a wafer.

In Example 2, the magnetization pinned layer is reversed with such large magnetic field of about 0.1 T. When this element is applied, it is important that attention is paid so as not to approximate the element to a ferromagnetic material after anneal under magnetic field and such a measure is taken that a whole sample is covered with a magnetic shield plate so as not to cause reversion of the magnetization pinned layer.

It was found that the structure of Example 2 allowed spin injection writing with a low current and it was suitable as a mass storage memory.

EXAMPLE 3

Figure 6:
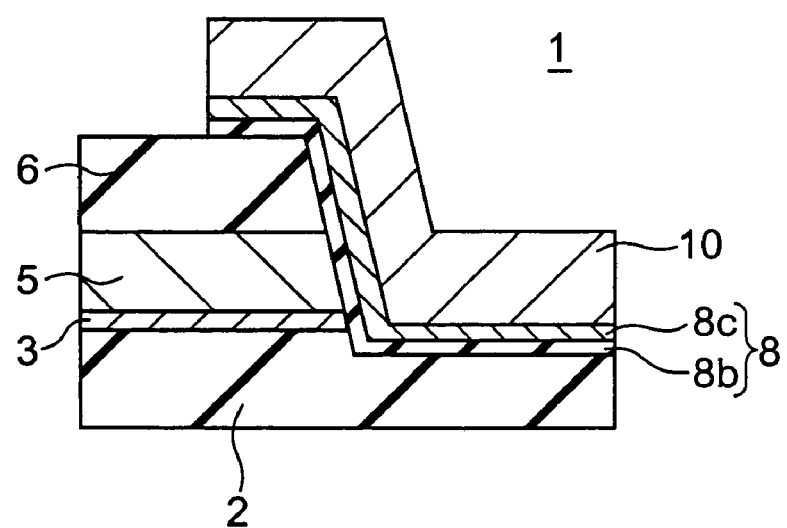
FIG. 6 is a sectional view showing a constitution of a magneto-resistance effect element according to a third embodiment of the present invention.

A magneto-resistance effect element with the structure shown in FIG. 6 was manufactured as Example 3 of the invention. The magneto-resistance effect element of the Example was formed as follows:

First of all, a magnetization pinned layer and an insulating film were formed on a substrate 2. Here, the magnetization pinned layer had a structure where a ferromagnetic material and an anti-ferromagnetic material were stacked. Further, the magnetization pinned layer was utilized as a base electrode. A fabrication process subsequent thereto was the same as Example 2. Incidentally, the magnetization pinned layer had a structure where an anti-ferromagnetic layer with a thickness of 15 nm made from PtMn, a ferromagnetic layer with a thickness of 65 nm made from CoFe, and an anti-ferromagnetic layer with a thickness of 15 nm made from PtMn were stacked. The insulating film was made from $SiO_2$ with a thickness of 100 nm. A tunnel barrier layer was made from $Al_2O_3$ with a thickness of 0.95 nm. A magnetic recording layer had a stacked structure constituted of CoFe with a thickness of 3 nm/a non-magnetic layer with a thickness of 1.6 nm made from Ru/CoFe with a thickness of 3 nm. A counter electrode was made from Ta with a thickness of 100 nm.

An element with a small area of $0.08 \times 0.3$ μm² was formed by this manufacturing method.

In Example 3, when an direction of magnetization of the magnetic recording layer was reversed from anti-parallel spin to the magnetization pinned layer to parallel spin thereto, a current density of spin reversion was $0.7 \times 10^7$ A/cm², and when reversion was performed from the parallel spin to the anti-parallel spin, a current density in spin reversion of magnetization was $1.0 \times 10^7$ A/cm².

In Example 3, the anti-ferromagnetic layer was included in the magnetization pinned layer such that the magnetization pinned layer was not reversed even if large magnetic field was applied. A current flowing from the anti-ferromagnetic layer to tunnel barrier layer lowers a resistance change rate. However, since a sheet resistance of the anti-ferromagnetic layer made from PtMn was larger than a resistance of the tunnel barrier layer, influence was small (MR ratio=23%).

In Example 3, since an element with a small area was formed, spin reversion was realized by current injection, and resistance change was obtained. Since one side of an element size was controlled by its thickness, fluctuation of a writing current was suppressed to such a small range as 4.50% or less in a wafer.

EXAMPLE 4

A magneto-resistance effect element with the structure shown in FIG. 22 was manufactured as Example 4 of the invention. The magneto-resistance effect element of the Example was formed as follows:

A base electrode material film and an insulating layer 6 were sequentially formed on an $SiO_2$ substrate by sputtering process. After a resist pattern was formed on the insulating layer 6, the insulating layer 6 and the base electrode material film were etched by applying reactive ion etching and ion milling thereto using the resist pattern as a mask, so that a base electrode 4 was formed and simultaneously an end portion of the base electrode 4 constituting an element was formed. After the resist pattern was peeled off, a magnetic recording layer 8c, a tunnel barrier layer 8b, a magnetization pinned layer 8a, and a counter electrode film were formed in this order. The magnetic recording layer 8c was formed by simultaneously sputtering a ferromagnetic material and dielectric to apply high frequency bias on a the substrate on which films were formed. Size of each ferromagnetic particles formed by this process were in a range of 20 nm to 100 nm. While the high frequency bias wase being applied to the substrate, the dielectric and the ferromagnetic material were simultaneously formed, particle sizes or diameters of the ferromagnetic particles could be made generally uniform.

Thereafter, a resist pattern was formed on the counter electrode film, and the counter electrode film was etched by applying reactive ion etching thereon using the resist pattern as a mask, so that a counter electrode 10 was formed. Then, the magnetization pinned layer 8a, the tunnel barrier layer 8b, and the magnetic recording layer 8c were etched by ion milling process, and the resist pattern was peeled off. Thereafter, magnetic field was applied on the magnetic layer in a direction of a longitudinal axis thereof, and annealing was performed at a temperature of 280° C.

Next, the materials used and thickness sizes thereof in a vertical direction are shown from the bottom of the magneto-resistance effect element in the following order. The base electrode was made from Ta (thickness of 5 nm)/Ru (70 nm)/Ta (5 nm), the insulating layer was made from $SiO_2$ (100 nm), the magnetic recording layer was made from ferromagnetic particles (($Co_{90}Fe_{10})_{80}Pt_{20}$—AlOx (2.5 nm) spaced from one another by the dielectric, the tunnel barrier layer was made from $Al_2O_3$ (1.4 nm), the magnetization pinned layer was made from CoFe (5 nm)/PtMn (15 nm)/Ru (3 nm), and the counter electrode was made from Ta (100 nm).

The magnetic recording layer may be formed using a self-organizing phenomenon. In a forming method of a magnetic recording layer using the self-organizing phenomenon, after an end portion constituting the base electrode is formed, a first ferromagnetic layer serving as the magnetic recording layer, a tunnel barrier layer, a second ferromagnetic layer whose magnetization is fixed, an anti-ferromagnetic layer, and a metal contact layer are stacked. Subsequently, photoresist is applied on the metal contact layer and the photoresist is subjected to hard bake. Thereafter, solution obtained by dissolving di-block copolymers into organic solvent is formed on the photoresist by using a spin coat process.

Next, a long time annealing is conducted under vacuum for about 30 hours at a temperature of about 140° C. to 200° C. Thereby, the di-block copolymer 26 causes phase separation due to the self organization during the annealing, so that island structures with a size of 15 nm to 30 nm align at intervals of several tens nm. The pattern forming process using the self organizing phenomenon allows a large area pattern forming at a lower cost in shorter time as compared with an ordinary pattern forming process such as EB (electron beam) writing, photolithography, X-ray lithography, near field photolithography, interference exposing process, or FIB (Focused Ion Beam). Thereafter, exposure to oxygen plasma is performed and only the di-block polymer portion is selectively removed. A hole is formed at a portion where the di-block copolymer portion has been removed.

Next, when application of SOG (spin on glass) diluted with lactic acid is performed using spin coat process, SOG is filled in the hole. Thereafter, the photoresist and the di-block copolymer are patterned by RIE (Reactive Ion Etching) using oxygen plasma and utilizing the SOG as a mask. At that time, a portion of the photoresist except for a portion thereof coated with the SOG is removed. Patterning is performed down to the first ferromagnetic layer by applying ion milling using an etching mask formed of the patterned resist and the SOG. Subsequently, after the etching mask is removed, immediately a protective film constituted of AlOx or SiOx is formed on a whole surface.

Next, an interlayer insulating film is formed by applying SOG on the whole surface to conduct baking. Thereafter, the interlayer insulating film is etched back, so that a surface of the metal contact layer is exposed. Subsequently, a non-magnetic metal film is formed and a counter electrode is formed through patterning.

An element with a small area of 0.08×0.25 $\mu m^2$ could be formed by this forming method. In Example 4, since the element with a small area could be formed, spin reversion according to current injection was realized and resistance change was obtained.

Figure 32:
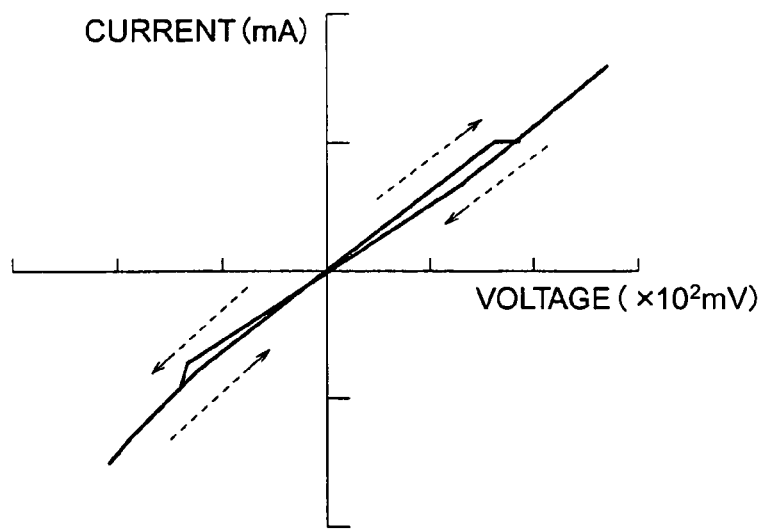
FIG. 32 is a graph showing a current-voltage characteristic of a magneto-resistance effect element according to a fourth example of the present invention.

A current-voltage characteristics in the Example is shown in FIG. 32. Spin reversion was generated by spin injection and change in junction resistance was observed. When the direction of magnetization in the magnetic recording layer was reversed from anti-parallel spin to the magnetization pinned layer to parallel spin thereto, a current density in the spin reversion was $0.5 \times 10^7$ $A/cm^2$, and when reversion was performed from the parallel spin to the anti-parallel spin, a current density in spin reversion was $0.6 \times 10^7$ $A/cm^2$.

Since the ferromagnetic layers spaced from one another by the dielectric were used as the magnetic recording layer under the tunnel barrier layer, an excess current path where a current flows in the counter electrode is not present, so that a current is used for spin injection writing laconically.

Figure 33:
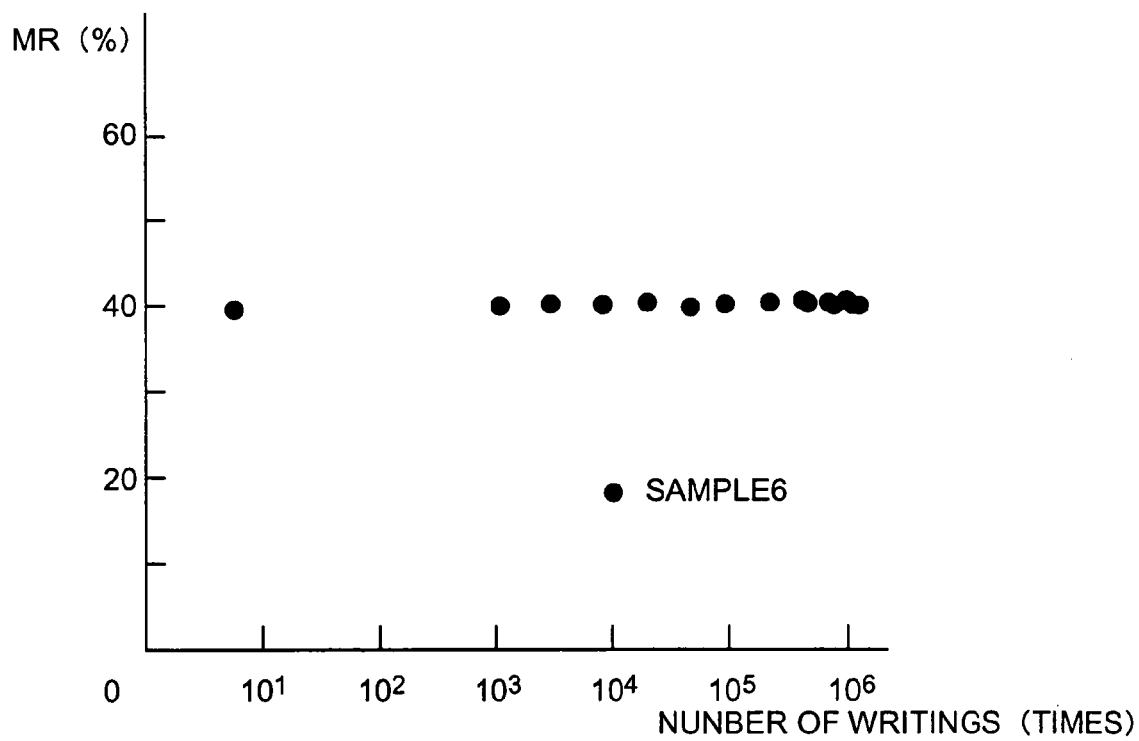
FIG. 33 is a graph showing a MR change ratio to the number of writing times of a magneto-resistance effect element according to a fourth example of the invention.

As described above, the structure of Example 4 could provide a spin memory which was not influenced up to its size of 0.25 $\mu m^2$ by reflux magnetic field and allowed a low current writing over various sizes including a cell size larger than 0.1×0.1 $\mu m^2$. Since the ferromagnetic layer was formed from ($Co_{90}Fe_{10})_{80}Pt_{20}$—AlOx (2.5 nm), there did not occur the problem about a thermal stability of the magnetic recording layer to thermal fluctuation. Since a volume of the magnetization pinned layer could be structurally made much larger than an effective volume of the magnetic recording layer, as shown in FIG. 33, it was found that stability of magnetization of the magnetization pinned layer at a spin injection writing time could be maintained.

It was found that the structure of Example 4 allowed spin injection writing at a low current and it was suitable as a mass storage memory. Since one side of an element size was controlled by its thickness, fluctuation of a writing current was suppressed to such a small range as 5% or less in a wafer.

EXAMPLE 5

A magneto-resistance effect element with the structure shown in FIG. 29 was manufactured as Example 5 of the invention. The magneto-resistance effect element of the Example was formed as follows:

A magnetization pinned layer and an insulating layer were formed on a substrate. Here, the magnetization pinned layer also served as a base electrode. A resist pattern was formed on the insulating layer and the insulating layer was patterned using the resist pattern as a mask. Thereafter, a base electrode was patterned by applying ion milling thereon using the insulating layer as a hard mask and simultaneously a sloping end portion of the base electrode constituting an element was formed. Then, a tunnel barrier layer, a magnetic recording layer, and a counter electrode layer were formed in this order. A resist pattern was formed on the counter electrode layer and a counter electrode was etched by using the resist pattern as a mask to apply reactive ion etching to the counter electrode layer. Thereafter, the tunnel barrier layer and the magnetization pinned layer were etched by using the counter electrode as a hard mask to apply ion milling and the resist pattern was peeled off. Then, magnetic field was applied to the magnetic layer in a direction of a longitudinal axis thereof, and annealing was performed at a temperature of 280° C.

The materials used and thickness sizes thereof in a vertical direction are shown from the bottom of the magneto-resistance effect element in the following order. The magnetization pinned layer which also served as the base electrode was made from CoFe (65 nm)/PtMn (15 nm), the insulating layer was made from $SiO_2$ (100 nm), the tunnel barrier layer was made from $Al_2O_3$ (1.4 nm), the magnetic recording layer was made from ferromagnetic particles $((Co_{90}Fe_{10})_{80}Pt_{20}$—AlOx (2.5 nm)) spaced from one another by the dielectric, the non-magnetic layer was made from Ru (15 nm), and the counter electrode was made from Ta (100 nm).

An element with a small area of 0.08×0.25 $\mu m^2$ could be formed by this forming method.

In Example 5, when an direction of magnetization of the magnetic recording layer was reversed from anti-parallel spin to the magnetization pinned layer to parallel spin thereto, a current density of spin reversion was $0.4 \times 10^7$ $A/cm^2$, and when reversion was performed from the parallel spin to the anti-parallel spin, a current density in spin reversion of magnetization was $0.55 \times 10^7$ $A/cm^2$.

In Example 5, Since the ferromagnetic layers (particles) spaced from one another by the dielectric were used as the magnetic recording layer under the tunnel barrier layer, an excess current path where a current flows in the counter electrode is not present, so that a current is used for spin injection writing laconically.

As explained above, the structure of Example 5 was not influenced up to its size of 0.25 $\mu m^2$ by reflux magnetic field and allowed a low current writing over various sizes including a cell size larger than 0.1×0.1 $\mu m^2$.

Since the ferromagnetic layer was made from $(Co_{90}Fe_{10})_{80}Pt_{20}$—AlOx (2.5 nm), there did not occur the problem about thermal stability of the magnetic recording layer to thermal fluctuation.

Since a volume of the magnetization pinned layer could be structurally made much larger than an effective volume of the magnetic recording layer, like Example 4, it was found that stability of magnetization of the magnetization pinned layer at a spin injection writing time could be maintained.

It was found that the structure of Example 5 allowed spin injection writing at a low current and it was suitable as a mass storage memory. Since one side of a device size was controlled by its thickness, fluctuation of a writing current was suppressed to such a small range as 5% or less in a wafer.

Sixth Embodiment

Next, as Example 6 of the invention, Sample 1 to Sample 6 having non-magnetic layers 17 different in material from one another were produced regarding the magneto-resistance effect element shown in FIG. 28, magneto-resistance effect elements having the structure shown in FIG. 31 were manufactured as Sample 7 to Sample 12, and a magneto-resistance effect element having the structure shown in FIG. 30 was manufactured as Sample 13. The base electrode 5 which also served as the magnetization pinned layer was made from CoFe with a film thickness of 65 nm, the anti-ferromagnetic layer 15 was made from PtMn with a film thickness of 15 nm, the insulating layer 6 was made from $SiO_2$ with a film thickness of 10 nm, the tunnel barrier layer 8b was made from $Al_2O_3$, and the magnetic recording layer 8c was made from $(Co_{90}Fe_{10})_{80}Pt_{20}$—AlOx (3 nm). Sample 4 and Sample 10 were different in material from the remaining Samples in that material for the ferromagnetic particles $8c_1$ in the former magnetic recording layer 8c was $Co_{90}Fe_{10}$.

As Comparative Example 1, a magneto-resistance effect element where the non-magnetic layer 17 was not provided in Sample 1 was manufactured, and as Comparative Example 2, a magneto-resistance effect element where the non-magnetic layer 17 was not provided in Sample 4 was manufactured.

Results obtained by measuring writing current densities in magneto-resistance effect elements of Samples 1 to 13 and magneto-resistance effect elements of Comparative Examples 1 and 2 thus constituted are shown in FIG. 34. Each of areas of the magneto-resistance effect elements is 0.08× 0.25 $\mu m^2$. Each current density shown in FIG. 34 shows an average value of a current density in reversion to parallel direction and a current density in reversion from parallel direction to anti-parallel direction.

As understood from the measurement results shown in FIG. 34, when the magnetic recording layer is a ferromagnetic layer including Co, it is preferable that material for the non-magnetic layer coming in contact with the ferromagnetic layer includes at least one element selected from the group consisting of Cr, Ru, Ir, Os, and Re or it is alloy thereof.

When the magnetic recording layer is a ferromagnetic layer including Co—Fe, it is preferable that material for the non-magnetic layer coming in contact with the ferromagnetic layer includes at least one element selected from the group consisting of Cr, Ru, Os, and Re or it is alloy thereof.

Sixteenth Embodiment

Figure 36:
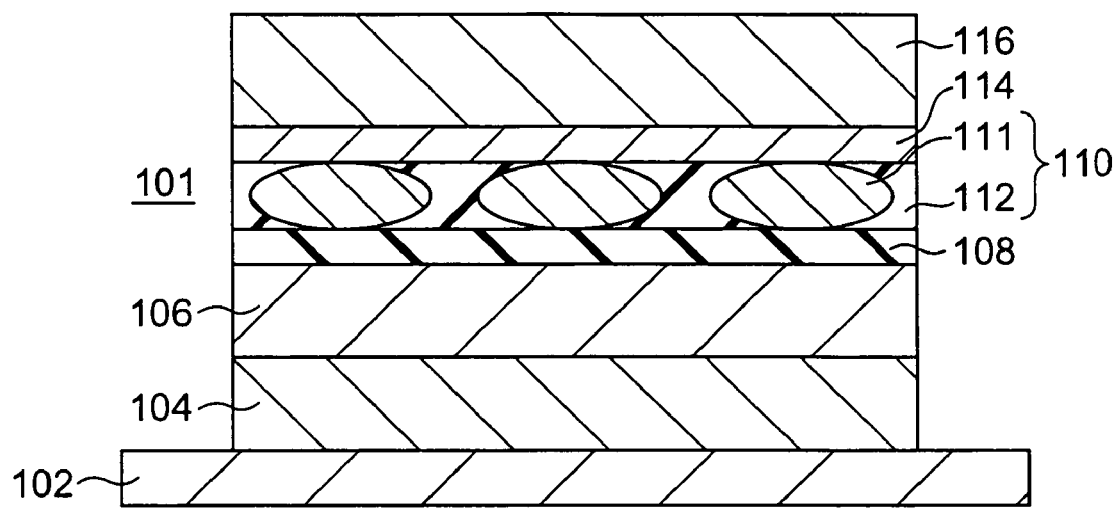
FIG. 36 is a sectional view showing a constitution of a magneto-resistance effect element according to a sixteenth embodiment of the present invention.

A magneto-resistance effect element according to a sixteenth embodiment of the invention is shown in FIG. 36. A magneto-resistance effect element 101 according to the embodiment is provided with a background layer 102 serving as a lower electrode, an anti-ferromagnetic layer 104 provided on the background layer 102, a ferromagnetic layer 106 provided on the anti-ferromagnetic layer 104, a tunnel barrier layer 108 provided on the ferromagnetic layer 106, a magnetic recording layer 110 having a plurality of ferromagnetic particles 111 spaced from one another by dielectric 112 provided on the tunnel barrier layer 108, a non-magnetic layer 114 provided on the magnetic recording layer 110, and a non-magnetic electrode layer 116 provided on the non-magnetic layer 114 so as to serve as an upper electrode, where such a constitution is employed that a current is caused to flow between the lower electrode 102 and the upper electrode 116.

The ferromagnetic layer 106 has a magnetization pinned by exchange coupling with the anti-ferromagnetic layer 104 and serves as a magnetization pinned layer. The plurality of ferromagnetic particles 111 spaced from one another by the dielectric 112 are constituted such that they come in contact with the tunnel barrier layer 108 and the non-magnetic layer 114.

In the magneto-resistance effect element 101 of the embodiment thus constituted, since an effective junction area of ferromagnetic tunnel junction is defined by a projection area of the plurality of ferromagnetic particles 111 spaced by the dielectric 112 to the ferromagnetic layer 106 in a direction perpendicular to a film face, the effective junction area is smaller than that of a continuous film of the magnetic recording layer made from a ferromagnetic material. Therefore, even if spin-polarized current is caused to flow at a writing time, annular magnetic field due to the writing current is very small, so that magnetization of the magnetic recording layer is also reversed stably in the magnetic recording layer 110 with a large element size, and a writing operation can be performed securely.

The non-magnetic layer 114 is imparted with a property of reflecting spin-polarized electrons by using material properly selected, and the property will be explained in detail after explanation about a twentieth embodiment.

In the embodiment, an element which is not provided with the anti-ferromagnetic layer 104 and is constituted of a ferromagnetic layer 106 with a film thickness of 5 nm made from CoFe, a tunnel barrier layer 108 with a film thickness of 1.6 nm made from AlOx, ferromagnetic particles 111 with a thickness of 2.0 nm in a film thickness direction made from Co—Pt and spaced from one another by dielectric 110, and a non-magnetic layer 114 with a film thickness of 5 nm made from Ru was manufactured and an experiment was conducted. When external magnetic field is applied to the element, since a coercive force of CoFe is smaller than that of Co—Pt, the magnetization of the ferromagnetic layer 106 made from CoFe is reversed prior to reversion of the magnetization of the ferromagnetic particles 111 made from Co—Pt and spaced by the dielectric 112. However, such a fact was found by the present inventors that, when a spin-polarized current is caused to flow to a film face perpendicularly, namely in a film thickness direction, the magnetization of the ferromagnetic particles 111 made from Co—Pt and spaced from one another by the dielectric 110 was reversed.

Accordingly, as the ferromagnetic particles 111 spaced by the dielectric 112, it is preferable that material which has a high magnetic anisotropy energy density Ku (a large coercive force) even at the room temperature and has a resistance to thermal fluctuation, such as Co—Pt base, Co—Fe—Pt base, Fe—Pt base, Co—Fe—Cr—Pt base, or Co—Cr—Pt base material is used. By using such material, a problem about thermal stability of the magnetic recording layer to thermal fluctuation is solved.

Seventeenth Embodiment

Figure 37:
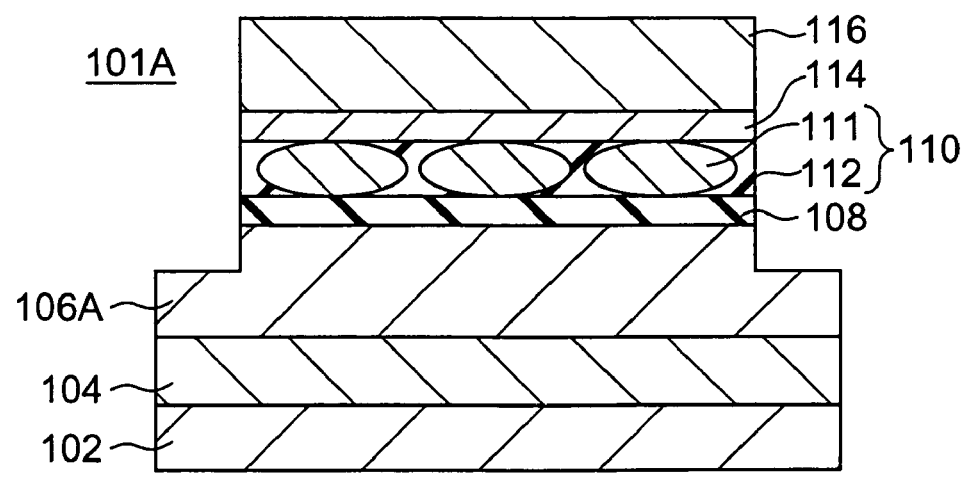
FIG. 37 is a sectional view showing a constitution of a magneto-resistance effect element according to a seventeenth embodiment of the present invention.

Next, a magneto-resistance effect element according to a seventeenth embodiment of the invention is shown in FIG. 37. A magneto-resistance effect element 101A according to the embodiment has such a constitution that the ferromagnetic layer 106 constituting a magnetization pinned layer is replaced with a ferromagnetic layer 106A in the magneto-resistance effect element 101 of the sixteenth embodiment shown in FIG. 36. The ferromagnetic layer 106A is constituted such that it has the same junction area with the tunnel barrier layer 108 as that in the sixteenth embodiment but the former volume is larger than the latter volume. Accordingly, in the seventeenth embodiment, a volume of the ferromagnetic layer 106A constituting the magnetization pinned layer is larger than that in the sixteenth embodiment. Therefore, magnetization of a magnetization pinned layer at a spin injection writing time is further stabilized as compared with that in the sixteenth embodiment.

In the seventeenth embodiment, even if spin-polarized current is caused to flow at a writing time, annular magnetic field due to the writing current is very small, so that magnetization of the magnetic recording layer is also reversed stably in the magnetic recording layer 110 with a large element size, and a writing operation can be performed securely.

Eighteenth Embodiment

Figure 38:
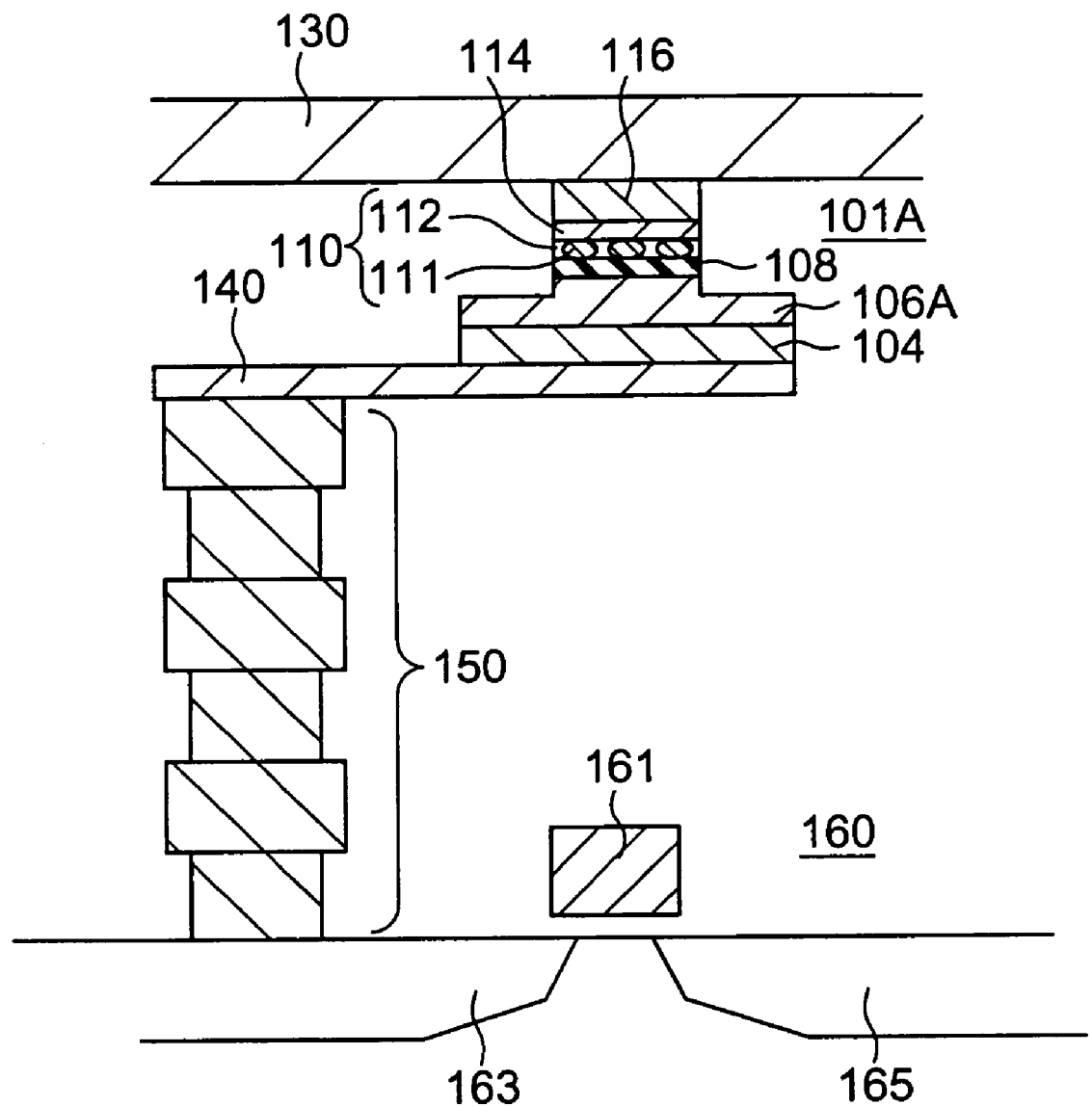
FIG. 38 is a sectional view showing a constitution of a magnetic memory according to a eighteenth embodiment of the present invention.

Next, a magnetic memory according to an eighteenth embodiment of the invention is shown in FIG. 38. A magnetic memory according to the embodiment has at least one memory cell, and the memory cell is provided with the magneto-resistance effect element 101A of the seventeenth embodiment and a selecting transistor 160. The magneto-resistance effect element is provided with an anti-ferromagnetic layer 104 provided on a leading electrode 140, a magnetization pinned layer 106A provided on the anti-ferromagnetic layer 104, a tunnel barrier layer 108 provided on the magnetization pinned layer 106A, a magnetic recording layer 110 provided on the tunnel barrier layer 108 and constituted of ferromagnetic particles 111 spaced by dielectric 112, a non-magnetic layer 114 provided on the magnetic recording layer 110, and an upper electrode 116 provided on the non-magnetic layer 114. The selecting transistor 160 is provided with a gate electrode 161, source and drain regions 163 and 165 provided on both sides of the gate electrode 161. The upper electrode 116 is connected to a bit line 130 for selecting a memory cell, and a leading electrode 140 is connected to the source 163 of the selecting transistor 160 via a connecting portion 150. The gate electrode 161 of the selecting transistor 160 also serves as a word line for selecting a memory cell. Accordingly, the memory cell is provided at a region where a bit line 130 and a word line 161 crosses each other.

Next, a spin injection writing principle according to the embodiment will be explained below. First, the selecting transistor 106 is turned ON by applying a voltage on the gate electrode of the selecting transistor 160.

a) Case of spin-reversion of spin moment of the magnetization pinned layer 106A and the magnetic recording layer 110 from anti-parallel to parallel:

Electrons are injected from the magnetization pinned layer 106A, electrons spin-polarized in the magnetization pinned layer 106A applies spin torque on the magnetic recording layer 110 via the tunnel barrier layer 108, so that spin in the magnetic recording layer 110 is reversed to anti-parallel to parallel.

b) Case of spin-reversion of spin moment of the magnetization pinned layer and the magnetic recording layer from parallel to anti-parallel:

When electrons is injected from the magnetic recording layer 110, electrons spin-polarized in the magnetic recording layer 110 is injected. At that time, electrons with the same spin direction as a spin direction of the magnetization pinned layer 106A are low in scattering probability and a spin current flows easily, but anti-parallel spin electrodes are reflected. Electrons reflected to the magnetic recording layer 110 apply spin torque on the magnetic recording layer 110, so that spin in the magnetic recording layer 110 is reversed from parallel to anti-parallel.

Current required at that time are written with the following expressions.

Case of anti-parallel to parallel:

$$Ic^P = e \, \alpha MA_t[H-H_k-2\pi M]/\hbar g(\pi)$$

Case of parallel to anti-parallel $$Ic^{AP} = e \, \alpha MA_t[H+H_k+2\pi M]/\hbar g(0)$$

Here, e represents an elementary electric charge, α represents Gilbert damping parameter, M represents magnetization, $A_t$ represents volume of a magnetic recording layer, H represents intensity of magnetic field, $H_k$ represents anisotropy constant, and h represents Planck's constant. The symbols g (π) or g (0) indicates a spin dependency in an interface between a magnetization pinned layer and a non-magnetic layer and is represented by the following equation.

$$g(\theta) = [-4 + (1+P)^3 (3+\cos \theta)/4p^{3/2}]^{-1}$$

Here, p represents a spin polarization rate. According to this equation, since g (π)>g (0) is satisfied, in general, a current $Ic^P$ in the case of spin-reversion from anti-parallel to parallel is smaller than a current $Ic^{AP}$ in the case of spin-reversion from parallel to anti-parallel.

Since the magnetic memory according to the embodiment is provided with the magneto-resistance effect element 101A of the seventeenth embodiment as the memory element, even if spin-polarized current is caused to flow at a writing time, annular magnetic field due to the writing current is very small, so that magnetization of the magnetic recording layer is also reversed stably in the magnetic recording layer 110 with a large device size, and a writing operation can be performed securely in the same manner as the seventeenth embodiment. Incidentally, it is desirable that the volume of the magnetization pinned layer is made preferably large in order to maintain stability of magnetization of the magnetization pinned layer at a time of spin injection writing.

Nineteenth Embodiment

Figure 39:
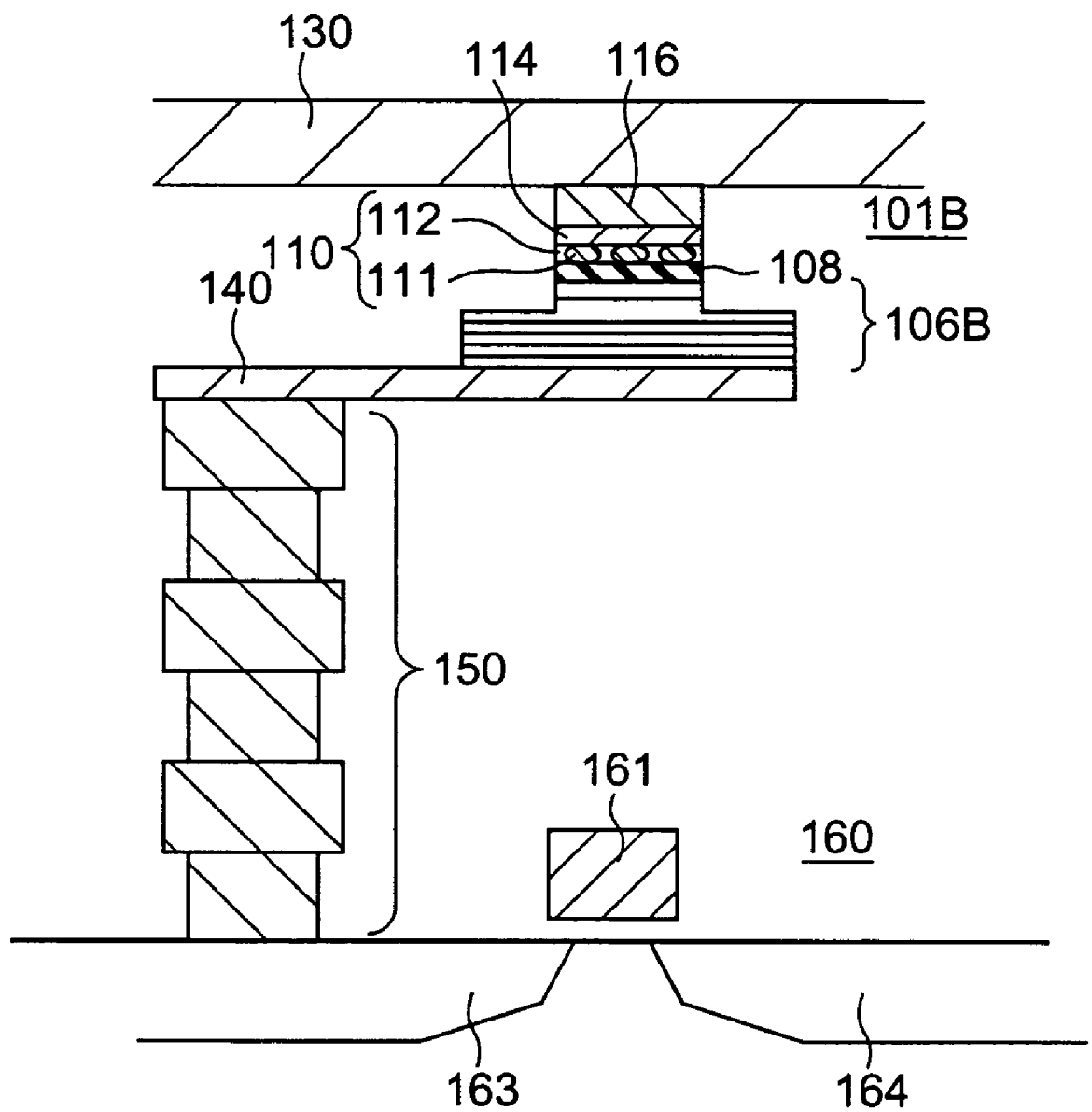
FIG. 39 is a sectional view showing a constitution of a magnetic memory according to a nineteenth embodiment of the present invention.

Next, a magnetic memory according to a nineteenth embodiment in the invention is shown in FIG. 39. A magnetic memory according to the embodiment has such a constitution that the magneto-resistance effect element 101A is replaced with a magneto-resistance effect element 101B in the magnetic memory of the eighteenth embodiment shown in FIG. 38. The magneto-resistance effect element 101B has such a constitution that the anti-ferromagnetic layer 104 and the magnetization pinned layer 106A in the magneto-resistance effect element 101A are replaced with a stacked layers film 106B where an anti-ferromagnetic layer and a ferromagnetic layer are alternatively stacked. The ferromagnetic layer in the stacked layers film 106B is subjected to magnetization pinning by exchange coupling with the anti-ferromagnetic layer to constitute a magnetization pinned layer. A shape of the stacked film of the anti-ferromagnetic layer 104 and the magnetization pinned layer 106A in the eighteenth embodiment is approximately the same as a shape of he stacked layers film 106B in the nineteenth embodiment. The stacked layers film 106B should be constituted such that a layer coming in contact with the tunnel barrier layer 108 is a ferromagnetic layer, but it may be constituted such that a layer coming in contact with the leading electrode 140 is a ferromagnetic layer or an anti-ferromagnetic layer.

In the nineteenth embodiment, even if spin-polarized current is caused to flow at a writing time, annular magnetic field due to the writing current is very small, so that magnetization of the magnetic recording layer is also reversed stably in the magnetic recording layer 110 with a large element size, and a writing operation can be performed securely in the same manner as the eighteenth embodiment. Since a total volume of the stacked layers film 106B constituting the magnetization pinned layer in the nineteenth embodiment is larger than a volume of the magnetization pinned layer 106A in the eighteenth embodiment, magnetization of the magnetization pinned layer at a spin injection writing can be kept more stable than that of the eighteenth embodiment.

(Modification)

Figure 40:
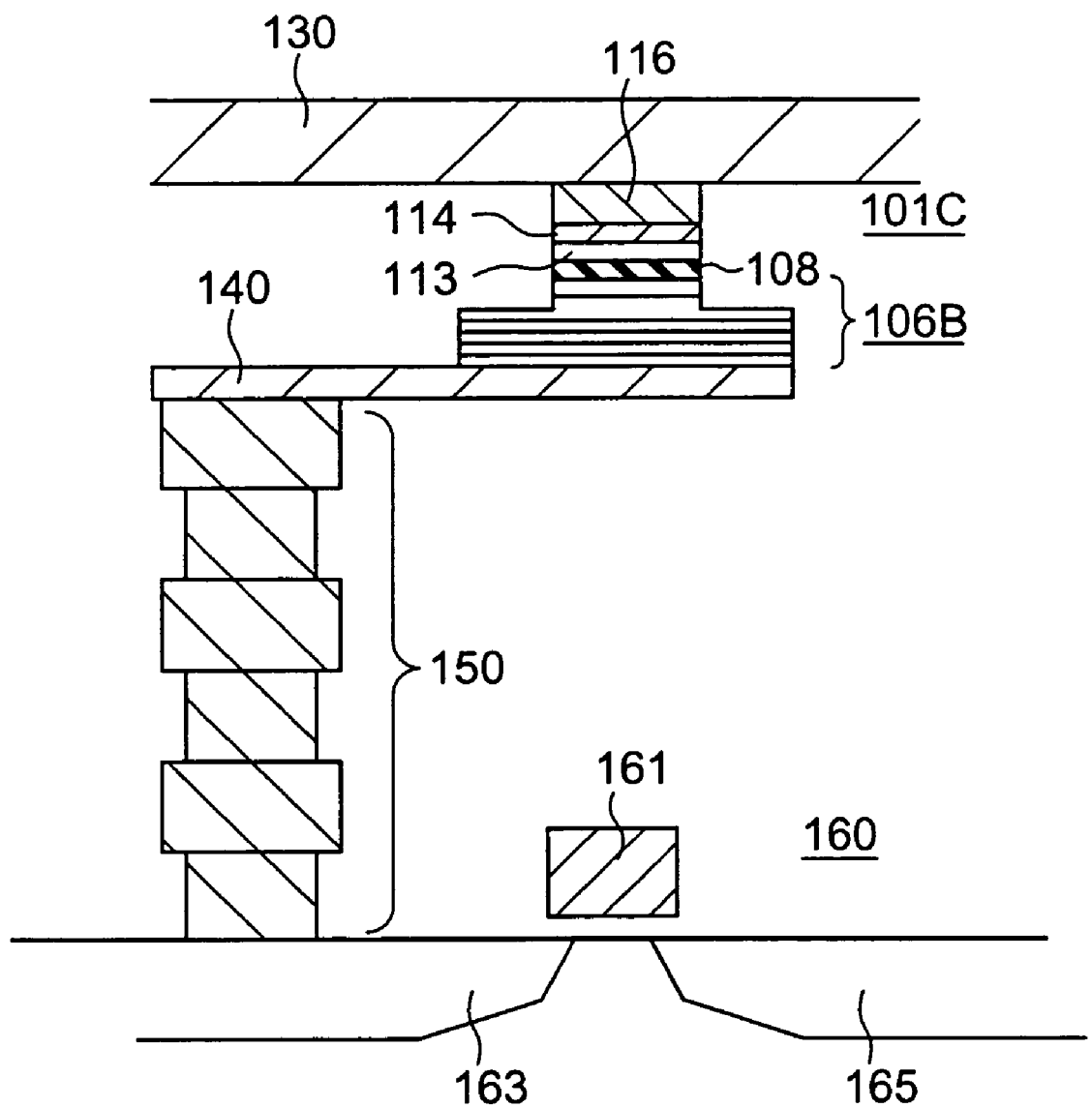
FIG. 40 is a sectional view showing a constitution of a magnetic memory according to a first modification of the nineteenth embodiment of the present invention.

A structure where the magnetization pinned layer is constituted of the stacked film 106B where the ferromagnetic layer and the anti-ferromagnetic layer are alternatively stacked like the nineteenth embodiment can be used in a magnetic memory having a magneto-resistance effect element 101C where a device area has a size of 0.1×0.1 μm² or less and a magnetic recording layer 113 is constituted of a continuous film, as shown in FIG. 40. The magneto-resistance effect element 101C has a constitution that the magnetic recording layer 110 is replaced with a magnetic recording layer 113 constituted of a continuous film of a ferromagnetic layer in the magneto-resistance effect element 101B of the magnetic memory shown in FIG. 40. In the magnetic memory shown in FIG. 40, even if the size is 0.1×0.1 μm² or less, magnetization of the magnetization pinned layer at a time of spin injection writing can be kept stable.

Figure 41:
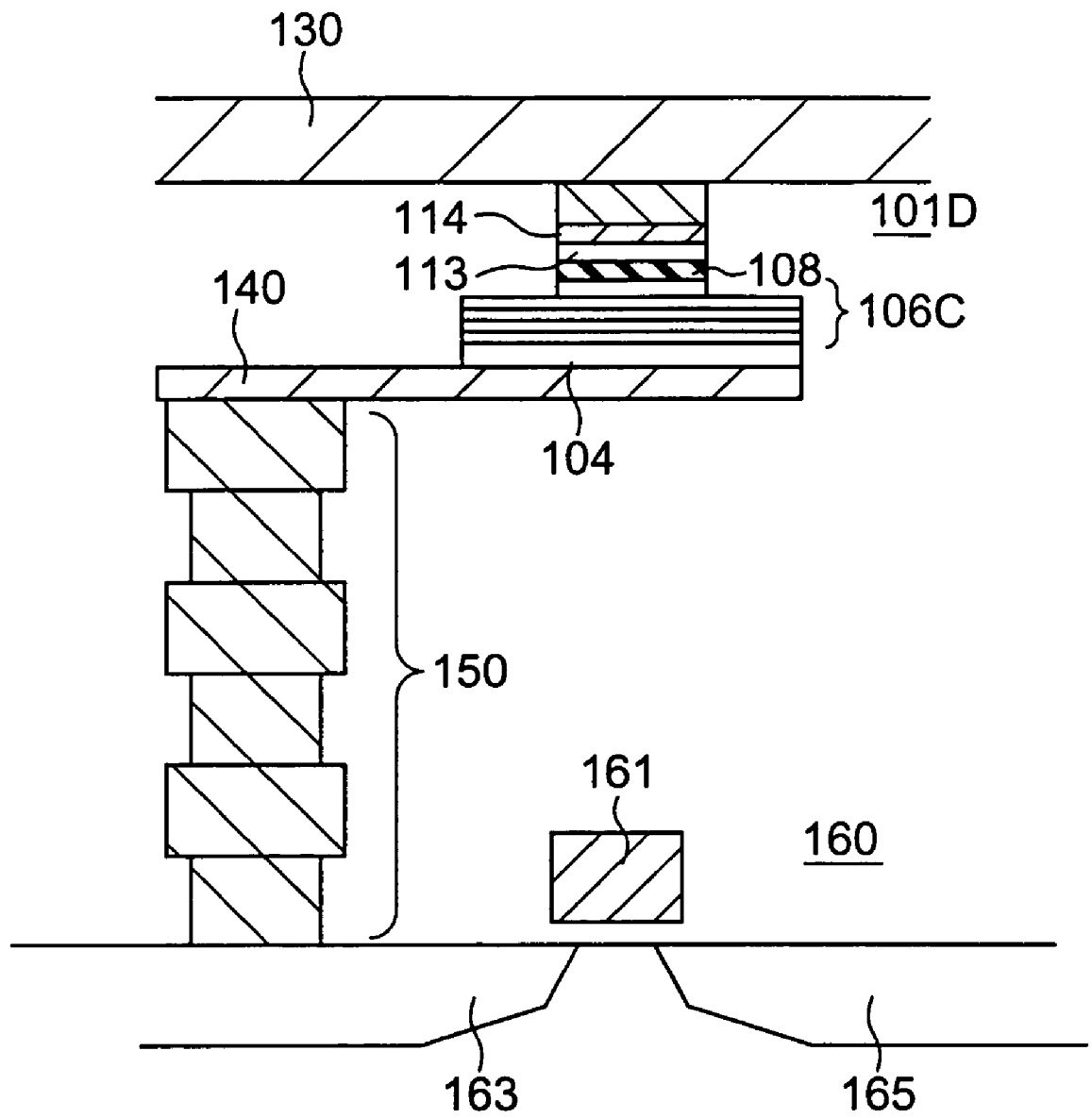
FIG. 41 is a sectional view showing a constitution of a magnetic memory according to a second modification of the nineteenth embodiment of the present invention.

In the magnetic memory shown in FIG. 40, such a constitution may be employed that the magneto-resistance effect element 101C is replaced with a magneto-resistance effect element 101D shown in FIG. 41. The magneto-resistance effect element 101D has such a constitution that the stacked layers film 106B where the ferromagnetic layer and the anti-ferromagnetic layer are alternatively stacked is replaced with a stacked structure film of a stacked layers film 106C where a ferromagnetic layer and an anti-ferromagnetic layer are alternatively stacked, and a anti-ferromagnetic layer 104 in the magneto-resistance effect element 101C. In the magnetic memory shown in FIG. 41, magnetization of the magnetization pinned layer at a spin injection writing time can be kept stable, even if a size is 0.1×0.1 μm² or less. The stacked layers film 106C must be constituted such that layers coming in contact with the tunnel barrier layer 108 and the anti-ferromagnetic layer 104, namely, the uppermost layer and the lowermost layer are ferromagnetic layers.

Twentieth Embodiment

Figure 42:
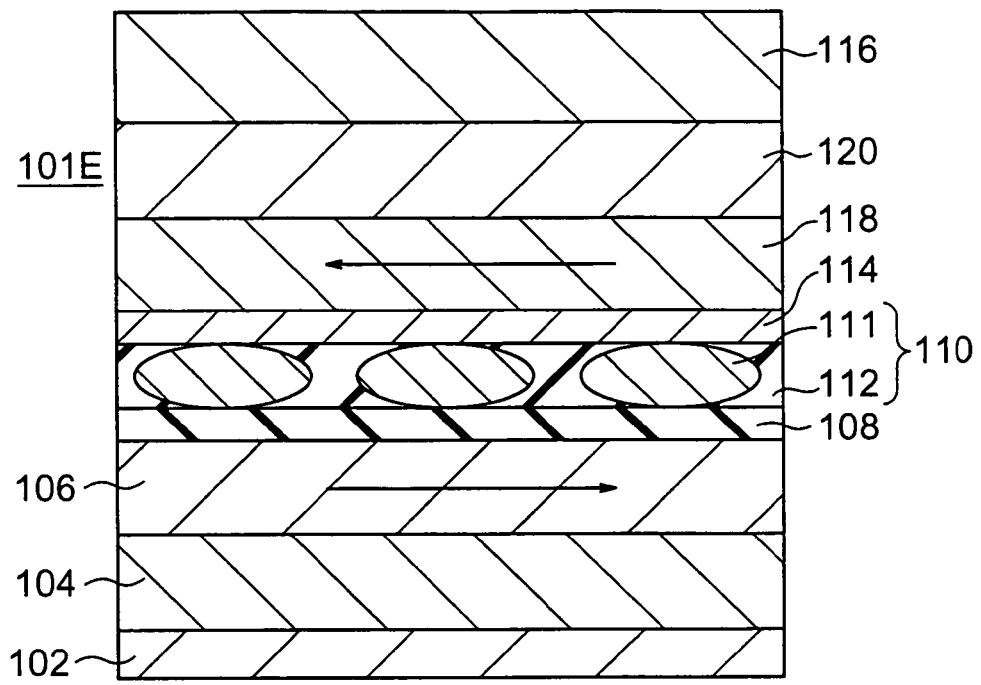
FIG. 42 is a sectional view showing a constitution of a magneto-resistance effect element according to a twentieth embodiment of the present invention.

Next, a magneto-resistance effect element according to an twentieth embodiment of the invention is shown in FIG. 42. A magneto-resistance effect element 101E according to the twentieth embodiment has such a constitution that a ferromagnetic layer 118 and an anti-ferromagnetic layer 120 fixing magnetization of the ferromagnetic layer 118 through exchange coupling with the ferromagnetic layer 118 are provided between the non-magnetic layer 114 and the upper electrode 116 in the magneto-resistance effect element 101 of the sixteenth embodiment shown in FIG. 36. An direction of magnetization of the ferromagnetic layer 106 constituting the magnetization pinned layer and that of the ferromagnetic layer 118 constituting the magnetization pinned layer are different from each other by an angle of about 180°. In the embodiment, the non-magnetic layer 114 constitutes a non-magnetic metal layer made from Cu or Cu alloy.

Since the directions of magnetization of the ferromagnetic layer 106 and the ferromagnetic layer 118 are different from each other by an angle of about 180° in FIG. 42, a case where spin injection is performed from the magnetization pinned layer 106 to the magnetization pinned layer 118 and a case where spin injection is performed in a reversed manner are different in direction of magnetization of the magnetic recording layer 110.

That is, in the embodiment, when electrons are injected from the magnetization pinned layer 106 to the magnetic recording layer in order to spin-reverse spin moment (magnetization) among the magnetization pinned layer 106, the tunnel barrier layer 108, and the magnetic recording layer 110 from anti-parallel to parallel, electrons spin-polarized in the magnetization pinned layer 106 tunnel the tunnel barrier layer 108 to apply spin torque on the magnetic recording layer 110. At that time, since spin-polarized electrons flow into the magnetization pinned layer 118 from the magnetic recording layer 110 via the non-magnetic metal layer 114, while spin in the magnetic recording layer 110 is anti-parallel to spin in the magnetization pinned layer 106, reflection spin electrons reflected by the magnetization pinned layer 118 apply spin torque on the magnetic recording layer 110 due to that spins in the magnetic recording layer 110 and in the magnetization pinned layer 118 are parallel, and spin in the magnetic recording layer 110 is reversed to spin in the magnetization pinned layer 106 from anti-parallel to parallel. A direction of spin in the magnetic recording layer changes due to the two spin torques.

In the embodiment, when electrons are injected from the magnetization pinned layer 118 to the magnetic recording layer 110 in order to spin-reverse spin moment (magnetization) among the magnetization pinned layer 106, the tunnel barrier layer 108, and the magnetic recording layer 110 from parallel to anti-parallel, electrons spin-polarized in the magnetization pinned layer 118 pass through the non-magnetic metal layer 114 to apply spin torque on the magnetic recording layer 110. At that time, spin-polarized electrons are forced to tunnel the tunnel barrier layer 108 to flow into the magnetization pinned layer 106. However, when the electrons tunnel the tunnel barrier layer 108, electrons with the same spin direction as that in the magnetization pinned layer 106 flow easily owing to a high tunneling probability, but electrons with anti-parallel spin are reflected. Electrons reflected by the magnetic recording layer 110 apply spin torque on the magnetic recording layer 110, so that spin in the magnetic recording layer 110 is reversed from parallel spin to anti-parallel spin due to the two spin torques.

Accordingly, in the magneto-resistance effect element 101E of the embodiment, spin injection writing can be made possible by changing a current flow direction, so that writing of "1" or "0" can be performed.

In the embodiment, the magnetization pinned layer 118 and the anti-ferromagnetic layer 120 constitute a reflecting layer to electrons spin-polarized.

In the magneto-resistance effect element of the embodiment, even if spin-polarized current is caused to flow at a writing time, annular magnetic field due to the writing current is very small, so that magnetization of the magnetic recording layer is also reversed stably in the magnetic recording layer 110 with a large element size, and a writing operation can be performed securely in the same manner as the sixteenth embodiment.

(Modification)

Figure 43:
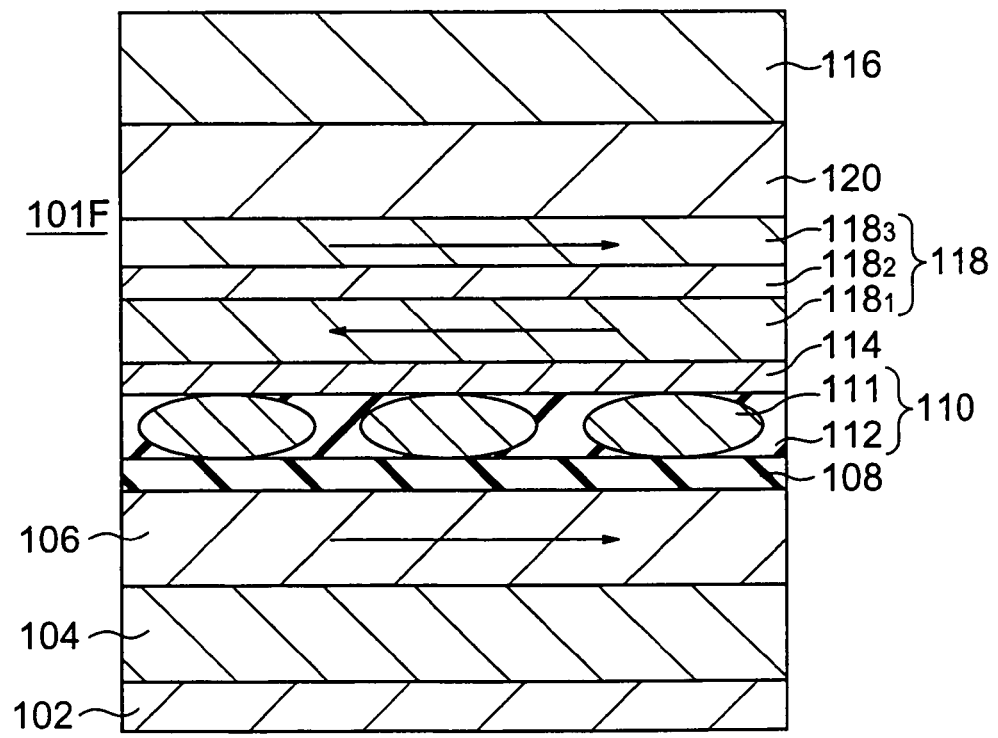
FIG. 43 is a sectional view showing a constitution of a magneto-resistance effect element according to a modification of the twentieth embodiment of the present invention.

A magneto-resistance effect element according to a modification of the embodiment is shown in FIG. 43. A magneto-resistance effect element 101F according to the modification has such a constitution that the magnetization pinned layer 118 is replaced with a magnetization pinned layer 118 with a stacked structure constituted of a magnetic layer $118_1$, a non-magnetic layer $118_2$, and a magnetic layer $118_3$ in the magneto-resistance effect element of the twentieth embodiment. A magnetization direction in the magnetic layer $118_1$ on the side of the magnetic recording layer 110 and that in magnetization pinned layer 106 are different from each other by 180°.

In the magneto-resistance effect element 101F of the modification, spin injection writing can be performed by changing a current flow direction so that writing of "1" or "0" can be performed like the twentieth embodiment. Even if spin-polarized current is caused to flow at a writing time, annular magnetic field due to the writing current is very small, so that magnetization of the magnetic recording layer is also reversed stably in the magnetic recording layer 110 with a large element size, and a writing operation can be performed securely.

In the modification, when the non-magnetic layer 114 is made from Cu or Cu alloy, it is preferable that the non-magnetic layer $118_2$ includes at least one element selected from the group consisting of Cr, Ru, Os, Re, and Rh.

As one method for setting directions of magnetic moments of the magnetization pinned layer 106 and the magnetization pinned layer 118 to be different from each other by an angle of about 180°, as shown in FIG. 42, anti-ferromagnetic layers 104 and 120 whose Neel temperatures $T_N$ are different from each other are applied to the magnetization pinned layers 106 and 118, and magnetic field applying direction is rotated by 180° at a proper temperature between the Neel temperatures of the anti-ferromagnetic layer 104 and the anti-ferromagnetic layer 120 during cooling after anneal processing has been conducted in magnetic field. Another method can be realized by constituting one of the magnetization pinned layers 106 and 118 in such a multi-layered structure (three layered structure in FIG. 43) that a magnetic layer and a non-magnetic layer are alternatively stacked and the uppermost layer and the lowermost layer in the stacked layers are magnetic layers, and setting interaction between the magnetic layers via the non-magnetic layer to have anti-ferromagnetic interaction, as shown in FIG. 43. In the modification, the magnetization pinned layer 118 and the anti-ferromagnetic layer 120 constitute a reflecting layer to spin-polarized electrons.

The magneto-resistance effect elements of the twentieth embodiment and the modification thereof can be used as magnetic storage elements (magneto-resistance effect elements) in the magnetic memories, for example, shown in FIGS. 38 and 39. In this case, it is preferable that a volume of the magnetization pinned layer is made preferably large in order to maintain stability of magnetization of the magnetization pinned layer at a spin injection writing time like the eighteenth and nineteenth embodiments.

In the twentieth embodiment and the modification thereof, the reflecting layer to spin-polarized electrons is provided, but the non-magnetic layer 114 can be caused to function as a reflecting layer which reflects spin current in a direction reversed to magnetization in the magnetic recording layer 110 by limiting material for the non-magnetic layer 114 in each of the magneto-resistance effect elements shown in FIGS. 36 to 41.

Specifically, when the magnetic recording layer 110 is made from ferromagnetic material which is Co-rich, it is preferable that material for the non-magnetic layer 114 includes at least one element selected from the group consisting of Cr, Ru, Ir, Os, and Re, or it is alloy thereof.

When the magnetic recording layer 110 is made from ferromagnetic material which is Fe-rich, it is preferable that material for the non-magnetic layer 114 includes at least one element selected from the group consisting of Cr, Ru, Os, Re, W, Mn, V, Ti, and Mo or it is alloy thereof.

When the magnetic recording layer 110 is made from ferromagnetic material which is Ni-rich, it is preferable that material for the non-magnetic layer 114 includes at least one element selected from the group consisting of Cr, Ru, Os, Re, Rh, Ir, W, Nb, V, Ta, and Mo or it is alloy thereof.

As understood from the above, in case that spin injection writing is performed, when the magnetic recording layer 110 includes Ni—Co, Ni—Fe, Co—Fe, or Co—Fe—Ni, material desirable for the non-magnetic layer 114 includes at least one element selected from the group consisting of Cr, Ru, Os, and Re, or it is alloy thereof. By using these material, a current at a spin injection writing time can be reduced.

Twenty-First Embodiment

Figure 44:
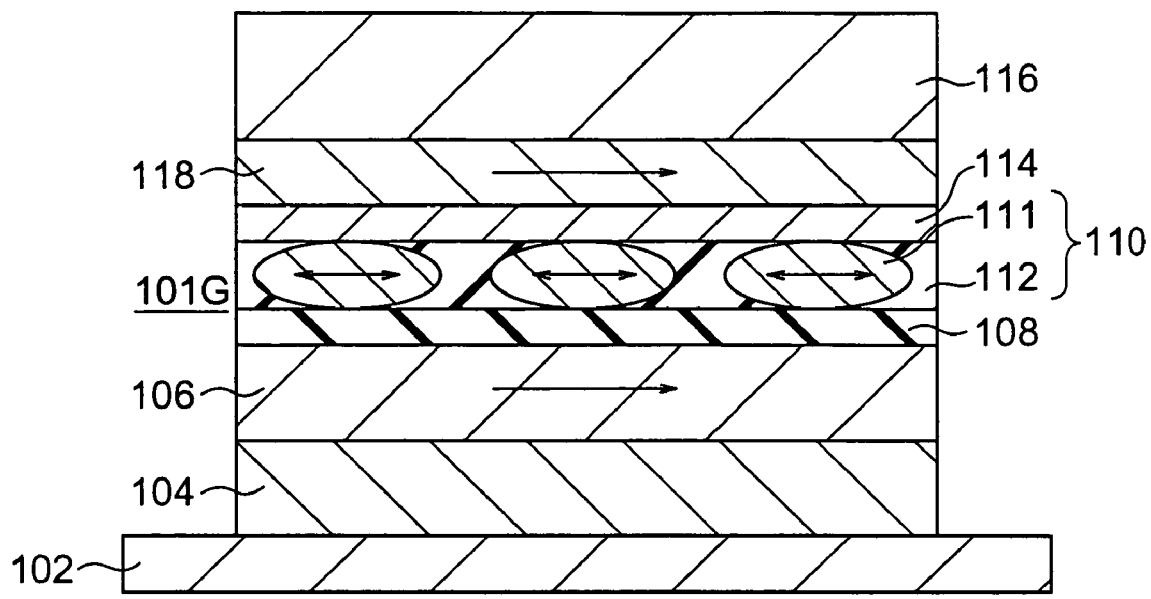
FIG. 44 is a sectional view showing a constitution of a magneto-resistance effect element according to a twenty-first embodiment of the present invention.

Next, a magneto-resistance effect element according to a twenty-first embodiment of the invention is shown in FIG. 44. A magneto-resistance effect element 101G of the embodiment has such a constitution that the non-magnetic layer 114 is caused to function as a reflecting layer which reflects a spin current in a direction reverse to magnetization of the magnetic recording layer 110 by limiting material for the non-magnetic layer 114 and a ferromagnetic layer 118 fixed on a face of the non-magnetic layer 114 opposed from the magnetic recording layer 110 such that a magnetization direction thereof is parallel to that in the magnetization pinned layer 106 is provided in the magneto-resistance effect element 101 of the sixteenth embodiment. Since the ferromagnetic layer 118 has a function serving as the reflecting layer to spin-polarized electrons, it is made possible to reflect spin-polarized electrons more effectively than the case where the non-magnetic layer 114 is used as the reflecting layer, which allows reduction of a density of current required for reversion of magnetization of the magnetic recording layer 110.

In the embodiment, the following materials can be used for causing the non-magnetic layer 114 to function as the reflecting layer.

Specifically, when the ferromagnetic layer 118 is made from ferromagnetic material which is Co-rich, it is preferable that material for the non-magnetic layer 114 includes at least one element selected from the group consisting of Cr, Ru, Ir, Os, and Re, or it is alloy thereof.

When the ferromagnetic layer 118 is made from ferromagnetic material which is Fe-rich, it is preferable that material for the non-magnetic layer 114 includes at least one element selected from the group consisting of Cr, Ru, Os, Re, W, Mn, V, Ti, and Mo or it is alloy thereof.

When the ferromagnetic layer 118 is made from ferromagnetic material which is Ni-rich, it is preferable that material for the non-magnetic layer 114 includes at least one element selected from the group consisting of Cr, Ru, Os, Re, Rh, Ir, W, Nb, V, Ta, and Mo or it is alloy thereof.

As understood from the above, in case that spin injection writing is performed, when the ferromagnetic layer 118 includes Ni—Co, Ni—Fe, Co—Fe, or Co—Fe—Ni, material desirable for the non-magnetic layer 114 includes at least one element selected from the group consisting of Cr, Ru, Os, and Re, or it is alloy thereof. By using these material, a current at a spin injection writing time can be reduced.

In the magneto-resistance effect element of the embodiment, even if spin-polarized current is caused to flow at a writing time, annular magnetic field due to the writing current is very small, so that magnetization of the magnetic recording layer is also reversed stably in the magnetic recording layer 110 with a large element size, and a writing operation can be performed securely in the same manner as the sixteenth embodiment.

(First Modification)

Figure 45:
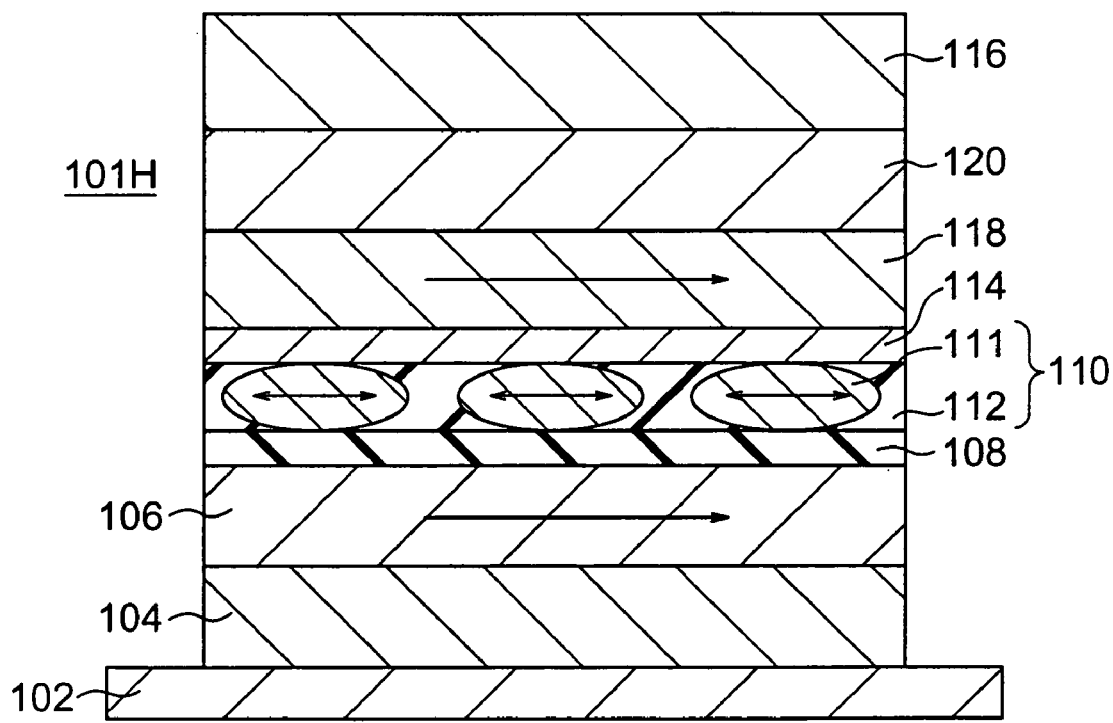
FIG. 45 is a sectional view showing a constitution of a magneto-resistance effect element according to a first modification of the twenty-first embodiment of the present invention.

Next, a magneto-resistance effect element according to a first modification of the twenty-first embodiment is shown in FIG. 45. A magneto-resistance effect element 101H according to the first modification has such a constitution that an anti-ferromagnetic layer 120 fixing direction of magnetization of the ferromagnetic layer 118 is provided between the ferromagnetic layer 118 and the upper electrode 116 in the magneto-resistance effect element 101G of the twenty-first embodiment. Thereby, magnetization of the ferromagnetic layer 118 is made more stable than that in the twenty-first embodiment.

In the first modification, even if spin-polarized current is caused to flow at a writing time, annular magnetic field due to the writing current is very small, so that magnetization of the magnetic recording layer is also reversed stably in the magnetic recording layer 110 with a large element size, and a writing operation can be performed securely in the same manner as the twenty-first embodiment.

(Second Modification)

Figure 46:
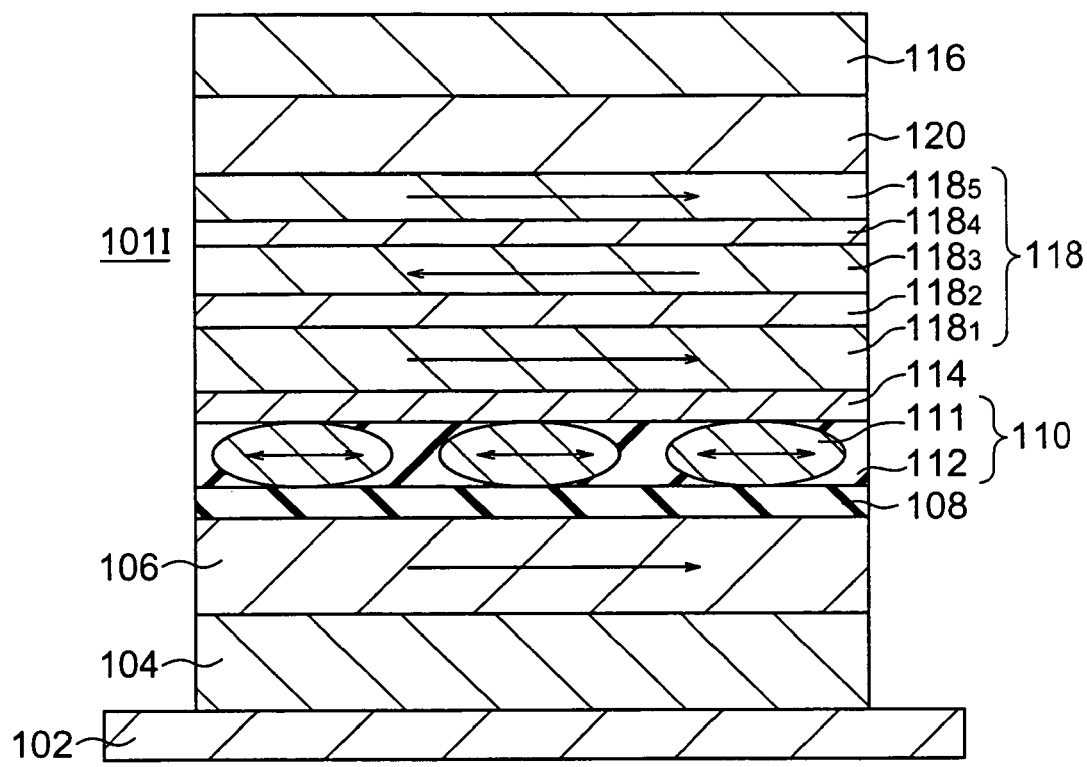
FIG. 46 is a sectional view showing a constitution of a magneto-resistance effect element according to a second modification of the twenty-first embodiment of the present invention.

Next, a magneto-resistance effect element according to a second modification of the twenty-first embodiment is shown in FIG. 46. A magneto-resistance effect element 101I according to the second modification has such a constitution that the ferromagnetic layer 118 has a stacked structure constituted of a ferromagnetic layer $118_1$, a non-magnetic layer $118_2$, a ferromagnetic layer $118_3$, a non-magnetic layer $118_4$, and a ferromagnetic layer $118_5$ in the magneto-resistance effect element 101H according to the first modification. Magnetization of each of the ferromagnetic layer $118_1$ and the ferromagnetic layer $118_5$ is pinned in the same direction as that of magnetization of the magnetization pinned layer 106, namely, direction of the former is fixed to be parallel to direction of the latter, and magnetization of the ferromagnetic layer $118_3$ is pined to direction reverse to magnetization direction of the magnetization pinned layer 106, namely, the direction of the former is anti-parallel to the direction of the latter. That is, the ferromagnetic layer 118 has a synthetic anti-ferromagnetic coupling. The ferromagnetic layer 118 can be formed to have a volume larger than that in the first modification, which results in further stabilization of magnetization.

In the second modification, even if spin-polarized current is caused to flow at a writing time, annular magnetic field due to the writing current is very small, so that magnetization of the magnetic recording layer is also reversed stably in the magnetic recording layer 110 with a large element size, and a writing operation can be performed securely in the same manner as the first modification.

(Third Modification)

Figure 47:
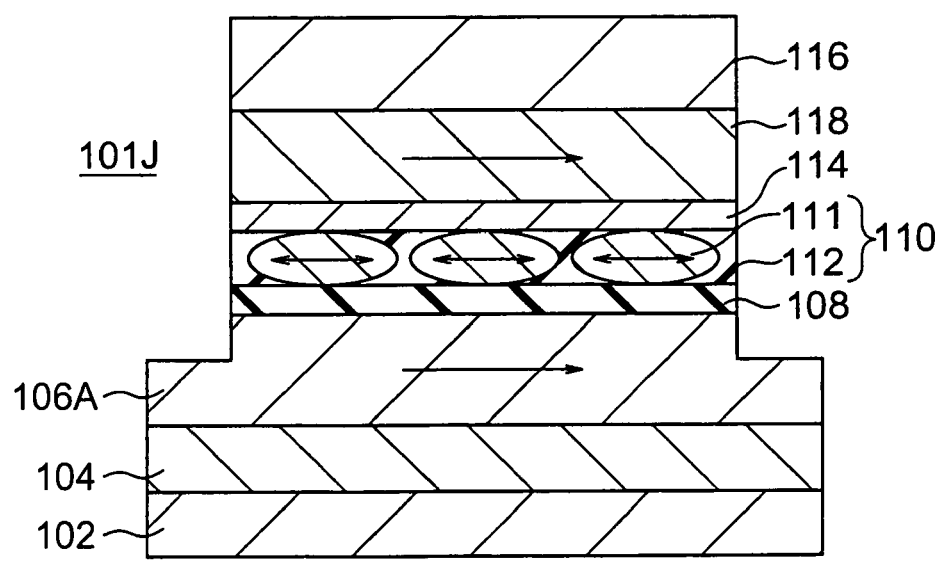
FIG. 47 is a sectional view showing a constitution of a magneto-resistance effect element according to a third modification of the twenty-first embodiment of the present invention.

Next, a magneto-resistance effect element according to a third modification of the twenty-first embodiment is shown in FIG. 47. A magneto-resistance effect element 101J according to the third modification has such a constitution that the ferromagnetic layer 106 serving as the magnetization pinned layer is replaced by a ferromagnetic layer 106A in the magneto-resistance effect element 101G of the twenty-first embodiment. The ferromagnetic layer 106A is constituted such that it has the same junction area with the tunnel barrier layer 108 as that in the second modification but the former volume is larger than the latter volume. Accordingly, in the third modification, a volume of the ferromagnetic layer 106A constituting the magnetization pinned layer is larger than that in the twenty-first embodiment. Therefore, magnetization of magnetization pinned layer at a spin injection writing time is further stabilized as compared with that in the sixteenth embodiment.

In the third modification, even if spin-polarized current is caused to flow at a writing time, annular magnetic field due to the writing current is very small, so that magnetization of the magnetic recording layer is also reversed stably in the magnetic recording layer 110 with a large element size, and a writing operation can be performed securely in the same manner as the twenty-first embodiment.

Twenty-Second Embodiment

Figure 48:
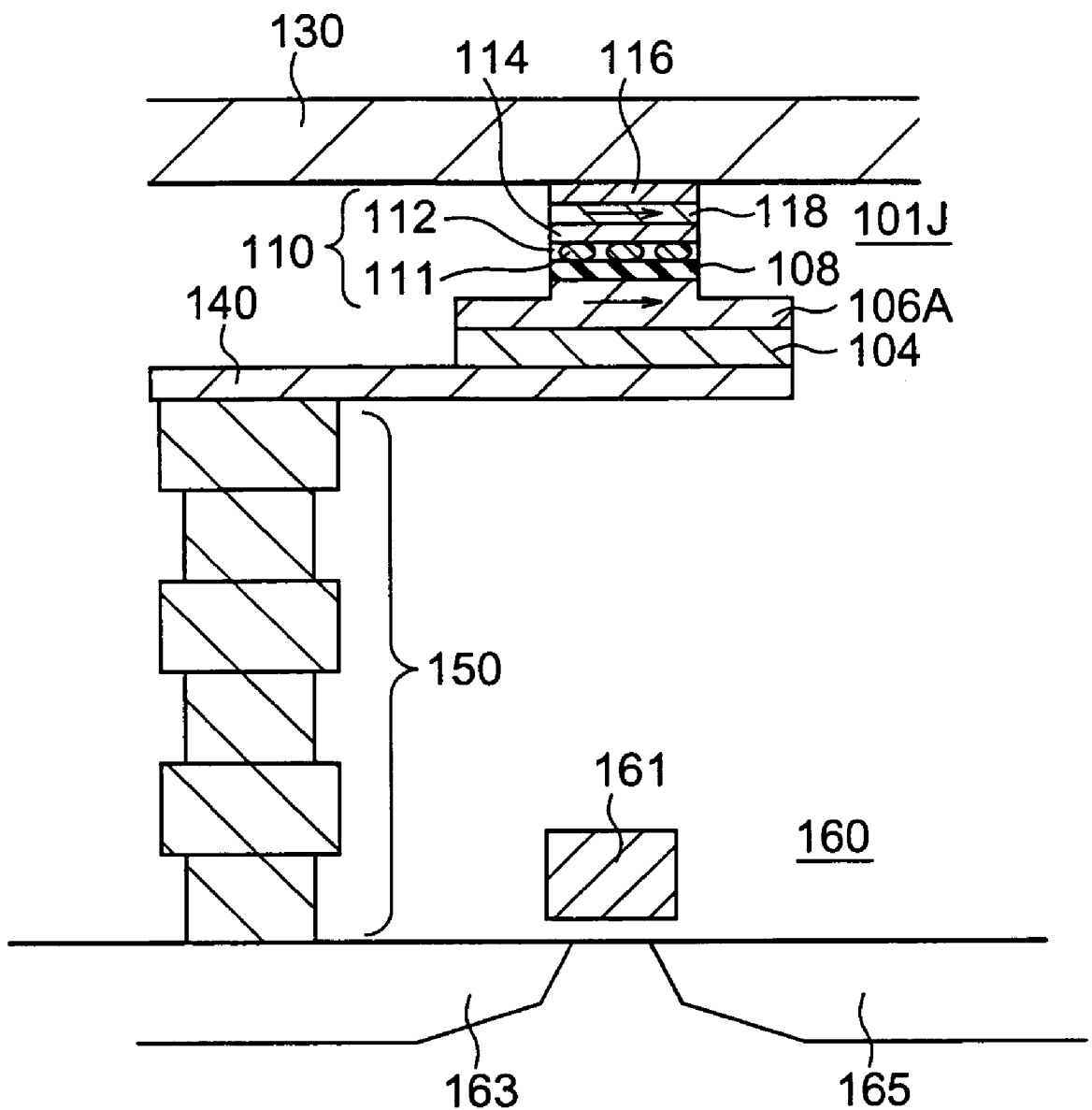
FIG. 48 is a sectional view showing a constitution of a magnetic memory according to a twenty-second embodiment of the present invention.

Next, a magnetic memory according to a twenty-second embodiment of the invention is shown in FIG. 48. A magnetic memory according to the embodiment has such a constitution that the magneto-resistance effect element 101A is replaced by the magneto-resistance effect element 101J according to the third modification of the twenty-first embodiment in the magnetic memory of the eighteenth embodiment.

Since the magnetic memory of the embodiment is provided with the magneto-resistance effect element 101J according to the third modification of the twenty-first embodiment as a memory element, even if spin-polarized current is caused to flow at a writing time, annular magnetic field due to the writing current is very small, so that magnetization of the magnetic recording layer is also reversed stably in the magnetic recording layer 110 with a large element size, and a writing operation can be performed securely in the same manner as the third modification of the twenty-first embodiment. Incidentally, it is desirable that the volume of the magnetization pinned layer is made relatively large in order to maintain stability of magnetization of the magnetization pinned layer at a time of spin injection writing.

In the magnetic memory according to the embodiment, though the magneto-resistance effect element according to the third modification of the twenty-first embodiment is used as the magnetic storage or recording element, the magneto-resistance effect element according to the twenty-first embodiment, the first modification, or the second modification may be used as the magnetic storage or recording element.

(Modification)

Figure 49:
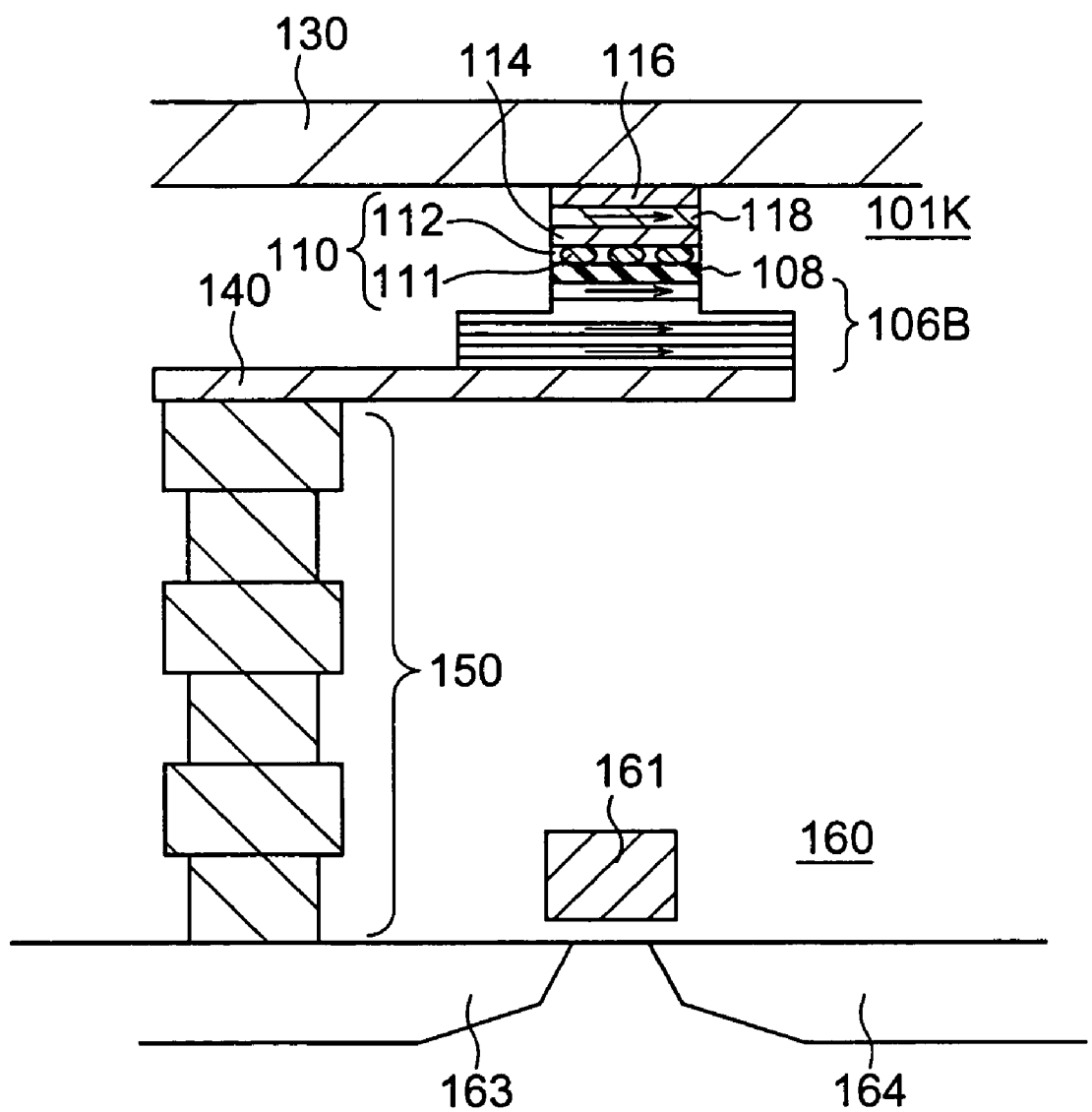
FIG. 49 is a sectional view showing a constitution of a magnetic memory according to a modification of the twenty-second embodiment of the present invention.

Next, a magnetic memory according to a modification of the twenty-second embodiment is shown in FIG. 49. A magnetic memory according to the modification has such a constitution that the magneto-resistance effect element 101J is replaced with a magneto-resistance effect element 101K in the magnetic memory according to the twenty-second embodiment. The magneto-resistance effect element 101K has such a constitution that the anti-ferromagnetic layer 104 and the magnetization pinned layer 106A in the magneto-resistance effect element 101J are replaced with a stacked film 106B where an anti-ferromagnetic layer and a ferromagnetic layer are alternatively stacked. The ferromagnetic layer in the stacked film 106B has magnetization pinned by exchange coupling with the anti-ferromagnetic layer to serve as a magnetization pinned layer. A shape of the stacked film constituted of the anti-ferromagnetic layer 104 and the magnetization pinned layer 106A in the twenty-second embodiment is approximately the same as that of the stacked film 106B of the modification. The stacked film 106B must be constituted such that a layer coming in contact with the tunnel barrier layer 108 is a ferromagnetic layer, but a layer coming in contact with the leading electrode 140 may be constituted so as to be a ferromagnetic layer or an anti-ferromagnetic layer.

In the modification, even if spin-polarized current is caused to flow at a writing time, an annular magnetic field due to the writing current is very small, so that magnetization of the magnetic recording layer is also reversed stably in the magnetic recording layer 110 with a large element size, and a writing operation can be performed securely in the same manner as the twenty-second embodiment. Since a total volume of the stacked film 106B constituting the magnetization pinned layer in the modification is larger than a volume of the magnetization pinned layer 106A in the twenty-second embodiment, magnetization of the magnetization pinned layer at a spin injection writing can be kept more stable than that in the twenty-second embodiment.

Twenty-Third Embodiment

Figure 50:
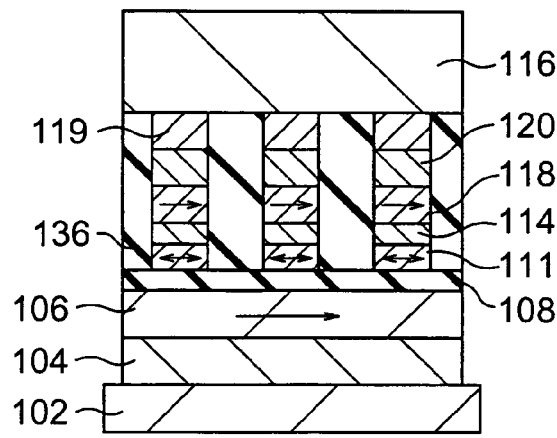
FIG. 50 is a sectional view showing a constitution of a magneto-resistance effect element according to a twenty-third embodiment of the present invention.

Next, a magneto-resistance effect element according to a twenty-third embodiment of the invention is shown in FIG. 50. In each of the magneto-resistance effect elements according to the sixteenth embodiment to the twenty-second embodiment, the non-magnetic layer 114, the ferromagnetic layer 118, the anti-ferromagnetic layer 120, and the like provided on the magnetic recording layer including the ferromagnetic particles spaced by the dielectric are continuous films, but a magneto-resistance effect element 101L according to this embodiment constitutes a column-shaped structural portion where a non-magnetic layer 114, a ferromagnetic layer 118 whose magnetization has been fixed, an anti-ferromagnetic layer 120, and a metal contact layer 119 are stacked on the ferromagnetic layer 111 constituting a magnetic recording layer. That is, the magnetic recording layer or ferromagnetic layer 111, the non-magnetic layer 114, the ferromagnetic layer 118, the anti-ferromagnetic layer 120, and the metal contact layer 119 are stacked to constitute the column-shaped structural portion, and a plurality of the column-shaped stacked structural portions are respectively provided on the tunnel barrier layer 108 so as to be spaced from one another. The plurality of column-shaped stacked structural portions are insulated from one another by interlayer insulating films 136. The metal contact layer 119 of each stacked structural portion is connected to a common upper electrode 116. The tunnel barrier layer 108 is provided on the magnetization pinned layer 106, the magnetization pinned layer 106 is provided on the anti-ferromagnetic layer 104, and the anti-ferromagnetic layer 104 is provided on the background layer 102. Magnetization direction of the ferromagnetic layer 118 is pinned to the same direction as the magnetization direction of the magnetization pinned layer 106, namely to be parallel thereto. Therefore, the non-magnetic layer 114 can be made from each material explained regarding the twenty-first embodiment, that is, material selected according to the material for the ferromagnetic layer 118.

In the magneto-resistance effect element of the embodiment thus constituted, since an effective junction area of the ferromagnetic tunnel junction is defined by a projection area of the plurality of ferromagnetic layers 111 to the ferromagnetic layer 106 in a direction perpendicular to the film face, an effective junction area is smaller than a continuous film of the magnetic recording layer made from the ferromagnetic material. Therefore, even if spin-polarized current is caused to flow at a writing time, an annular magnetic field due to the writing current is not generated, so that magnetization of the magnetic recording layer is also reversed stably in the magnetic recording layer 110 with a large element size, and a writing operation can be performed securely.

In the embodiment, the column-shaped stacked structural portion is constituted of the magnetic recording layer 111, the non-magnetic layer 114, the ferromagnetic layer 118, the anti-ferromagnetic layer 120, and the metal contact layer 119, but it may include the tunnel barrier layer 108 or may include a portion of the magnetization pinned layer 106.

Next, a method for manufacturing the magneto-resistance effect element of the twenty-third embodiment will be explained with reference to FIGS. 51A to 54C. The manufacturing method employs a patterned media producing process.

Figure 51A:
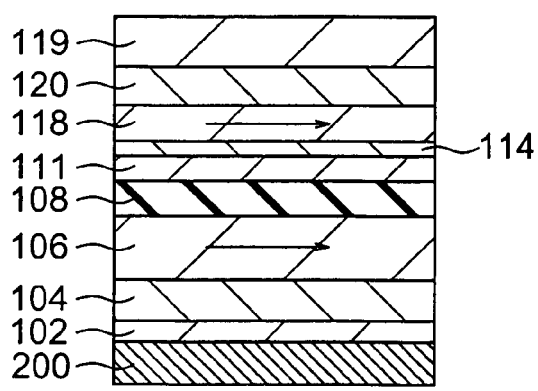
FIGS. 51A and 51B are sectional views showing manufacturing steps of a magneto-resistance effect element according to a twenty-third embodiment of the invention.
Figure 51B:
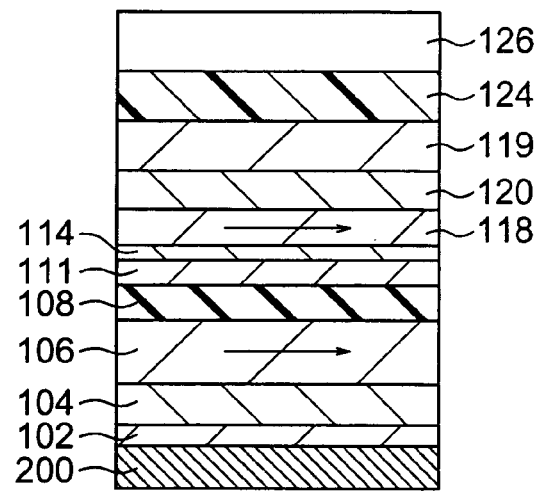

As shown in FIG. 51A, first of all, a background layer 102, an anti-ferromagnetic layer 104, a ferromagnetic layer 106 whose magnetization has been fixed, a tunnel barrier layer 108, a ferromagnetic layer 111, a non-magnetic layer 114, a ferromagnetic layer 118, an anti-ferromagnetic layer 120, and a metal contact layer 119 is stacked on a non-magnetic substrate 200. Subsequently, as shown in FIG. 51B, a photoresist 124 is applied on the metal contact layer 119 and the photoresist 124 is hard-baked. Thereafter, a solution obtained by dissolving di-block copolymer 126 in organic solvent is formed on the photoresist 124 by a spin coat process (refer to FIG. 51B).

Figure 52A:
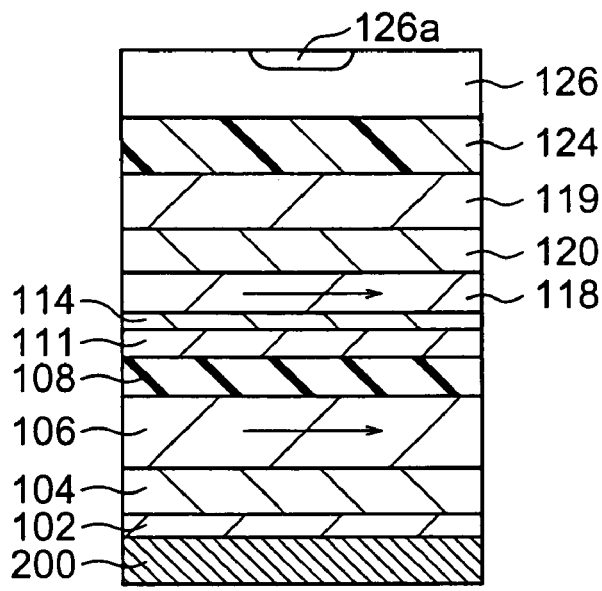
FIGS. 52A and 52B are sectional views showing manufacturing steps of a magneto-resistance effect element according to the twenty-third embodiment of the invention.
Figure 52B:
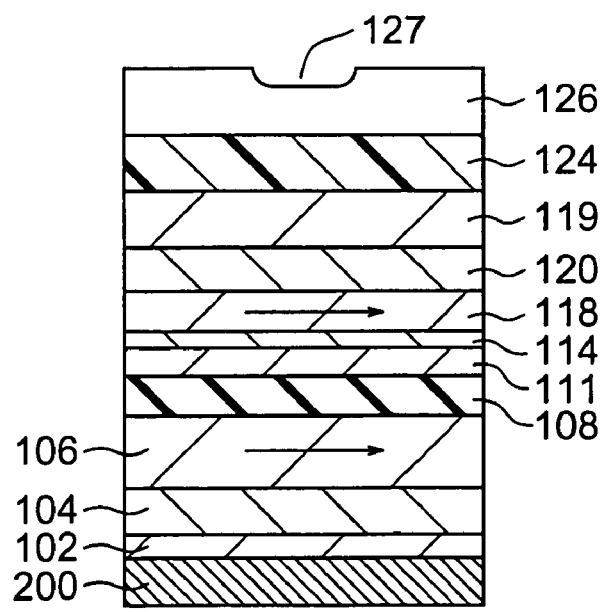

Next, a long time annealing is performed under vacuum for 30 hours at a temperature of about 140° C. to 200° C. Thereby, the di-block copolymer 126 causes phase separation due to the self organization during the annealing, so that island structures with a size of 15 nm to 30 nm align at intervals of several tens nm (refer to FIG. 52A). Incidentally, for simplification in explanation, only one island structure is shown in FIG. 52A. The pattern forming process using the self organizing phenomenon allows a large area patterning at a lower cost in shorter time as compared with an ordinary pattern forming process such as EB (electron beam) writing, photolithography, X-ray lithography, near field photolithography, interference exposing process, or FIB (Focused Ion Beam). Thereafter, exposure to oxygen plasma is performed and only a di-block polymer portion 126a is selectively removed. A hole or recess 127 is formed at a portion where the di-block copolymer portion 126a has been removed (refer to FIG. 52B).

Next, when application of SOG (spin on glass) diluted with lactic acid is performed using spin coat process, SOG 128 is filled in the hole 127 (refer to FIG. 53A). Thereafter, the photoresist 124 and the di-block copolymer 126 are patterned by applying RIE (Reactive Ion Etching) thereto using oxygen plasma and utilizing the SOG 128 as a mask. At that time, a portion of the photoresist except for a portion thereof coated with the SOG is removed. Patterning is performed down to an intermediate portion of the ferromagnetic layer 106 by applying ion milling using an etching mask formed of the patterned resist and the SOG 128, as shown in FIG. 53B. Subsequently, after the etching mask is removed, a protective film 134 constituted of AlOx or SiOx is immediately formed (refer to FIG. 53C).

Figure 54C:
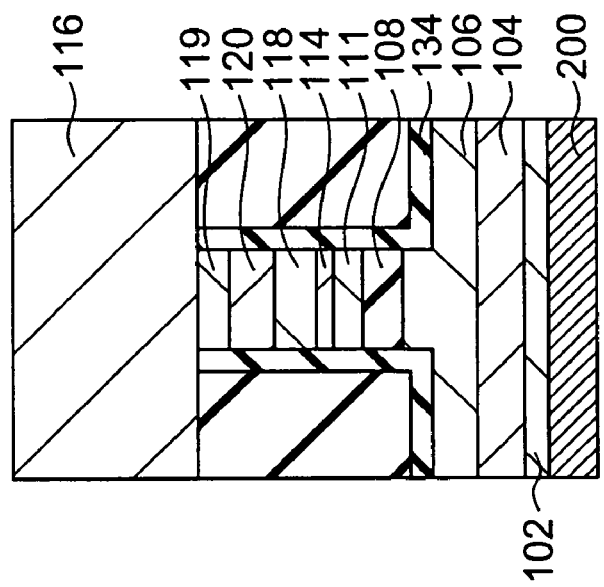
FIGS. 54A to 54C are sectional views showing manufacturing steps of a magneto-resistance effect element according to the twenty-third embodiment of the invention.
Figure 54B:
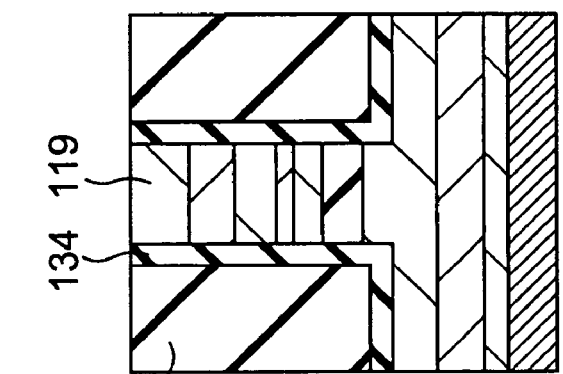
Figure 54A:
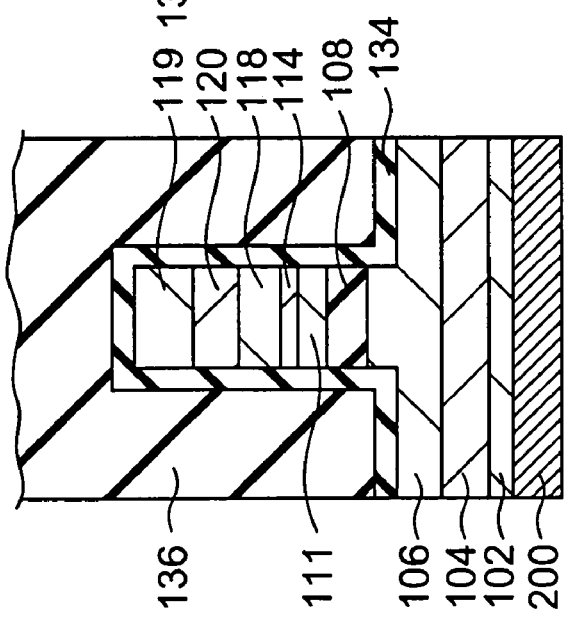

Next, as shown in FIG. 54A, an interlayer insulating film 136 is formed by applying SOG on a whole surface of the protective film 134 to perform baking. Thereafter, the interlayer insulating film 136 is etched back to expose a surface of the metal contact layer 119 (refer to FIG. 54B). Subsequently, an upper electrode 116 is formed by forming a non-magnetic metal film and patterning the same (refer to FIG. 54C). Thereby, a magneto-resistance effect element according to the embodiment is manufactured.

Figure 55:
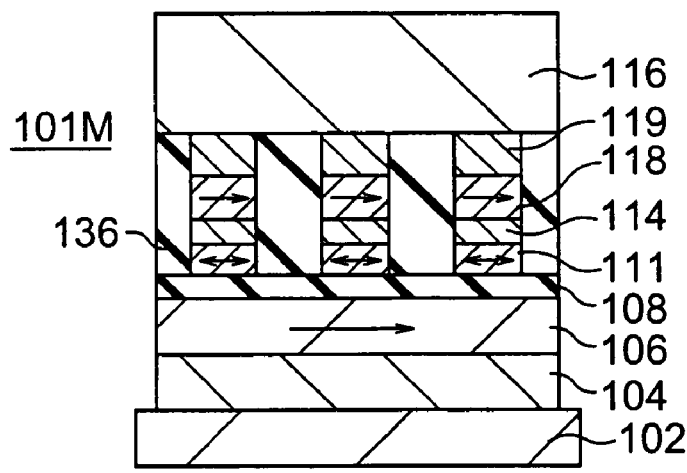
FIG. 55 is a sectional view showing a constitution of a magneto-resistance effect element according to a first modification of the twenty-third embodiment of the present invention.

A magneto-resistance effect element 101M with a structure shown in FIG. 55 can be obtained by utilizing the above manufacturing method. The magneto-resistance effect element 101M has a constitution that the anti-ferromagnetic layer 120 has not been provided in the magneto-resistance effect element 101L of the embodiment shown in FIG. 50. A magneto-resistance effect element 101N with a structure shown in FIG. 56 can be obtained. The magneto-resistance effect element 101N has a constitution that the ferromagnetic layer 118 is replaced with a stacked film 118 where a ferromagnetic layer $118_1$, a non-magnetic layer $118_2$, and a ferromagnetic layer $118_3$ are stacked in the magneto-resistance effect element 101L of the embodiment shown in FIG. 50. Magnetization direction of the ferromagnetic layer $118_1$ near to the magnetic recording layer 111 is the same as magnetization direction of the magnetization pinned layer 106, namely, parallel thereto, and magnetization direction of the ferromagnetic layer $118_3$ is reversed to magnetization direction of the magnetization pinned layer 106, namely, anti-parallel thereto. Therefore, the ferromagnetic layer 118 has a synthetic anti-ferromagnetic coupling.

Figure 56:
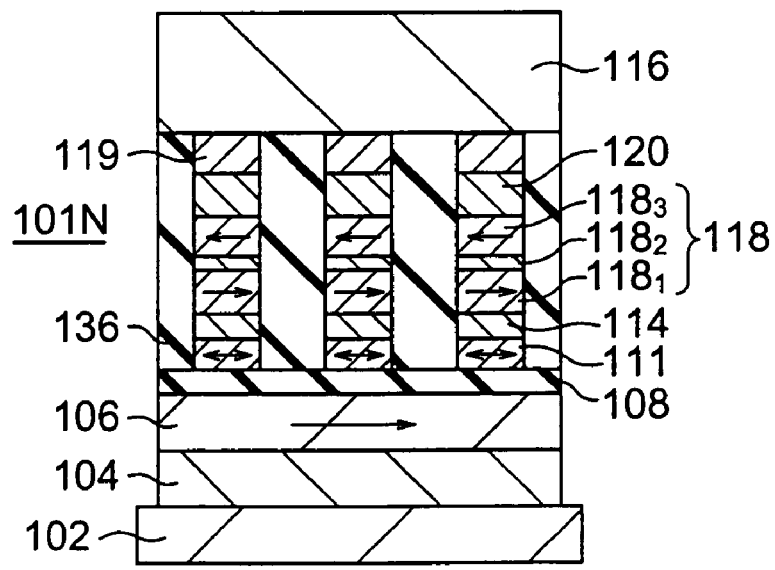
FIG. 56 is a sectional view showing a constitution of a magneto-resistance effect element according to a second modification of the twenty-third embodiment of the present invention.

In the magneto-resistance effect elements shown in FIGS. 55 and 56, even if spin-polarized current is caused to flow at a writing time, an annular magnetic field due to the writing current is very small, so that magnetization of the magnetic recording layer is also reversed stably in the magnetic recording layer 110 with a large element size, and a writing operation can be performed securely in the same manner as this embodiment. In the magneto-resistance effect element 101N shown in FIG. 56, a volume of the ferromagnetic layer 118 can be made larger than that in the magneto-resistance effect element of this embodiment shown in FIG. 50, so that magnetization is further stabilized.

Each of the magneto-resistance effect element according to the embodiment and those with the structures shown in FIGS. 55 and 56 can be used as a magnetic storage element in the magnetic memory shown in FIG. 38, of course.

By using the above manufacturing method for manufacturing the magneto-resistance effect elements according to the sixteenth to twenty-second embodiments, the non-magnetic layer 114, the ferromagnetic layer 118, the ferromagnetic layer 120 and the like which are provide above the ferromagnetic particles 111 can be constituted in a column-shaped stacked structural portion without forming these layers to continuous layers.

In the sixteenth to twenty-third embodiments, such material as Fe—Mn (iron—manganese), Pt—Mn (platinum—manganese), Pt—Cr—Mn (platinum—chromium—manganese), Ni—Mn (nickel—manganese), Ir—Mn (iridium—manganese), or NiO (nickel oxide), CoO (cobalt oxide) can be used as the anti-ferromagnetic layer.

In the eighteenth, nineteenth, and twenty-second embodiments, one end of the magneto-resistance effect element is electrically connected with a bit line, the other end thereof is connected with a selecting transistor for both reading/writing 160. In this case, reading is performed by turning ON the selecting transistor for both reading/writing 160 and utilizing the tunnel magneto-resistance effect element on the same substrate to make determination about "1" or "0". Writing of "1" or "0" is performed by turning ON the selecting transistor for both reading/writing 160 and performing spin injection writing. In a reading/writing operation performed by spin injection, a reading current is set to be smaller than a writing current. It is considered that an element area can be reduced easily, and spin injection writing is made possible, and spin reversion at a small writing current is made possible owing to the above structure.

In the magnetic memories according to the eighteenth, nineteenth, and twenty-second embodiments, a sense current control element circuit for controlling a sense current flowing in the magneto-resistance effect element, a driver and a sinker are further provided in order to read information stored in the magneto-resistance effect element.

It is desirable that the magnetization pinned layer has an unidirectional anisotropy and the magnetic recording layer has an uniaxial anisotropy. It is preferable that a thickness of each layer is in a range of 0.1 nm to 100 nm. Further, the film thickness of the ferromagnetic layer is required to be set to such a thickness that the layer does not become superparamagnetism and it is preferably 0.4 nm or more.

It is preferable that the ferromagnetic particles spaced from one another by the dielectric which are used as a magnetic recording layer are made from at least one selected from the group consisting of Co—Pt, Co—Fe—Pt, Fe—Pt, Co—Fe—Cr—Pt, and Co—Cr—Pt.

The magnetic recording layer can be adjusted not only in magnetic properties but also in various physical properties such as crystal properties, mechanical properties, chemical properties by adding, in magnetic material, such as a non-magnetic element as Ag (silver), Cu (copper), Au (gold), Al (aluminum), Ru (ruthenium), Os (osmium), Re (rhenium), Ta (tantalum), B (boron), C (carbon), O (oxygen), N (nitrogen), Pd (palladium), Pt (platinum), Zr (zirconium), Ir (iridium), W (tungsten), Mo (molybdenum), or Nb (niobium).

Twenty-Fourth Embodiment

Figure 57:
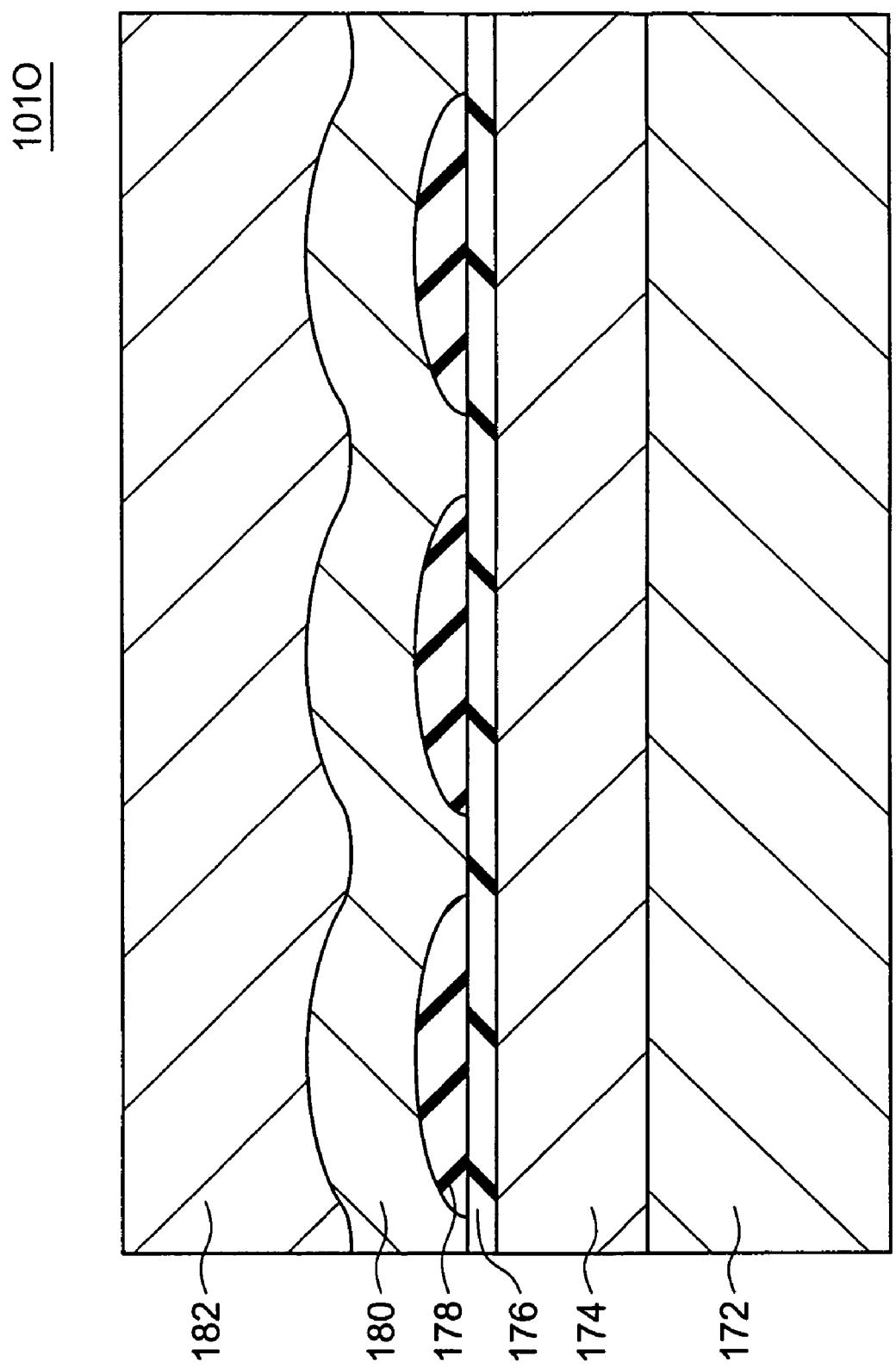
FIG. 57 is a sectional view showing a constitution of a magneto-resistance effect element according to a twenty-fourth embodiment of the present invention.

Next, a constitution of a magneto-resistance effect element according to a twenty-fourth embodiment of the invention is shown in FIG. 57. A magneto-resistance effect element 101O of the embodiment is provided with a lower electrode layer 172 provided on a substrate (not shown), a magnetic recording layer 174 provided on the lower electrode layer 172 and constituted of magnetic substance whose magnetization is variable, a tunnel barrier layer 176 provided on the magnetic recording layer 174, insulating layers 178 discretely provided on the tunnel barrier layer 176, a magnetization pinned layer 180 which is provided so as to cover the tunnel barrier layer 176 and the insulating layers 178 and is made from magnetic substance whose magnetization has been pinned, and an upper electrode layer 182 provided on the magnetic recording layer 180. Incidentally, it is preferable that magnetization of the magnetization pinned layer 180 is pinned by adding an anti-ferromagnetic layer thereto. Each insulating layer 178 may have a thickness equal to one layer of atoms.

Thus, in the embodiment, a total film thickness of an insulator constituted of the tunnel barrier layer 176 and the insulating layer 178 between the magnetic recording layer 174 and the magnetization pinned layer 180 is not uniform. Since the tunnel current density to the thickness of the insulator lowers exponentially, when the film thickness of the insulator is not uniform, a tunnel current flows concentrically to thin portions of the insulator. That is, a density of a current flowing through a region of the tunnel barrier layer 176 provided with the insulating layer 178 is sufficiently low to such an extent that it can be ignored as compared with a density of a tunnel current flowing in a region of the tunnel barrier layer 176 which is not provided with the insulating layer 178. Therefore, a region where the insulator is deposited has a high resistance, so that an area where a tunnel current flows becomes small effectively to an area of an element shape.

As explained above, according to the embodiment, since the area where a tunnel current flows becomes small effectively to the area of an element shape, even if spin-polarized current is caused to flow at a writing time, an annular magnetic field due to the writing current is very small, so that magnetization of the magnetic recording layer is also reversed stably in the magnetic recording layer with a large element size, and a writing operation can be performed securely.

Twenty-Fifth Embodiment

Figure 58:
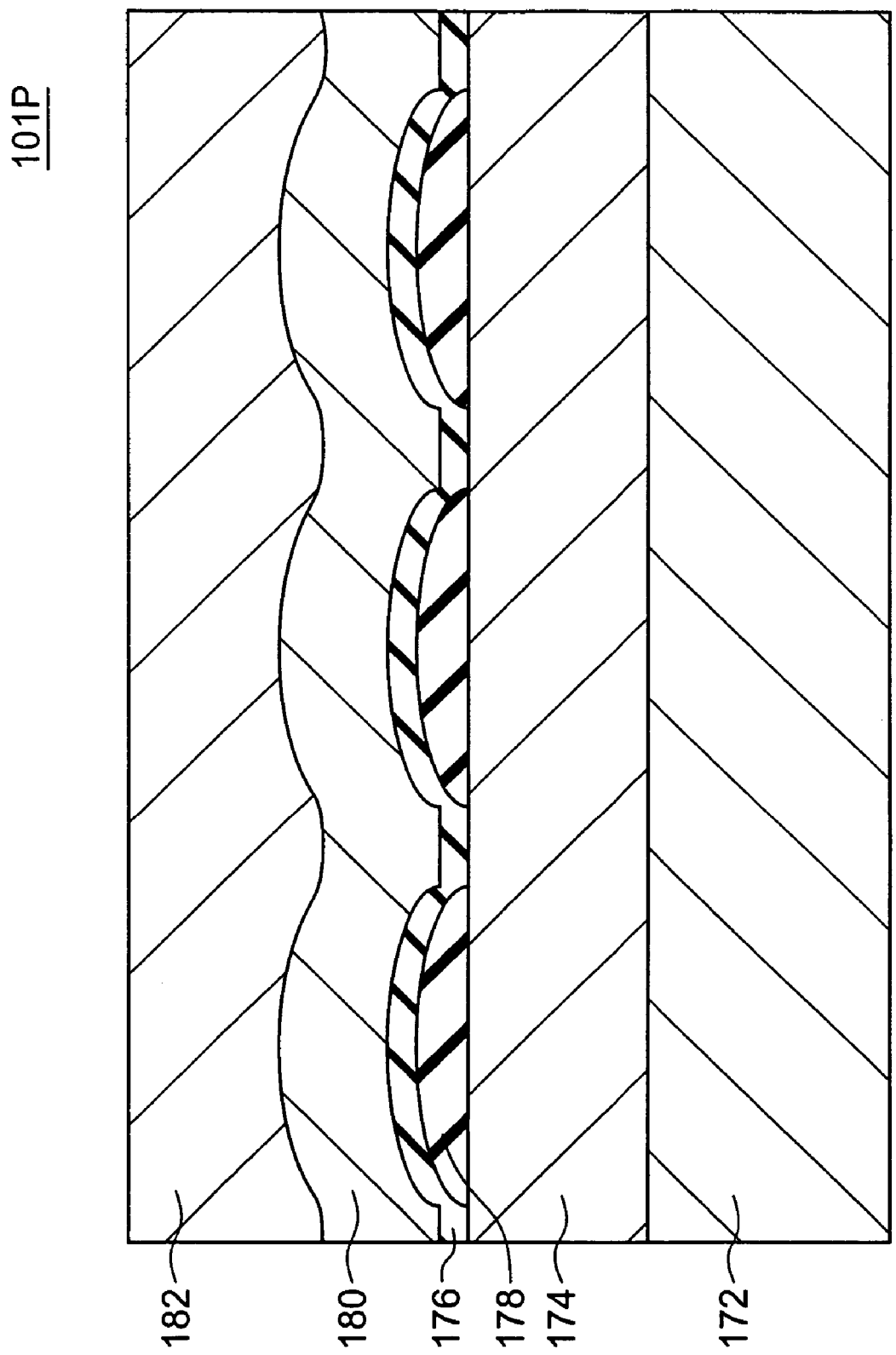
FIG. 58 is a sectional view showing a constitution of a magneto-resistance effect element according to a twenty-fifth embodiment of the present invention.

Next, a magneto-resistance effect element according to a twenty-fifth embodiment in the invention is shown in FIG. 58. A magneto-resistance effect element 101P of the embodiment has such a constitution that the tunnel barrier layer 176 and the insulating layers 178 are arranged in a reversed manner in the magneto-resistance effect element 101O according to the twenty-fourth embodiment. That is, the magneto-resistance effect element 101P of the embodiment is provided with a lower electrode layer 172 provided on a substrate (not shown), a magnetic recording layer 174 provided on the lower electrode layer 172, insulating layers 178 discretely provided the magnetic recording layer 174, a tunnel barrier layer 176 provided so as to cover the magnetic recording layer 174 and the insulating layers 178, a magnetization pinned layer 180 provided on the tunnel barrier layer 176, and an upper electrode layer 182 provided on the magnetic recording layer 180.

In this embodiment, a total film thickness of an insulator constituted of the tunnel barrier layer 176 and the insulating layer 178 between the magnetic recording layer 174 and the magnetization pinned layer 180 is not uniform like the twenty-first embodiment. Since the area where a tunnel current flows becomes small effectively to the area of an element shape, even if spin-polarized current is caused to flow at a writing time, an annular magnetic field due to the writing current is very small, so that magnetization of the magnetic recording layer is also reversed stably in the magnetic recording layer with a large element size, and a writing operation can be performed securely.

Twenty-sixth Embodiment

Figure 59:
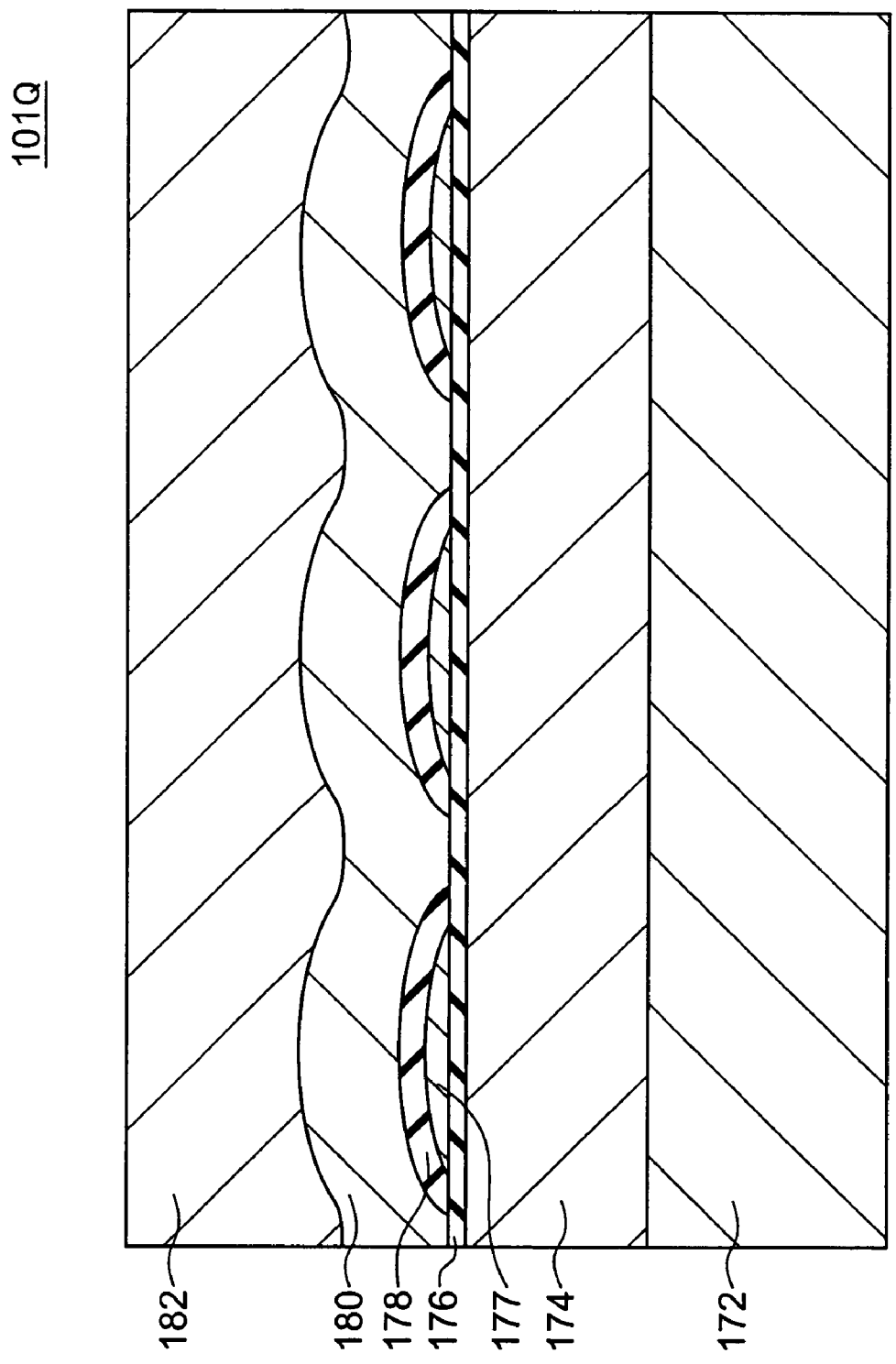
FIG. 59 is a sectional view showing a constitution of a magneto-resistance effect element according to a twenty-sixth embodiment of the present invention.

Next, a magneto-resistance effect element according to a twenty-sixth embodiment in the invention is shown in FIG. 59. A magneto-resistance effect element 101Q of the embodiment has a constitution that non-magnetic layers 177 are provided between the tunnel barrier layer 176 and the insulating layers 178 in the magneto-resistance effect element 101O according to the twenty-fourth embodiment shown in FIG. 57. That is, the magneto-resistance effect element 101Q of the embodiment is provided with a lower electrode layer 172 provided on a substrate (not shown), a magnetic recording layer 174 provided on the lower electrode layer 172, a tunnel barrier layer 176 provided on the magnetic recording layer 174, non-magnetic layer 177 discretely provided on the tunnel barrier layer 176, insulating layers 178 provided to cover surfaces of the non-magnetic layers 177, a magnetization pinned layer 180 provided so as to cover the tunnel barrier layer 176 and the insulating layers 178, and an upper electrode layer 182 provided on the magnetic recording layer 180. The insulating layers 178 can be formed by oxidizing the surfaces of the non-magnetic layers 177.

It is preferable that the non-magnetic layer 177 includes at least one element selected from the group consisting of Mg, Al, Ga, In, Hf, Ta, semiconductor, and rare earth metal element, or it is compound thereof or alloy thereof.

In the embodiment, a density of a current flowing through a region of the tunnel barrier layer 176 provided with the insulator layer 178 is sufficiently low to such an extent that it can be ignored as compared with a density of a tunnel current flowing in a region of the tunnel barrier layer 176 which is not provided with the insulating layer 178. Therefore, a region where the insulator is deposited has a high resistance, so that an area where a tunnel current flows becomes small effectively to an area of an element shape.

As explained above, according to the embodiment, since the area where a tunnel current flows becomes small effectively to the area of an element shape, even if spin-polarized current is caused to flow at a writing time, an annular magnetic field due to the writing current is very small, so that magnetization of the magnetic recording layer is also reversed stably in the magnetic recording layer with a large element size, and a writing operation can be performed securely.

In each of the twenty-fourth to twenty-sixth embodiments, grain boundaries are formed in the magnetic recording layer 174 by adding non-magnetic element (for example, Cr or Pt) thereto, so that magnetic domains smaller than a region where the insulating layer 178 is not provided may be formed. That is, the magnetic recording layer 174 can be made from ferromagnetic material including non-magnetic element, for example, CoCrPt, or CoFeCrPt. In this case, current flow regions in the magnetic recording layer 174 and current non-flow regions therein are magnetically divided by small magnetic domains. The small magnetic domains are formed in this manner so that only the current flow regions in the magnetic recording layer 174 can be magnetization-reversed by spin injection and a writing operation can be further performed securely.

In each of the twenty-fourth to twenty-sixth embodiments, magnetization reversal due to spin injection can be realized in the magneto-resistance effect element without reducing an element shape in size.

In each of the twenty-fourth to twenty-sixth embodiments, the tunnel barrier layer 176 is provided on the magnetic recording layer 174, the insulating layers 178 are provided on the tunnel barrier layer 176, and the magnetization pinned layer 189 is provided so as to cover the tunnel barrier layer 176 and the insulating layers 178, but the arrangement of the magnetic recording layer 174 and the magnetization pinned layer 180 may be reversed.

Each of the magneto-resistance effect elements according to the twenty-fourth to twenty-sixth embodiments can be used as the memory element (the magneto-resistance effect element) in each of the magnetic memories according to the eighteenth to nineteenth embodiments shown in FIGS. 38 to 39. In this case, it is desirable that a volume of the magnetization pinned layer is made preferably large in order to maintain stability of magnetization of the magnetization pinned layer at a spin injection writing time like the eighteenth to nineteenth embodiments.

In each of the sixteenth to twenty-sixth embodiments, the magnetic layer in the magneto-resistance effect element is constituted of at least thin film selected from the group consisting of Ni—Fe alloy, Co—Fe alloy, Co—Fe—Ni alloy, amorphous materials such as (Co, Fe, Ni)—(Si, B) base material, (Co, Fe, Ni)—(Si—B)—(P, Al, Mo, Nb, Mn) base material or Co—(Zr, Hf, Nb, Ta, Ti) base material, or Heusler alloys such as $Fe_2(Cr_xNi_{1-x})Al$, $Co_2(Cr_xFe_{1-x})Al$ base alloy, $Co_2MnSi$ base alloy, $Co_2MnAl$ base alloy, Co—Pt base material, Co—Fe—Pt base material, Fe—Pt base material, Co—Fe—Cr—Pt base material, Co—Cr—Pt base material, or a stacked film of these materials. Incidentally, the symbol "—" indicates a component to be contained, and "(,)" means selection of at least one element within a parenthesis.

In each of the sixteenth to twenty-sixth embodiments, the magnetic recording layer can be adjusted not only in magnetic properties but also in various physical properties such as crystal properties, mechanical properties, chemical properties by adding, in magnetic material, such as a non-magnetic element as Ag (silver), Cu (copper), Au (gold), Al (aluminum), Ru (ruthenium), Os (osmium), Re (rhenium), Ta (tantalum), B (boron), C (carbon), O (oxygen), N (nitrogen), Pd (palladium), Pt (platinum), Zr (zirconium), Ir (iridium), W (tungsten), Cr (chromium), Mo (molybdenum), Nb (niobium), or Mg (magnesium).

Especially, when the magnetic recording layer is a stacked film including at least two ferromagnetic layers, it is further preferable that Co—Fe, Co—Fe—Ni, or Fe rich Ni—Fe whose resistance change rate becomes large due to a magneto-resistance effect is used for the ferromagnetic layer near to the tunnel barrier layer, and Ni rich Ni—Fe, Ni rich Ni—Fe—Co, or the like is used for the ferromagnetic layer which does not come in contact with the tunnel barrier layer, because a writing current can be reduced while keeping the resistance change rate large.

The non-magnetic material to be added may be Ag (silver), Cu (copper), Au (gold), Al (aluminum), Ru (ruthenium), Rh (rhodium), Os (osmium), Re (rhenium), Si (silicon), Bi (bismuth), Ta (tantalum), B (boron), C (carbon), Pd (palladium), Pt (platinum), Zr (zirconium), Ir (iridium), W (tungsten), Cr (chromium), Mo (molybdenum), Nb (niobium), or alloy thereof.

In each of the twentieth to twenty-sixth embodiments, a two-layered structure of a soft magnetic layer/a ferromagnetic layer, or a three-layered structure of a ferromagnetic layer/a soft magnetic layer/a ferromagnetic layer may be used as the magnetic recording layer. Such a desirable effect or advantage can be obtained that increase in spin injection writing current is made unnecessary by using a three-layered structure of a ferromagnetic layer/a non-magnetic layer/a ferromagnetic layer or a five-layered structure of a ferromagnetic layer/a non-magnetic layer/a ferromagnetic layer/a non-magnetic layer/a ferromagnetic layer as the magnetic recording layer to control strength of an interaction between the ferromagnetic layers, even if a cell width of the magnetic recording layer in the memory cell is a sub-micron size or less. In the spin injection writing, it is more preferable that strength of the interaction between the ferromagnetic layers is 2000 Oe or less. It is further preferable that the sign of the interlayer interaction is positive (ferromagnetic). It is made possible to reduce a current by selecting the strength and the sign of the interaction between the layers. At that time, a kind and/or a film thickness of the ferromagnetic layers may be changed.

In each of the sixteenth to twenty-sixth embodiments, it is desirable that magnetization of the ferromagnetic layer used as the magnetization pinned layer is fixed by adding an anti-ferromagnetic film thereto. As the anti-ferromagnetic film, such material as Fe—Mn (iron-manganese), Pt—Mn (platinum—manganese), Pt—Cr—Mn (platinum—chromium—manganese), Ni—Mn (nickel—manganese), Ir—Mn (iridium—manganese), or NiO (nickel oxide), CO (cobalt oxide) can be used.

The magnetic substance constituting the magnetization pinned layer and the magnetic recording layer can be adjusted not only in magnetic properties but also in various physical properties such as crystal properties, mechanical properties, chemical properties by adding therein such as a non-magnetic element as Ag (silver), Cu (copper), Au (gold), Al (aluminum), Mg (magnesium), Si (silicon), Bi (bismuth), Ta (tantalum), B (boron), C (carbon), O (oxygen), N (nitrogen), Pd (palladium), Pt (platinum), Zr (zirconium), Ir (iridium), W (tungsten), Cr (chromium), Mo (molybdenum), or Nb (niobium).

In each of the sixteenth to twenty-sixth embodiments, it is desirable that the magnetization pinned layer has an unidirectional anisotropy and the magnetic recording layer has an uniaxial anisotropy. It is preferable that a thickness of each layer is in a range of 0.1 nm to 100 nm. Further, the film thickness of the ferromagnetic layer is required to be set to such a thickness that the layer does not become super-paramagnetic property and it is preferably 0.4 nm or more.

In each of the sixteenth to twenty-sixth embodiments, when a tunnel junction is used in the magneto-resistance effect element, various insulators such as $Al_2O_3$ (aluminum oxide), $SiO_2$ (silicon oxide), MgO (magnesium oxide), AlN (aluminum nitrogen), $Bi_2O_3$ (bismuth oxide), $MgF_2$ (magnesium fluoride), $CaF_2$ (calcium fluoride), $SrTiO_3$ (strontium titanate), $LaAlO_3$ (lanthanum aluminate), Al—N—O (aluminum nitride oxide), HfO (hafnium oxide) can be used as the insulating layer provided between the magnetization pinned layer and the magnetic recording layer.

These compounds are not required to have an accurate composition completely in view of stoichiometry, where shortage, excess or deficiency of oxygen, nitrogen, fluorine, or the like may be present. It is desirable that the thickness of the insulating layer is thin to such an extent that a tunnel current flows therein. In fact, the thickness is preferably 10 nm or less, more preferably 2 nm or less.

Such a magneto-resistance effect element can be formed on a predetermined substrate using an ordinary thin film forming process such as various sputtering processes, vapor deposition processes, molecular beam epitaxy. In this case, as the substrates which can be used, there are various substrates made of such material as Si (silicon), $SiO_2$ (silicon oxide), $Al_2O_3$ (aluminum oxide), or spinel, AlN (aluminum nitride).

As a background layer, a protective layer, a hard mask or the like, a layer made from Ta (tantalum), T (titanium), Pt (platinum), Pd (palladium), Au (gold), Ti/Pt (titanium/platinum), Ta/Pt (tantalum/platinum), Ti/Pd (titanium/palladium), Ta/Pd (tantalum/palladium), Cu (copper), Al—Cu (aluminum—copper), Ru (ruthenium), Ir (iridium), Os (osmium), Rh (rhodium) may be provided on the substrate.

The embodiments of the invention will be explained below in detail with reference to Examples.

FIRST EXAMPLE

Samples of magneto-resistance effect elements having TMR structures shown in FIGS. 36 and 38 were manufactured as First Example in the invention.

A manufacturing procedure for samples of the magneto-resistance effect elements are as follows:

A background electrode constituted of a stacked film made from Ta (50 nm)/Ru (10 nm), an anti-ferromagnetic layer made from PtMn (20 nm), a magnetization pinned layer made from $Co_{90}Fe_{10}$ (5 nm), a tunnel barrier layer made from AlOx (1.4 nm), a magnetic recording layer with a film thickness of 2.0 nm having ferromagnetic particles made from $Co_{80}Pt_{20}$ and spaced by dielectric made from AlOx, a non-magnetic layer made from Ru (15 nm), and a contact layer made from Ta (150 nm) are sequentially formed on an $SiO_2$ substrate by sputtering process. A numeral shown within a parenthesis indicates a film thickness. Incidentally, the magnetic recording layer is formed by sputtering ferromagnetic material and dielectric simultaneously and applying a high frequency bias onto the substrate formed with the films. A size of the ferromagnetic particles formed by this method is in a range of 20 nm to 100 nm. When the dielectric and the ferromagnetic material are simultaneously formed while the high frequency bias is being applied to the substrate, particle sizes of the ferromagnetic particles can be made uniform, which is optimal for spin injection writing. It was found at this experiment that an error range of areas of particles could be suppressed to 5% or less.

The tunnel barrier layer with a film thickness of 1.4 nm made from AlOx was manufactured by, after forming Al with a film thickness of 6 nm, repeating natural oxidation process using pure oxygen in situ two times. Thereafter, it was found that a film thickness of AlOx obtained by oxidizing Al with a film thickness of 1.2 nm was 1.4 nm, when the film thickness of the AlOx layer was examined with an area TEM (Transmission Electron Microscope).

Patterning to a tunnel junction was performed by using an EB (Electron Beam) writing device on only a portion defining a junction area and using a KrF stepper device on the other portion. When junction separation was performed, a sample (Sample 1) where the magnetization pinned layer was completely cut, as shown in FIG. 36, and Sample 2 where junction separation was stopped in a midway in the magnetization pinned layer, as shown in FIG. 38, were manufactured. Manufacturing was made such that Samples 1 and 2 having a junction area of $0.1 \times 0.1$ $\mu m^2$ were respectively Samples 1-1 and 2-1, Samples 1 and 2 having a junction area of $0.1 \times 0.15$ $\mu m^2$ were respectively Samples 1-2 and 2-2, Samples 1 and 2 having a junction area of $0.2 \times 0.3$ $\mu m^2$ were respectively Samples 1-3 and 2-3, and Samples 1 and 2 having a junction area of $0.25 \times 0.35$ $\mu m^2$ were respectively Samples 1-4 and 2-4.

After junction separation was performed, a protective film with a film thickness of 35 nm made from SiOx was formed, a background electrode made from Ta/Ru was patterned, and an interlayer insulating film was formed after milling forming. Subsequently, after the contact layer was exposed by etch back, a contact cleaning was performed, an upper electrode made from Ti (15 nm)/Al (300 nm)/Ti (15 nm) was sputtered, and patterning was conducted by RIE (Reactive Ion Etching).

Thereafter, a magnetic layer was imparted with a uniaxial anisotropy by applying the magnetic layer with magnetic field in a longitudinal axis direction and performing annealing for 10 hours at a temperature of 280° C.

When a magneto-resistance effect was measured with external magnetic field, it was found that magnetic field where magnetic moment of the magnetization pinned layer and a magnetic moment of the magnetic recording layer having the ferromagnetic particles spaced from one another by the dielectric become parallel or anti-parallel was present (refer to FIGS. 60A and 60B), the MR change rates to all Samples were in a range of 26%±1%. Regarding the above Samples, Samples obtained by replacing the non-magnetic layer made from Ru with a film thickness of 15 nm and the metal contact layer made from Ta with a film thickness of 150 nm by a non-magnetic layer made from Ru with a film thickness of 7 nm, a ferromagnetic layer whose magnetization was fixed and was made from $Co_{90}Fe_{10}$ with a film thickness of 5 nm, an anti-ferromagnetic layer made from PtMn with a film thickness of 20 nm, and a metal contact layer made from Ru with a film thickness of 10 nm and Ta with a film thickness of 150 nm, namely, by providing a second magnetization pinned layer between the non-magnetic layer and the metal contact layer was manufactured and magneto-resistances thereof were measured with external magnetic field. MR change rates to all the obtained Samples were in a range of 26%±1%. From such a fact, it was found that, though magnetization direction of the second magnetization pinned layer should have been reversed by the external magnetic field, the reversion of magnetization direction did not act on the magneto-resistance change.

Figure 60A:
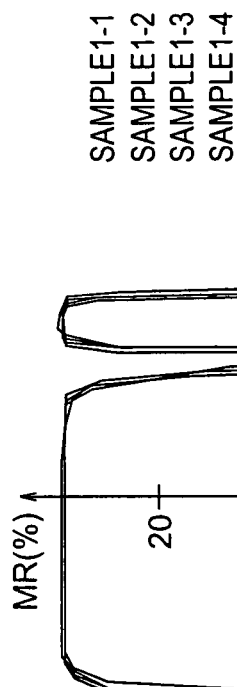
FIGS. 60A and 60B are graphs showing MR change ratio to an external magnetic field of samples manufactured in the first example of the invention.
Figure 60B:
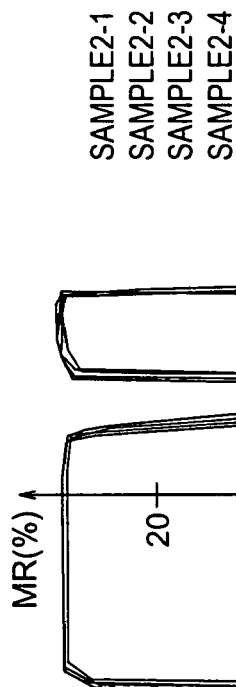

As apparent from FIGS. 60A and 60B, it is understood that saturation magnetization of the magnetic recording layer having the ferromagnetic particles spaced by the dielectric is small, because Co—Pt is used as material for the ferromagnetic particles and the film thickness of the magnetic recording layer is thin, but thermal stability of the magnetic recording layer to thermal fluctuation is excellent because the coercive force of the Co—Pt is large.

FIGS. 61A and 61B are diagrams showing current-voltage characteristics. Spin reversion due to current injection was realized at a voltage of about 400 mV and a resistance change was observed. From such a fact that spin reversion currents due to current injection hardly changed in Samples 1 and 2, it was found that the magnetic recording layer having the ferromagnetic particle spaced by the dielectric was spin-reversed. When direction of magnetization of the magnetic recording layer was reversed from anti-parallel to that of the magnetization pinned layer to parallel thereto, a current density of spin reversion was $1.3 \times 10^7$ A/cm$^2$, but when reversion was conducted from the parallel to the anti-parallel, the current density was $1.5 \times 10^7$ A/cm$^2$. In the Sample where the second magnetization pinned layer was provided, when direction of magnetization of the magnetic recording layer was reversed from anti-parallel to that of the magnetization pinned layer to parallel thereto, a current density of spin reversion was $0.6 \times 10^7$ A/cm$^2$, but when reversion was conducted from the parallel to the anti-parallel, the current density was $0.75 \times 10^7$ A/cm$^2$. That is, in the Sample which included the second magnetization pinned layer, the current density of spin reversion became ½ that in the Sample which did not include the same or less.

As shown in FIG. 61B, influence due to annular magnetic field did not appear up to a size of 0.25×0.35 μm$^2$, and a reversed current density did not change in a small size of 0.1×0.1 μm$^2$.

Figure 62:
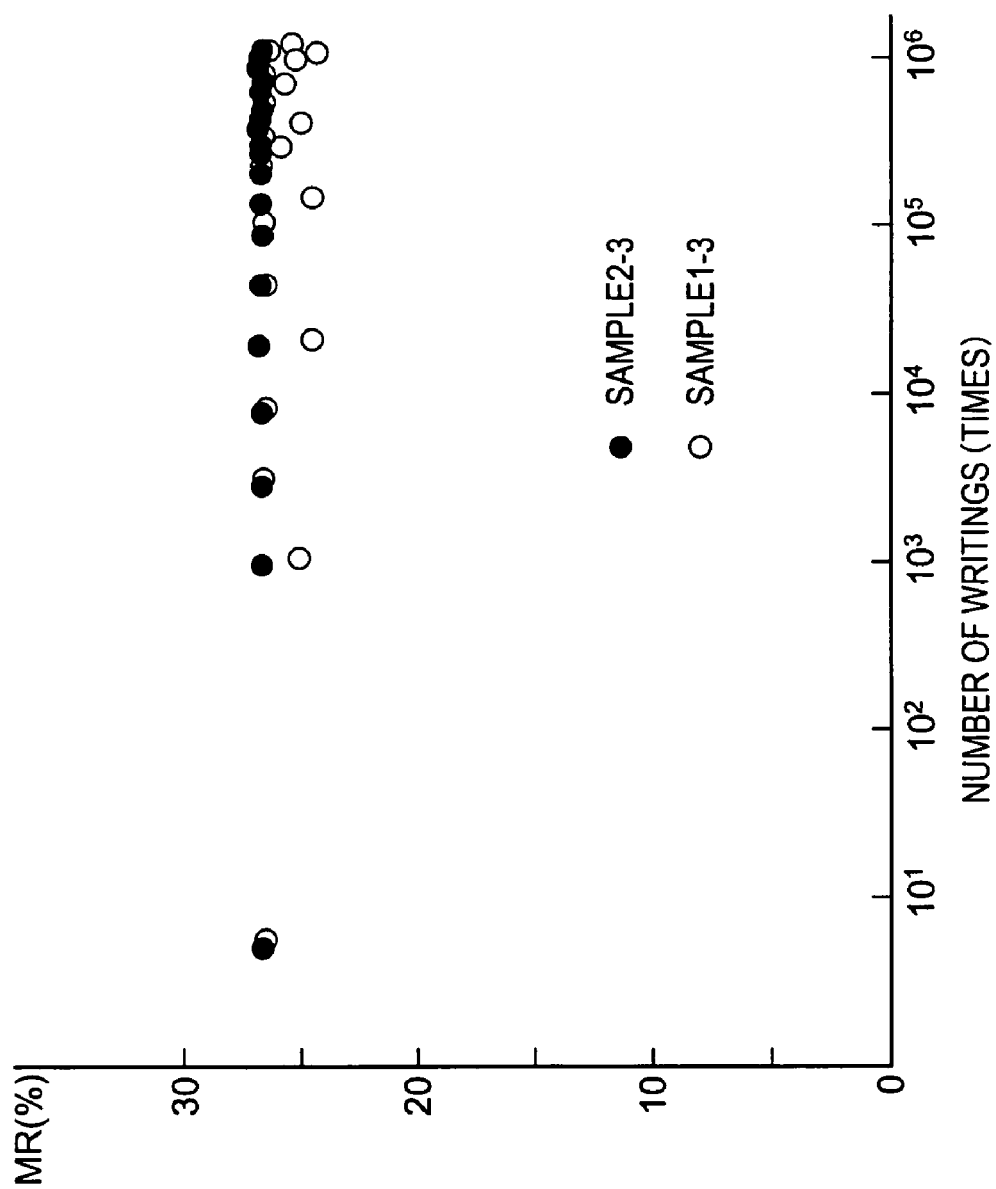
FIG. 62 is a graph showing a MR change ratio to the number of writing times of samples manufactured in the first example of the invention.

The results obtained by repeating spin reversion (writing) to Samples 1-3 and 2-3 with a junction area of 0.2×0.3 μm$^2$ at $10^6$ times are shown in FIG. 62. In Sample 2-3 with the structure shown in FIG. 38, stable characteristics were obtained regarding spin injection, but unstableness on the MR value was observed in Sample 1-3 shown in FIG. 36. It was found that the structure shown in FIG. 38 is desirable for spin injection writing. Similar results can be obtained in Samples where the second magnetization pinned layer was provided.

As explained above, influence due to annular magnetic field did not appear up to a size of 0.25×0.35 μm$^2$, and a low current writing was made possible in cells with various sizes including a cell whose element size was 0.1×0.1 μm$^2$. Thermal stability of the magnetic recording layer to thermal fluctuation could be obtained. Magnetization stability of the magnetization pinned layer at spin injection writing could be obtained by using the structure shown in FIG. 38.

SECOND EXAMPLE

Next, Samples 3, 4, and 5 having the TMR structures shown in FIGS. 39 to 41 were manufactured as Second Example of the invention.

Manufacturing procedure of Samples 3, 4, and 5 of the magneto-resistance effect element is similar to that in the First Example.

Samples with the following constitutions were manufactured.

(Constitution of Sample 3)

Sample 3 had the structure shown in FIG. 39, and it was provided on an SiO$_2$ substrate with a background electrode made from Ta (50 nm)/Ru (10 nm), a stacked structure of two stacked layers, each layer constituted of an anti-ferromagnetic layer made from PtMn (15 nm) and a magnetization pinned layer made from Co$_{90}$Fe$_{10}$ (3 nm), a tunnel barrier layer made from AlOx (1.4 nm), a magnetic recording layer having ferromagnetic particles made from (Co$_{90}$Fe$_{10}$)$_{80}$Pt$_{20}$ spaced by dielectric made from AlOx, a non-magnetic layer made from Ru (15 nm), and a contact layer made from Ta (150 nm).

(Constitution of Sample 4)

Sample 4 had the structure shown in FIG. 40, and it was provided on an SiO$_2$ substrate with a background electrode made from Ta (50 nm)/Ru (10 nm), a stacked structure of two stacked layers, each layer constituted of an anti-ferromagnetic layer made from PtMn (15 nm) and a magnetization pinned layer made from Co$_{90}$Fe$_{10}$ (3 nm), a tunnel barrier layer made from AlOx (1.4 nm), a magnetic recording layer made from Co$_{90}$Fe$_{10}$ (3.0 nm), a non-magnetic layer made from Ru (14 nm), and a contact layer made from Ta (150 nm).

(Constitution of Sample 5)

Sample 5 had the structure shown in FIG. 41, and it was provided on an SiO$_2$ substrate with a background electrode made from Ta (50 nm)/Ru (10 nm), an anti-ferromagnetic layer made from PtMn (15 nm), a stacked structure of two magnetization pinned layers made from Co$_{90}$Fe$_{10}$ (3 nm) and stacked via a non-magnetic layer made from Ru (0.9 nm), a tunnel barrier layer made from AlOx (1.4 nm), a magnetic recording layer made from Co$_{90}$Fe$_{10}$ (3.0 nm), a non-magnetic layer made from Ru (14 nm), and a contact layer made from Ta (150 nm).

Figure 63:
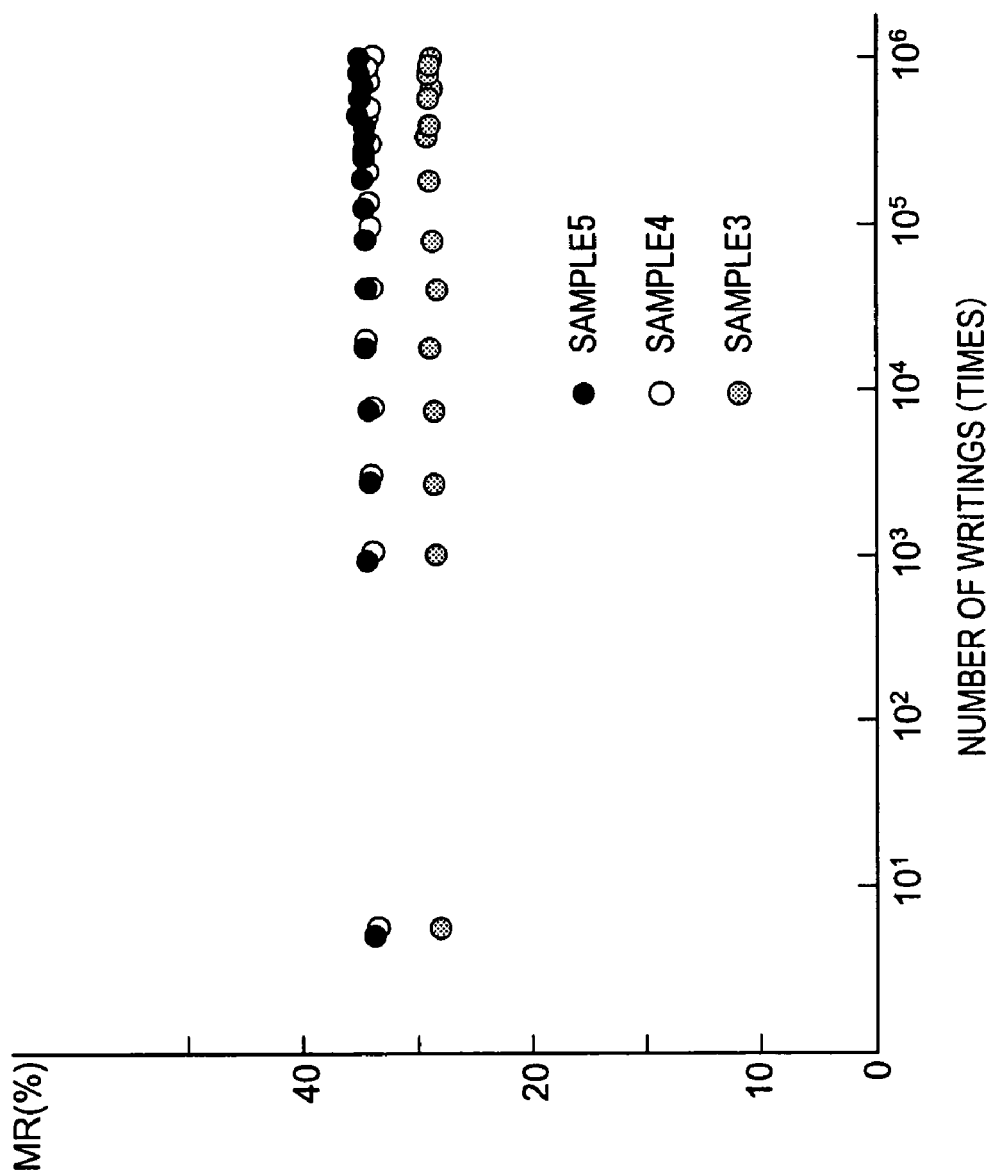
FIG. 63 is a graph showing a MR change ratio to the number of writing times of samples manufactured in a second example of the invention.

In all Samples, a junction area has 0.1×0.15 μm$^2$. MR values measured with external magnetic field to Samples 3, 4, and 5 were 26%, 31.50%, and 32%. Results obtained by performing spin injection writing on the Samples and repeating spin reversion $10^6$ times are shown in FIG. 63. In the structures shown in FIG. 39, FIG. 40, and FIG. 41, stable characteristics regarding spin injection was obtained. However, in Sample 1-3 shown in FIG. 27, unstableness regarding MR value was observed. It was found that the structures shown in FIG. 39, FIG. 40, and FIG. 41 was desirable as structures for spin injection writing.

As explained above, it was found that magnetization stability of the magnetization pinned layer at the spin injection writing could be maintained in the Second Example.

THIRD EXAMPLE

Next, Samples 6-1 to 6-15 provided with a background layer, an anti-ferromagnetic layer, a magnetization pinned layer, a tunnel barrier layer, a magnetic recording layer, and a reflecting layer, which are shown in FIG. 64, were manufactured using the manufacturing method explained in the twenty-third embodiment as Third Example of the present invention, and Comparative Examples 1-1 and 1-2 which were not provided with any reflecting layer were also manufactured. Current densities of the respective Samples and Comparative Examples were measured. In each of the Samples 6-1 and 6-15, and Comparative Examples 1-1 and 1-2, the background layer was made from Ta with a film thickness of 50 nm and Ru with a film thickness of 10 nm, the anti-ferromagnetic layer was made from PtMn with a film thickness of 15 nm, the magnetization pinned layer was made from $Co_{90}Fe_{10}$ with a film thickness of 5 nm, and the tunnel barrier layer was made from AlOx with a film thickness of 1.4 nm. As explained in the twenty-third embodiment, the magnetic recording layer and the reflecting layer had a column-like stacked structure. An element size of each of the Samples and Comparative Examples was 0.1×0.15 µm², and the protective film 34 and the interlayer insulating film 36 shown in FIG. 54C were respectively made from AlOx and SiOx.

The magnetic recording layer was made from $Co_{80}Pt_{20}$ with a film thickness of 3 nm in Samples 6-1 to 6-10, Samples 6-13 to 6-14, and Comparative Example 1-2, and it was made from $Co_{90}Fe_{10}$ with a film thickness of 4 nm in Samples 6-11 to 6-12, Sample 6-15, and Comparative Example 1-1.

Sample 6-1 could be obtained by manufacturing the magneto-resistance effect element of the sixteenth embodiment shown in FIG. 36 using the manufacturing method described above, and was constituted such that the non-magnetic layer 114 was caused to have a function of a reflecting layer by making the non-magnetic layer 114 from Ru with a film thickness of 5 nm. Sample 6-2 was the magneto-resistance effect element shown in FIG. 55, where the non-magnetic layer 114 was made from Ru with a film thickness of 5 nm, the ferromagnetic layer 118 was made from $Co_{90}Fe_{10}$ with a film thickness of 5 nm, and the anti-ferromagnetic layer 119 was PtMn with a film thickness of 15 nm. That is, Sample 6-1 had a constitution that the ferromagnetic layer and anti-ferromagnetic layer provided in Sample 6-2 were not provided.

Sample 6-3 had a constitution that Ru was replaced by Cr in the non-magnetic layer 114 in Sample 6-2. Sample 6-4 had a constitution that Cr was replaced by RuCr in non-magnetic layer 114 in Sample 6-3.

Sample 6-5 had a constitution that Ru was replaced by Ir in the non-magnetic layer 114 in Sample 6-1. Sample 6-6 had a constitution that Ru was replaced by Ir in the non-magnetic layer 114 in Sample 6-2. Sample 6-5 had a constitution that the ferromagnetic layer and the anti-ferromagnetic layer provided in Sample 6-6 were not provided.

Sample 6-7 had a constitution that Ru was replaced by IrRu in the non-magnetic layer 114 in Sample 6-1. Sample 6-8 had a constitution that Ru was replaced by IrRu in the non-magnetic layer 114 in Sample 6-2. That is, Sample 6-7 had a constitution that the ferromagnetic layer and the anti-ferromagnetic layer provided in Sample 6-8 were not provided.

Sample 6-9 had a constitution that Ru was replaced by Re in the non-magnetic layer 114 in Sample 6-2. Sample 6-10 had a constitution that Ru was replaced by RuRe in the non-magnetic layer 114 in Sample 6-2.

Sample 6-11 had a constitution that $Co_{80}Pt_{20}$ with a film thickness of 3 nm was replaced by $Co_{90}Fe_{10}$ with a film thickness of 4 nm in the magnetic recording layer in Sample 6-2.

Sample 6-12 had a constitution that Ru was replaced with Ir in the non-magnetic layer in Sample 6-11.

Sample 6-13 was obtained by manufacturing the magneto-resistance effect element according to the modification of the twentieth embodiment shown in FIG. 43 by the above-described manufacturing method, and it had a constitution that the non-magnetic layer 114 was made from Cu with a film thickness of 5 nm, the ferromagnetic layer $118_1$ was made from $Co_{90}Fe_{10}$ with a film thickness of 4 nm, the non-magnetic layer $118_2$ was made from Ru with a film thickness of 0.9 nm, the ferromagnetic layer $118_3$ was made from $Co_{90}Fe_{10}$ with a film thickness of 5 nm, and the anti-ferromagnetic layer 120 was made from PtMn with a film thickness of 15 nm.

Sample 6-14 was obtained by manufacturing the magneto-resistance effect element according to the twentieth embodiment shown in FIG. 42 by the above-described manufacturing method, and it had a constitution that the non-magnetic layer 114 was made from Cu with a thickness of 5 nm, the ferromagnetic layer 118 was made from $Co_{90}Fe_{10}$ with a film thickness of 5 nm, and the anti-ferromagnetic layer was made from IrMn with a film thickness of 15 nm.

Sample 6-15 had a constitution that $Co_{80}Pt_{20}$ with a film thickness of 3 nm was replaced by $Co_{90}Fe_{10}$ with a film thickness of 4 nm in the magnetic recording layer in Sample 6-13.

Incidentally, in Samples 6-1 to 6-15, a Ru layer with a film thickness of 5 nm and a Ta layer with a film thickness of 150 nm were stacked on the reflecting layer as the metal contact layer, while a Ta layer with a film thickness of 155 nm was formed on the reflecting layer in Comparative Examples 1-1 and 1-2.

As understood from FIG. 64, a current density in Samples where the reflecting layer is constituted of only the non-magnetic layer (Samples 6-1, 6-5, and 6-7) is about ⅔ time that in Comparative Example 1-2 where the reflecting layer was not provided.

A current density in Samples where the reflecting layer is constituted of the non-magnetic layer/the ferromagnetic layer/the anti-ferromagnetic layer (Samples 6-2, 6-6, and 6-8) is about half that in Samples where the reflecting layer is constituted of only the non-magnetic layer (Samples 6-1, 6-5, and 6-7).

When the reflecting layer is constituted of the non-magnetic layer/the ferromagnetic layer/the anti-ferromagnetic layer, it is understood that a current density in Samples where direction of magnetization of the magnetization pinned layer is parallel to that of the ferromagnetic layer on the side of the magnetic recording layer constituting the reflecting layer (Samples 6-2 to 6-4, 6-6, and 6-8 to 6-10) is smaller than that in Samples where direction of magnetization of the magnetization pinned layer is anti-parallel to that of the ferromagnetic layer on the side of the magnetic recording layer constituting the reflecting layer (Samples 6-13 to 6-15).

The current density shown in FIG. 64 indicates an average value of a current density where reversion is made from anti-parallel direction to parallel direction and a current density where reversion is made in inverse.

In order to inspect characteristics due to differences in material for the reflecting layer, Comparative Examples 2-1 to 2-4 where materials for the reflecting layer in Samples 6-2 to 6-4, Sample 6-6, Sample 6-8, and Sample 6-9 were replaced by other materials were manufactured. Results obtained by measuring current densities in the Comparative Examples are shown in FIG. 65. Comparative Example 2-1 had a constitution that the reflecting layer constituted of the Ru layer with a film thickness of 5 nm and the $Co_{90}Fe_{10}$ layer with a film thickness of 5 nm was replaced by a reflecting layer constituted of a Cu layer with a film thickness of 5 nm and a $Co_{90}Fe_{10}$ layer with a film thickness of 5 nm in Sample 6-2, Comparative Example 2-2 had a constitution that the reflecting layer constituted of the Ru layer with a film thickness of 5 nm and the $Co_{90}Fe_{10}$ layer with a film thickness of 5 nm was replaced by a reflecting layer constituted of a Rh layer with a film thickness of 5 nm and a $Co_{90}Fe_{10}$ layer with a film thickness of 5 nm in Sample 6-2, Comparative Example 2-3 had a constitution that the reflecting layer constituted of the Ru layer with a film thickness of 5 nm and the $Co_{90}Fe_{10}$ layer with a film thickness of 5 nm was replaced by a reflecting layer constituted of an Ag layer with a film thickness of 5 nm and a $Co_{90}Fe_{10}$ layer with a film thickness of 5 nm in Sample 6-2, and Comparative Example 2-4 had a constitution that the reflecting layer constituted of the Ru layer with a film thickness of 5 nm and the $Co_{90}Fe_{10}$ layer with a film thickness of 5 nm was replaced by a reflecting layer constituted of an Au layer with a film thickness of 5 nm and a $Co_{90}Fe_{10}$ layer with a film thickness of 5 nm in Sample 6-2. In Comparative Examples 2-1 to 2-4, a metal contact layer constituted of an Ru layer with a film thickness of 5 nm and a Ta layer with a film thickness of 150 nm was provided on the anti-ferromagnetic layer made from PtMn and formed on the reflecting layer like Samples 6-2 to 6-4, 6-6, 6-8, and 6-9. In Samples 6-2 to 6-4, 6-6, 6-8, and 6-9, and Comparative Examples 2-1 to 2-4, direction of magnetization of the ferromagnetic layer constituting the reflecting layer and made from $Co_{90}Fe_{10}$ was fixed by the anti-ferromagnetic layer provided on the ferromagnetic layer and made from PtMn, but the direction of magnetization was parallel to direction of magnetization of the magnetization pinned layer provided under the tunnel barrier layer.

As understood from the measurement results shown in FIGS. 64 and 65, it is understood that, when the ferromagnetic layer in the reflecting layer is a ferromagnetic layer including Co, it is preferable that material for the non-magnetic layer coming in contact with the ferromagnetic layer includes at least one element selected from the group consisting of Cr, Ru, Ir, and Re, or it is alloy thereof.

In order to compare a case that the magnetic recording layer is constituted of ferromagnetic particles and a case that it is constituted of a continuous layer with each other, Sample 6-11 where the magnetic recording layer was constituted of ferromagnetic particles, Sample 6-16 where the Ru layer with a film thickness of 5 nm in the reflecting layer was replaced by a Cr layer with a film thickness of 5 nm in Sample 6-11, and Sample 6-17 where the Ru layer with a thickness of 5 nm in the reflecting layer was replaced with a RuCr layer with a film thickness 5 nm in Sample 6-11 were manufactured. Comparative Examples 3-1, 3-2, and 3-3 where the magnetic recording layers and the reflecting layers were formed as continuous layers in Samples 6-11, 6-16, and 6-17 were manufactured. In Samples 6-11, 6-16, and 6-17, and Comparative Examples 3-1 to 3-3, direction of magnetization of the ferromagnetic layer constituting the reflecting layer and made from $Co_{90}Fe_{10}$ was fixed by the anti-ferromagnetic layer provided on the ferromagnetic layer and made from PtMn, and the direction of magnetization was parallel to direction of magnetization of the magnetization pinned layer provided under the tunnel barrier layer.

Results obtained by measuring current densities in Samples 6-11, 6-16, and 6-17, and Comparative Examples 3-1, 3-2, and 3-3 are shown in FIG. 66. It is understood from the results shown in FIG. 66 that the case that the magnetic recording layer is constituted of ferromagnetic particles is lower in current density than the case that it is constituted of a continuous layer.

FOURTH EXAMPLE

Next, a magneto-resistance effect element with the structure shown in FIG. 57 was manufactured as Fourth Example of the invention. The magneto-resistance effect element of the Example was formed as follows:

First of all, a lower electrode layer made from Ta with a film thickness of 80 nm, a buffer layer made from Ru with a film thickness of 5 nm, and magnetic recording film made from CoFeCrPt with a film thickness of 3 nm were formed on a substrate made from $SiO_2$ by using a super vacuum sputtering device. Next, an Al layer with a film thickness of 0.7 nm was formed and the Al layer was oxidized by introduction of pure oxygen gas so that a thin tunnel barrier layer was formed. Thereafter, insulator made from $Al_2O_3$ with an average film thickness of 0.5 nm was deposited on a surface of the oxidized Al layer such that the whole surface of the oxidized Al layer was not covered with the insulator. Next, a magnetization pinned layer made from CoFe with a film thickness of 5 nm, an anti-ferromagnetic layer made from PtMn with a film thickness of 15 nm, and a cap layer made from Ru with a film thickness of 20 nm were formed in this order. Thereafter, an upper electrode layer made from Ta with a film thickness of 100 nm was formed on the cap layer. Incidentally, formation of the insulator made from $Al_2O_3$ with an average film thickness of 0.5 nm which does not cover the whole surface, of the oxidized Al layer completely can be performed by utilizing any process which does not make insulators flat, and an insulator which does not cover the whole surface can be formed when the average film thickness is 5 nm or less. At that time, a size of the insulator depends on an average film thickness of an insulator to be formed.

After an element-shaped resist pattern was formed on the stacked film using resist, an upper electrode layer was patterned using reactive etching using the resist pattern as a mask, and an element shape was formed simultaneously with formation of the upper electrode. After the resist pattern was peeled off, the cap layer, the magnetic recording layer, the tunnel barrier layer, and the magnetization pinned layer were etched by ion milling except for an element portion. Thereafter, an insulating layer made from $SiO_2$ with a film thickness of 50 nm was formed and an element was covered with $SiO_2$. Next, a pattern for a lower electrode was formed using resist, a lower electrode layer was patterned by reactive ion etching, the resist was peeled off. An insulating layer made from $SiO_2$ with a film thickness of 300 nm was formed and the lower electrode was covered with $SiO_2$.

After planarizing resist was applied, the planarizing resist and the $SiO_2$ insulating layer were etched by reactive ion etching, and the etching process was stopped when the upper electrode of the element was exposed. Thereafter, a Ti film with a film thickness of 60 nm, an Al film with a film thickness of 180 nm, and a Ti film with a film thickness of 60 nm were formed. Next, a pattern for an upper wiring layer was formed using resist, and an upper wiring was patterned by reactive ion etching. After the resist was peeled off, anneal was performed at a temperature of 280° C. while magnetic field was being applied to the magnetic layer in a longitudinal axis direction thereof.

Figure 67:
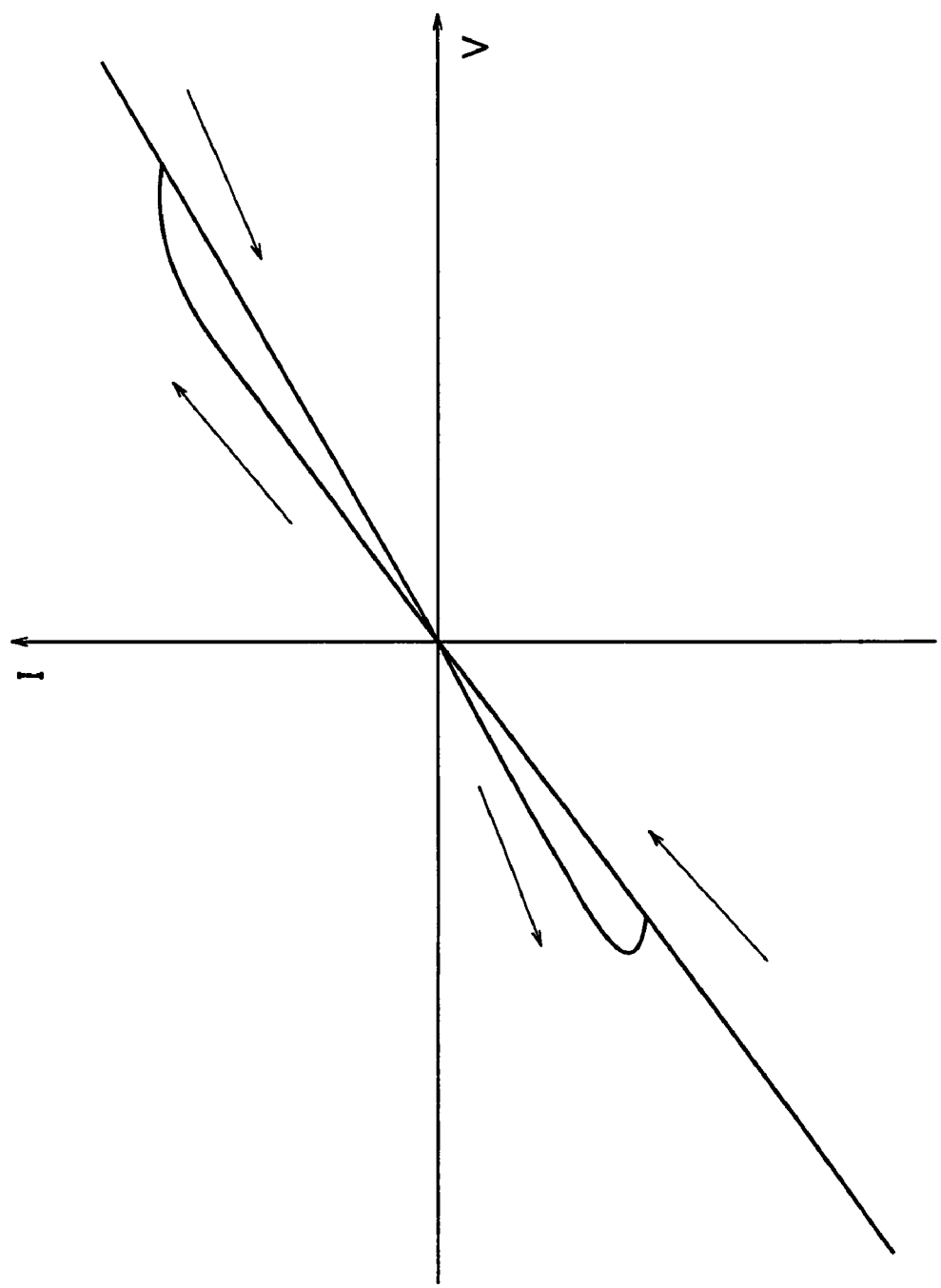
FIG. 67 is a graph showing a current-voltage characteristic of samples manufactured in a fourth example of the invention.

An element with an area of 0.4×0.8 $\mu m^2$ was formed according to the manufacturing method. As shown in FIG. 67, a resistance change due to spin injection magnetization reversion appeared in a current-voltage characteristic of the element. A voltage and a current at which magnetization of the magnetic recording layer was magnetization-reversed from parallel to anti-parallel were 320 mV of voltage and 59 μA of current.

In the Example, a region where the insulator made from $Al_2O_3$ was deposited became high resistance so that an area where a tunnel current flowed effectively could be reduced. Since Cr and Pt formed grain boundaries in the magnetic recording layer, small magnetic domains were formed in the magnetic recording layer, and a volume of a region where spin reversion occurred was made small. Therefore, spin reversion was made easy, and a current density for spin reversion can be lowered. In the Example, magnetization reversion due to spin injection was realized and a resistance change of 23% could be obtained. It was found that the structure of the Example allowed spin injection magnetization reversion at a low current and it was suitable as a mass storage memory.

FIFTH EXAMPLE

Next, a magneto-resistance effect element with the structure shown in FIG. 58 was manufactured as Fifth Example of the invention. The magneto-resistance effect element of the Example was manufactured as follows:

First of all, a lower electrode layer made from Ta with a film thickness of 80 nm, a buffer layer made from Cr with a film thickness of 5 nm, and magnetic recording film made from CoCrPt with a film thickness of 3 nm were formed on a substrate made from $SiO_2$ by using a super vacuum sputtering device. Next, after insulator made from $Al_2O_3$ with an average film thickness of 0.5 nm was deposited on the magnetic recording layer such that the whole surface of the magnetic recording layer was not covered with the insulator, an Al layer with a film thickness of 0.7 nm was formed, and the Al layer was oxidized by introduction of pure oxygen gas, so that a thin tunnel barrier was formed. Thereafter, a magnetization pinned layer made from CoFe with a film thickness of 5 nm, an anti-ferromagnetic layer made from PtMn with a film thickness of 15 nm, and a cap layer made from Ru with a film thickness of 20 nm were formed in this order. Thereafter, an upper electrode layer made from Ta with a film thickness of 100 nm was formed on the cap layer. The stacked film thus formed was processed like the Example 10 so that an element was formed.

An element with an area of 0.4×0.8 $\mu m^2$ was formed according to the manufacturing method. A resistance change due to spin injection magnetization reversion appeared in a current-voltage characteristic of the element. A voltage and a current at which magnetization of the magnetic recording layer was magnetization-reversed from parallel to anti-parallel were 360 mV of voltage and 230 $\mu A$ of current.

In the Example, a region obtained by depositing the insulator made from $Al_2O_3$ became high resistance so that an area where a tunnel current flowed effectively could be reduced. Since the magnetic recording layer included Cr and Pt, small magnetic domains were formed in the magnetic recording layer, and a volume of a region where spin reversion occurred was made small. Therefore, spin reversion was made easy, and a current density for spin reversion can be lowered. In the Example, magnetization reversion due to spin injection was realized and a resistance change of 17% could be obtained. It was found that the structure of the Example allowed spin injection magnetization reversion at a low current and it was suitable as a mass storage memory.

SIXTH EXAMPLE

Next, a magneto-resistance effect element with the structure shown in FIG. 59 was manufactured as Sixth Example of the invention. The magneto-resistance effect element of the Example was manufactured as follows:

First of all, a lower electrode layer made from Ta with a film thickness of 80 nm, a buffer layer made from Ru with a film thickness of 5 nm, and magnetic recording layer made from CoFeCrPt with a film thickness of 3 nm were formed on a substrate made from $SiO_2$ by using a super vacuum sputtering device. Next, an Al layer with a film thickness of 0.7 nm was formed, and the Al layer was oxidized by introduction of pure oxygen gas, so that a thin tunnel barrier was formed. Thereafter, an Al film with an average film thickness of 0.4 nm was deposited such that it did not cover the whole surface of the oxidized Al layer, and a surface of Al deposited was oxidized by pure oxygen gas. Next, a magnetization pinned layer made from CoFe with a film thickness of 5 nm, an anti-ferromagnetic layer made from PtMn with a film thickness of 15 nm, and a cap layer made from Ru with a film thickness of 20 nm were formed in this order. Thereafter, an upper electrode layer made from Ta with a film thickness of 100 nm was formed on the cap layer. The stacked film thus formed was processed like the Example 7 so that an element was formed.

An element with an area of 0.4×0.8 $\mu m^2$ was formed according to the manufacturing method. A resistance change due to spin injection magnetization reversion appeared in a current-voltage characteristic of the element. A voltage and a current at which magnetization of the magnetic recording layer was magnetization-reversed from parallel to anti-parallel were 290 mV of voltage and 53 $\mu A$ of current.

In the Example, a region obtaining by oxidizing the surface of the Al deposited such that the Al did not cover the whole surface of the oxidized Al layer became high resistance, so that an area where a tunnel current flowed effectively could be reduced. Since the magnetic recording layer included Cr and Pt, small magnetic domains were formed in the magnetic recording layer, and a volume of a region where spin reversion occurred was made small. Therefore, spin reversion was made easy, and a current density for spin reversion can be lowered. In the Example, magnetization reversion due to spin injection was realized and a resistance change of 28% could be obtained. It was found that the structure of the Example allowed spin injection magnetization reversion at a low current and it was suitable for a mass storage memory.

SEVENTH EXAMPLE

A magneto-resistance effect element using CoCrPt in the magnetic recording layer in Fourth Example was manufactured as Seventh Example of the invention. The magneto-resistance effect element of the Example was formed as follows:

A magneto-resistance effect element was manufactured using CoCrPt for material for the magnetic recording layer and utilizing the same manufacturing process as that in Fourth Example except for the material. An element with a small area of 0.08×0.3 $\mu m^2$ was formed according to the manufacturing method. Since the element with a small area could be formed in the Example, spin reversion based upon current injection could be realized, and a resistance change of 21% was obtained. When direction of magnetization of the magnetic recording layer was reversed from anti-parallel to the magnetization pinned layer to parallel thereto, a current density in spin reversion was $7.3 \times 10^6$ $A/cm^2$, while the current density was $1.1 \times 10^7$ $A/cm^2$, when reversion was made from parallel to anti-parallel.

In the Example, grain boundaries were formed in the magnetic recording layer by added non-magnetic elements Cr and Pt, so that small magnetic domains were formed and a volume of a spin-reversing region became small. Therefore, spin reversion was made easy and a current density for spin reversion could be reduced.

It was found that the structure of the Example allowed spin injection writing with a low current and it was suitable as a mass storage memory.

EIGHTH EXAMPLE

A magneto-resistance effect element using CoFeCrPt in the magnetic recording layer in Example 11 was manufactured as Eighth Example of the invention. The magneto-resistance effect element of the Example was formed as follows:

A magneto-resistance effect element was manufactured using CoFeCrPt for material for the magnetic recording layer and utilizing the same manufacturing process as that in Fifth Example except for the material. An element with a small area of 0.08×0.3 µm² was formed according to the manufacturing method. Since the element with a small area could be formed in the Example, spin reversion based upon current injection could be realized, and a resistance change of 21% was obtained. When direction of magnetization of the magnetic recording layer was reversed from anti-parallel to the magnetization pinned layer to parallel thereto, a current density for spin reversion was $7.1 \times 10^6$ A/cm², while the current density was $1.0 \times 10^7$ A/cm², when reversion was made from parallel to anti-parallel.

In the Example, grain boundaries were formed in the magnetic recording layer by added non-magnetic elements Cr and Pt, so that small magnetic domains were formed and a volume of a spin-reversing region became small. Therefore, spin reversion was made easy and a current density for spin reversion could be reduced.

It was found that the structure of the Example allowed spin injection writing with a low current and it was suitable as a mass storage memory.

As explained above, according to each embodiment of the invention, an operation for spin injection writing can be performed securely.

What is claimed is:

1. A magneto-resistance effect element comprising:
   a substrate;
   a first electrode provided above the substrate and having a lower face, an upper face opposed to the lower face, and a side face different from the lower and upper faces;
   a magneto-resistance effect film which is formed such that a surface thereof comes in contact with the side face of the first electrode and which includes a magnetization pinned layer whose magnetization direction is pinned, a magnetization free layer whose magnetization direction is changeable, and a first non-magnetic layer which is provided between the magnetization pinned layer and the magnetization free layer; and
   a second electrode which is formed on another surface of the magneto-resistance effect film opposed from the surface coming in contact with the side face of the first electrode,
   wherein one layer of the magnetization free layer and the magnetization pinned layer in the magneto-resistance effect film has a sheet resistance higher than the other layer thereof, and the one layer comes in contact with the end face of the first electrode.

2. A magnetic memory including a plurality of memory cells arranged in a matrix manner, each of the memory cells being provided with a magneto-resistance effect element according to claim 1.

3. A magneto-resistance effect element according to claim 1, wherein the one layer is thinner than the other layer.

4. A magneto-resistance effect element according to claim 1, wherein the one layer is the magnetization free layer.

5. A magneto-resistance effect element according to claim 1, wherein the magnetization free layer includes non-magnetic element and has grain boundaries.

6. A magneto-resistance effect element according to claim 1, wherein a plurality of insulators are separately provided between either one of the magnetization free layer and the magnetization pinned layer, and the first non-magnetic layer.

7. A magneto-resistance effect element according to claim 6, further comprising a second non-magnetic layer covered with the insulators, the second non-magnetic layer being provided between the plurality of insulators and the first non-magnetic layer.

8. A magneto-resistance effect element according to claim 1, wherein the magnetization free layer is provided with ferromagnetic particles spaced by dielectric.

9. A magneto-resistance effect element according to claim 1, wherein the magnetization pinned layer is a stacked film where a ferromagnetic layer and an anti-ferromagnetic layer are alternatively stacked.

10. A magneto-resistance effect element according to claim 1, wherein the first non-magnetic layer is a tunnel barrier layer.

* * * * *